United States Patent
Fujii et al.

(10) Patent No.: US 7,357,884 B2
(45) Date of Patent: Apr. 15, 2008

(54) CONDUCTIVE INK COMPOSITION

(75) Inventors: Akiyoshi Fujii, Nara (JP); Shigehiko Hayashi, Kobe (JP)

(73) Assignees: Sharp Kabushiki Kaisha, Osaka (JP); Mitsuboshi Belting Ltd., Hyogo (JP)

( * ) Notice: Subject to any disclaimer, the term of this patent is extended or adjusted under 35 U.S.C. 154(b) by 122 days.

(21) Appl. No.: 11/158,007

(22) Filed: Jun. 22, 2005

(65) Prior Publication Data

US 2005/0285084 A1    Dec. 29, 2005

(30) Foreign Application Priority Data

Jun. 24, 2004   (JP)   ............................. 2004-186938
May 31, 2005   (JP)   ............................. 2005-160706

(51) Int. Cl.
*H01B 1/02*   (2006.01)
(52) U.S. Cl. ...................... 252/514; 252/502; 252/512; 252/520.3; 428/402.2; 428/403; 430/138
(58) Field of Classification Search ................ 252/500, 252/512, 514, 502, 520.3; 427/213.3; 428/402.2, 428/403; 430/138
See application file for complete search history.

(56) References Cited

U.S. PATENT DOCUMENTS 6,190,731 B1 *   2/2001   Tecle .................... 427/213.3
6,653,042 B1 *   11/2003   Fukino et al. ........... 430/270.1
2003/0170382 A1 *   9/2003   Tomonari .................... 427/123
2003/0219934 A1   11/2003   Furusawa
2004/0105980 A1 *   6/2004   Sudarshan et al. .......... 428/404
2004/0142165 A1 *   7/2004   Fujii et al. .................. 428/328
2004/0261907 A1 *   12/2004   Hattori et al. .............. 148/121
2005/0204865 A1 *   9/2005   Hirai et al. ................... 75/345
2005/0208142 A1 *   9/2005   Zheng et al. ............... 424/489
2006/0083694 A1 *   4/2006   Kodas et al. ................. 424/46

FOREIGN PATENT DOCUMENTS

JP   2003-318192 A   11/2003

* cited by examiner

*Primary Examiner*—Lorna M. Douyon
*Assistant Examiner*—Tri Nguyen
(74) *Attorney, Agent, or Firm*—Birch, Stewart, Kolasch Birch, LLP

(57) ABSTRACT

A conductive ink composition is obtained by dispersing, in an organic solvent, a solid material made from metal fine particles each coated with protective colloids each made of at least two organic compounds, the metal fine particles consisting of an alloy containing at least a noble metal. Each of the protective colloids is made from, e.g., a raw material containing an (A) amine and a (B) carboxylic acid. By applying and baking the conductive ink composition, grain growth is restrained. This allows acquirement of a metal film whose surface smoothness is excellent, and whose adhesiveness to an application target is improved as compared with that of a metal film made from a conventional conductive ink composition.

7 Claims, 28 Drawing Sheets

CONDUCTIVE INK COMPOSITION

This Nonprovisional application claims priority under 35 U.S.C. § 119(a) on Patent Application No. 2004/186938 filed in Japan on Jun. 24, 2004, and Patent Application No. 2005/160706 filed in Japan on May 31, 2005, the entire contents of which are hereby incorporated by reference.

FIELD OF THE INVENTION

The present invention relates to a conductive ink composition using metal fine particles; a reflective member; a circuit substrate; and an electronic apparatus, more specifically, to (i) a conductive ink composition, which allows restraint of metal grain growth; (ii) a reflective member, obtained by carrying out a drying treatment or heating treatment with respect to the conductive ink composition; (iii) a circuit substrate including a metal layer such as a wire, an electrode, or a reflective member, each of which is obtained by carrying out a drying treatment or heating treatment with respect to the conductive ink composition; and (iv) an electronic apparatus, such as a display apparatus, including the circuit substrate.

BACKGROUND OF THE INVENTION

A display apparatus, which is one of electronic apparatuses, is used in various fields such as a personal computer, a mobile phone, a digital still camera, and a liquid crystal television. A specific example of the display apparatus is a liquid crystal display apparatus.

Such an electronic apparatus as the display apparatus includes a circuit substrate such as a TFT (thin film transistor) array substrate having, e.g., TFTs, wires, and the like.

Generally, such a circuit substrate is manufactured by repeating the following process several times. That is, a thin film is formed in accordance with a vapor deposition method such as the CVD (chemical vapor deposition) method or the sputtering method, and then an unnecessary part of the formed film is removed (etched) by way of photolithography or the like.

However, such a conventional manufacturing method suffers from the following problems (1) and (2): (1) the repeated film forming and the repeated etching cause efficiency in use of materials to be bad, and require an expensive disposal cost of many generated waste products such as an etching solution, and require long manufacturing time; and (2) immeasurable equipment cost is required for manufacture of a circuit substrate that has been demanded to be bigger in recent years. Such immeasurable equipment cost is required because the manufacture of the circuit substrate requires many vacuum apparatuses such as (i) a film forming apparatus used in each film forming step, and (ii) a processing apparatus such as an etching apparatus. A specific example of such a circuit substrate is a TFT array substrate.

In light of this, proposed in recent years is a technique for forming a wire and the like in the circuit substrate by using the "inkjet method (droplet discharging method)". The inkjet method is a method of discharging, to a desired region, a liquid material containing conductive fine particles such that a desired pattern containing the discharged material is formed.

For example, Japanese Laid-Open Patent Publication Tokukai 2003-318192 (published on Nov. 7, 2003; corresponding to U.S. Laid-Open Patent Publication Number 2003219934; hereinafter, referred to as "patent document 1") discloses a method for making a wire, in accordance with the inkjet method, from a paste obtained by dispersing, in an organic solvent, silver fine particles each having a particle diameter of 0.01 µm or so. The paste is an example of the liquid material, which contains the metal particles each containing any of gold, silver, copper, palladium, and nickel.

Generally, in the case of forming the circuit substrate such as a TFT array substrate used for a liquid crystal display apparatus, properties required for the wire are: (i) low electric resistance, (ii) surface smoothness, and (iii) good adhesiveness to a priming material such as glass.

However, a noble metal is generally stable, so that the noble metal has low reactivity with respect to a target (hereinafter, referred to as "application target") to which the noble metal is to be applied. An example of such an application target is a substrate. In other words, the noble metal has poor adhesiveness to the substrate. Inkjet ink generally used in conventional techniques is "silver ink", which is manufactured by dispersing, in an organic solvent, silver fine particles each having a particle diameter of approximately 0.01 µm. Required when silver is used as the thin film as such is: the adhesiveness to the priming material (application target) such as an application surface of a glass substrate or of an insulating material. In the sputtering, adhesiveness of the noble metal (silver, in this case) to the substrate can be improved by an effect of striking the particles against the substrate. However, in cases where the paste using the aforementioned silver particles is printed in accordance with the inkjet method or where the paste is applied, such a striking effect cannot be expected during the film forming process. This reduces the adhesiveness to the priming material such as the glass substrate. This is not only the case with the silver particles. That is, in cases where the aforementioned metal particles has low reactivity and low adhesiveness with respect to other materials as the noble metal does, the metal particles are more easily detached from the substrate. Accordingly, the metal particles are detached with ease by a tape peel test.

Moreover, in cases where a silver film is formed on a glass substrate, grain growth is noticeable at a baking temperature of approximately 250° C. This causes a smooth surface to be rough, with the result that the surface becomes whitish. That is, such high temperature baking causes deterioration in the surface smoothness of the formed silver film, and makes it difficult for the formed silver film to be used as a wire just the way as the silver film is.

For improvement of the adhesiveness, an annealing treatment is taken into consideration. However, as is the case with the aforementioned case using the silver particles, the grain growth property of the noble metal also causes the surface of the film to be rough, with the result that the surface smoothness is deteriorated.

As such, the grain growth of the noble metal causes deterioration of the surface smoothness, and the deterioration causes various problems. See FIG. 28, for example. In FIG. 28, a lower portion wire 201 is formed by using, e.g., the aforementioned ink. The lower portion wire 201 has bad surface smoothness in a portion (cross portion (overlap portion) of wires) at which the wires overlap with one another. Such surface irregularity possibly causes short-circuit via an insulating layer 202 formed on the lower portion wire 201. In other words, such an irregularity possibly causes a defect L such as film discontinuity of the insulating layer 202. This is a cause of leakage (top-bottom leakage between upper and lower wires) between the lower portion wire 201 and an upper portion wire 203 formed above the lower portion wire 201, via the insulating layer 202. For example, see a case of manufacturing a TFT array substrate as the circuit substrate. In this case, in a gate electrode portion and a TFT portion, amorphous silicon (a-Si) layers (approximately 500 Å=approximately 50 nm) are so formed as to sandwich a gate insulating layer. Therefore, surface deterioration of a gate electrode serving as the lower portion wire 201 gives rise to deterioration of a TFT property, and to film discontinuity of the gate insulating layer serving as the insulating layer 202. Further, the film discontinuity caused by the surface deterioration gives rise to the aforementioned top-bottom leakage with a storage capacitor electrode. With this, the storage capacitor does not possibly work as a capacitor.

SUMMARY OF THE INVENTION

The present invention is made in light of the conventional problems, and its object is to provide (i) a conductive ink composition, which allows restraint of the metal grain growth as compared with the conventional conductive ink, such as the silver ink, using metal fine particles each made of silver; (ii) a reflective member using the conductive ink composition; and (iii) a circuit substrate using the conductive ink composition, and (iv) an electronic apparatus using the conductive ink composition. Additional object of the present invention is to provide (i) a conductive ink composition, which is improved in terms of adhesiveness to an application target as compared with a conventional conductive ink, such as the silver ink, using metal fine particles consisting of only a noble metal; (ii) a reflective member using the conductive ink composition; and (iii) a circuit substrate using the conductive ink composition; and (iv) an electronic apparatus using the conductive ink composition. Another additional object of the present invention is to provide (i) a conductive ink composition allowing restraint of the metal grain growth, and accordingly allowing formation of a film having excellent surface smoothness; (ii) a circuit substrate having a metal layer having excellent surface smoothness rendered by restraining the metal grain growth; (iii) an electronic apparatus having such a metal layer; and (iv) a reflective member having such a metal layer. Still another additional object of the present invention is to provide (i) a conductive ink composition allowing restraint of the metal grain growth, and accordingly allowing formation of a film having excellent reflective efficiency; (ii) a circuit substrate having a metal layer having excellent reflective efficiency rendered by restraining the metal grain growth; (iii) an electronic apparatus having such a metal layer; and (iv) a reflective member having such a metal layer.

The present inventors diligently studied in order to solve the conventional problems, and found that: alloying of a noble metal and an additional metal other than a noble metal allows restraint of the property of the noble metal, and use of protective colloids allows restraint of the metal grain growth occurring in portions containing a larger amount of the noble metal as compared with surroundings. Further, the present inventors found that use of protective colloids made of at least two organic compounds allows effective restraint of the metal grain growth, and accordingly allows improvement of the adhesiveness to the application target, of the film surface smoothness, and of the reflective efficiency as compared with the conventional technique does. The present inventors further studied and found that further devising of the protective colloids in the conductive ink composition allows restraint of the metal grain growth as compared with the conventional technique, (i) even in regions containing a small amount of the additional metal, and (ii) even in cases where the metal fine particles are made of only one noble metal. With this, the adhesiveness, the film surface smoothness, and the reflective efficiency are improved.

That is, to achieve the object, a conductive ink composition according to the present invention includes a solid material made from metal fine particles each coated with protective colloids each made of at least two organic compounds, said metal fine particles consisting of an alloy containing at least a noble metal.

To achieve the object, a conductive ink composition according to the present invention is a solid material made from (i) metal fine particles consisting of a plurality of metals, at least one of which is a noble metal, and (ii) protective colloids, each of which includes at least two organic compounds and which surround the metal fine particles, said conductive ink composition being able to be dispersed in an organic solvent.

To achieve the object, a conductive ink composition according to the present invention is a liquid material including (i) metal fine particles consisting of a plurality of metals, at least one of which is a noble metal, (ii) protective colloids, each of which includes at least two organic compounds and which surround the metal fine particles, and (iii) an organic solvent.

With the arrangements, the conductive ink composition includes the solid material including the metal fine particles coated with the protective colloids each made of at least two organic compounds, the metal fine particles consisting of a plurality of metals, at least one of which is a noble metal. A specific example of such metal fine particles is metal fine particles consisting of an alloy containing at least a noble metal. The use of such a conductive ink composition allows restraint of the metal fine grain growth as compared with the use of the conventional silver conductive ink using the metal fine particles consisting of only silver; and accordingly allows formation of a metal layer (metal film) having excellent surface smoothness, better adhesiveness to the application target, and better reflective efficiency as compared with the conventional silver conductive ink does.

It is preferable that each of the protective colloids be a compound and/or a mixture, each of which is made from a raw material containing an (A) amine and a (B) carboxylic acid. It is more preferable that the (B) carboxylic acid be a mixture of (I) at least one carboxylic acid selected from carboxylic acids having 4 carbon atoms to 9 carbon atoms, and (II) at least one carboxylic acid selected from carboxylic acids having 10 carbon atoms to 30 carbon atoms, and an average number of carbon atoms contained in the (B) carboxylic acid range from 5 to 25. It is preferable that the (A) amine is an alkylamine having 5 carbon atoms to 20 carbon atoms.

Further, to achieve the object, a conductive ink composition according to the present invention includes A conductive ink composition, comprising a solid material made from metal fine particles consisting of a noble metal, each of said metal fine particles being coated with protective colloids, each of the protective colloids being made from an (A) amine and a (B) carboxylic acid, the (B) carboxylic acid being a mixture of (I) at least one carboxylic acid selected from carboxylic acids having 4 carbon atoms to 9 carbon atoms, and (II) at least one carboxylic acid selected from carboxylic acids having 10 carbon atoms to 30 carbon atoms, and an average number of carbon atoms contained in the (B) carboxylic acid ranges from 5 to 25.

Further, to achieve the object, a conductive ink composition according to the present invention is a solid material made from metal fine particles consisting of a noble metal, the metal fine particles being coated with protective colloids each including an (A) amine and a (B) carboxylic acid, said conductive ink composition being able to be dispersed in an organic solvent, the (B) carboxylic acid being a mixture of (I) at least one carboxylic acid selected from carboxylic acids having 4 carbon atoms to 9 carbon atoms, and (II) at least one carboxylic acid selected from carboxylic acids having 10 carbon atoms to 30 carbon atoms, and an average number of carbon atoms contained in the (B) carboxylic acid ranges from 5 to 25.

Further, to achieve the object, a conductive ink composition according to the present invention is a liquid material including (i) metal fine particles consisting of a noble metal, (ii) protective colloids surrounding the metal fine particles, and (iii) an organic solvent, each of the protective colloids including an (A) amine and a (B) carboxylic acid, the (B) carboxylic acid being a mixture of (I) at least one carboxylic acid selected from carboxylic acids having 4 carbon atoms to 9 carbon atoms, and (II) at least one carboxylic acid selected from carboxylic acids having 10 carbon atoms to 30 carbon atoms, and an average number of carbon atoms contained in the (B) carboxylic acid ranges from 5 to 25.

Also in the conductive ink composition using the metal fine particles each made of only the noble metal, it is preferable that the (A) amine be an alkylamine having 5 carbon atoms to 20 carbon atoms.

The protective colloids allow very effective restraint of the grain growth. Therefore, even when the conductive ink composition according to the present invention uses the metal fine particles consisting of only the noble metal, the metal grain growth is restrained as compared with the conventional conductive ink, such as the silver ink, obtained by dispersing, in the organic solvent, the metal fine particles consisting of the noble metal. This allows formation of a metal layer (metal film) having excellent surface smoothness, better adhesiveness to the application target as compared with the conventional metal layer. Therefore, the arrangements above make it possible to provide a conductive ink composition allowing formation of a metal layer having low electric resistance, particularly, formation of a wire having low electric resistance and/or an electrode having low electric resistance. Further, the metal grain growth restraint by the conductive ink composition allows formation of a metal layer having excellent reflective efficiency. Therefore, the arrangements make it possible to provide the conductive ink composition allowing formation of a reflective member which is excellent in terms of surface smoothness, adhesiveness to the application target, and reflective efficiency. The metal layer is especially suitably used for a reflective electrode or the like.

Further, to achieve the object, a reflective member according to the present invention is obtained by carrying out a drying treatment or a heating treatment with respect to the conductive ink composition according to the present invention.

Further, to achieve the object, a circuit substrate according to the present invention includes a metal layer obtained by carrying out a drying treatment or a heating treatment with respect to the conductive ink composition according to the present invention.

Further, to achieve the object, an electronic apparatus according to the present invention includes the circuit substrate according to the present invention.

Each metal layer such as the wire, the electrode, the reflective member, and the like is obtained by drying or heating (e.g., baking) the conductive ink composition according to the present invention. Therefore, the metal grain growth is restrained in the metal layer as compared with that in the metal layer made from the conventional ink such as silver ink, and the metal layer accordingly has excellent surface smoothness, and excellent adhesiveness to the application target. Therefore, the metal layer has lower resistance than the metal layer made from the conventional conductive ink, and has excellent reflective efficiency. So, the arrangements make it possible to provide highly reliable reflective member, circuit substrate, and electronic apparatus, each of which has the metal layer whose surface smoothness is excellent and whose adhesiveness is improved by the restraint of metal grain growth as compared with the metal layer made from the conventional conductive ink.

Additional objects, features, and strengths of the present invention will be made clear by the description below. Further, the advantages of the present invention will be evident from the following explanation in reference to the drawings.

DESCRIPTION OF THE EMBODIMENTS

Figure 1:
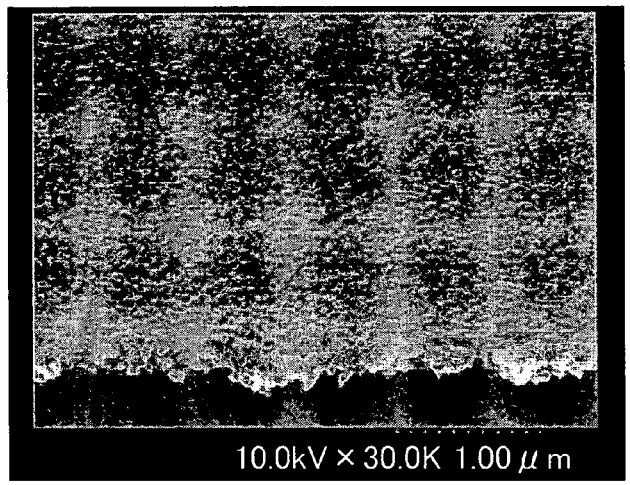
FIG. 1 is a diagram using a scanning electronic micrograph (magnification of 30000) illustrating a surface of a silver-indium ink film using protective colloids shown in Example 2, the silver ink film being obtained by way of annealing carried out for an hour at a temperature of 300° C. under $N_2$ gas atmosphere.

A conductive ink composition according to the present embodiment is such an ink material that allows a thin metal film to be formed on an application target by drying or heating (e.g., baking) the ink material after applying the ink material to the application target. The conductive ink composition at least contains (i) metal fine particles each containing at least a noble metal, and (ii) protective colloids, each of which is made of at least two organic compounds and which surround the metal fine particles.

The conductive ink composition according to the present embodiment at least contains, for example, (i) metal fine particles consisting of a plurality of metals, at least one of which is a noble metal; and (ii) protective colloids each of which is made of at least two organic compounds, and which surround the metal fine particles.

More specifically, for example, the conductive ink composition includes a solid material made from (essentially consisting of) an alloy containing at least a noble metal, the alloy being coated with a protective colloid made of at least two organic compounds.

Further, the conductive ink composition may be a solid material constituted by (i) metal fine particles consisting of a plurality of metals, at least one of which is a noble metal, and (ii) protective colloids, each of which is made of at least two organic compounds and which surround the metal fine particles; and the conductive ink composition may be able to be dispersed in an organic solvent (dispersion medium).

According to the present embodiment, when the solid material (colloid particle) in the conductive ink composition is baked, each of the protective colloids on the surface of the metal fine particle is removed, with the result that the metal fine particles are fused with one another. With this, a metal film is formed. Therefore, the colloid particle may be (1) such a colloid particle including each alloy fine particle containing at least a noble metal, the alloy fine particle being coated with the protective colloid; or (2) such a colloid particle including each metal fine particle made of a plurality of metals, at least of one of which is a noble metal, the metal fine particle being coated with the protective colloid; or (3) a mixture of the colloid particles (1) and (2).

Because the metal fine particles are surrounded (coated) by the protective colloids as such, the solid material can be dispersed in the organic solvent. That is, even when adding and mixing the organic solvent with the conductive ink composition, the solid material is never dissolved or never sinks in the organic solvent. By dispersing the conductive ink composition in the organic solvent in this way, the conductive ink composition can be used as ink.

In the present embodiment, it is preferable that: the solid material contain the metal fine particles at an occupation rate of a range from 60% by mass to 95% by mass, and contain the protective colloids at an occupation rate of 5% by mass to 40% by mass. Note that total of the occupation rates is 100% by mass.

Further, the conductive ink composition may be, for example, a liquid material including (i) metal fine particles consisting of a plurality of metals, at least one of which is a noble metal, (ii) protective colloids, each of which is made of at least two organic compounds and which surrounds the metal fine particles, and (iii) an organic solvent. In other words, the conductive ink composition may be a liquid material containing the organic solvent. Namely, the conductive ink composition can be used as ink without adding anything thereto, or can be used as ink by further adding an organic solvent according to the content of the metal fine particles in the conductive ink, i.e., according to flowablility of the conductive ink. Note that the flowablility may be arbitrarily determined according to intended use or usage so as to fall within a desired range, and is not particularly limited.

It is preferable that: the liquid material contain the metal fine particles at a rate of 15% by mass to 95% by mass, and contain the protective colloids at a rate of 1% by mass to 50% by mass, and contain the organic solvent at a rate of 1% by mass to 60% by mass. Note that total of the rates is 100% by mass.

Each of the metal fine particles used in the present embodiment is an ultrafine particle (nanoparticle) having a particle diameter of several nm to several hundred nm. Specifically, a metal fine particle having a particle diameter of 1 nm to 100 nm is suitably used.

Further, the metal fine particle used in the present embodiment may contain at least a noble metal, i.e., the metal fine particle is not particularly limited as long as the metal fine particle may contain at least one noble metal in cases where the metal fine particles consist of a plurality of metals. However, it is preferable that, in cases where the conductive ink composition is used as a wire material in a circuit substrate (wire substrate), i.e., is used as a material (hereinafter, referred to as "wire material") for a wire and/or an electrode in an insulating substrate such as a glass substrate, the metal fine particle be made of a metal having low electric resistance, heat resistance, adhesiveness to a glass substrate, and high process resistance such as plasma resistance. The plasma resistance refers to such a resistance preventing a surface condition and a property from being changed under a plasma atmosphere in a process such as a dry etching process.

Specific examples of the aforementioned noble metal include: gold, silver, ruthenium, rhodium, palladium, osmium, iridium, platinum, and the like; however, the noble metal is not limited to these. These noble metals may be used solely, or may be used in appropriate combination. It is preferable to use gold, silver, platinum, and the like of the noble metals, and it is more preferable to use silver.

In the present embodiment, suitably used as the metal other than the noble metal is a metal having a standard oxidation-reduction potential of −0.45 V/NHE to +1.5 V/NHE.

As the metal other than the noble metal in the present embodiment, it is preferable to use one metal from a group consisting of iron, cobalt, nickel, copper, cadmium, indium, tin, thallium, lead, molybdenum, and bismuth. In cases where silver is used as the noble metal, it is particularly preferable that indium is contained in the metal fine particle. Note that all the above-exemplified metals satisfy the standard oxidation-reduction potential.

Each of such metals other than the noble metal in the metal fine particle allows the following effect in cases where the conductive ink composition is used as the wire material in the circuit substrate. That is, the metal thus contained in the metal fine particle allows restraint of the metal grain growth as compared with the conventional conductive ink using the metal fine particle only made of a single noble metal (specifically, the silver ink using the metal fine particle only made of silver), the conventional conductive ink being obtained by dispersing the noble metal particles in the organic solvent. This allows easy formation of a wire and/or an electrode, each of which has low electric resistance and allows improvement of adhesiveness to an insulating substrate such as a glass substrate.

Especially, in cases where the conductive ink composition contains indium at a rate of 0.5% by mass to 5% by mass with respect to silver, such a conductive ink composition allows acquirement of a wire and/or an electrode, each of which has low electric resistance and plasma resistance. Meanwhile, in cases where the conductive ink composition contains indium at a rate of less than 0.5% by mass with respect to silver, such a conductive ink composition allows acquirement of a wire and/or an electrode, each of which has an electric resistance of substantially 4 µΩ·cm to substantially 10 µΩ·cm while the electric resistance depends on a type of the protective colloid. Such a conductive ink composition is especially suitably used for manufacture of a circuit substrate of a liquid crystal display apparatus for use in a liquid crystal TV or the like.

Note that the electric resistance can be found after a heat annealing treatment, in accordance with (i) sheet resistance found by using the four-probe method, and (ii) a measured film thickness. Note also that, in the present embodiment, the sheet resistance is measured with the use of a measuring device "Loresta GP (product name)" provided by Mitsubishi Chemical Corporation. Note also that a dry etching apparatus (RIE, reactive ion etching method) is used for evaluation of the plasma resistance.

In the present embodiment, the respective rates of the noble metal and the other metal are not particularly limited in the metal fine particle, and may be arbitrarily determined according to (i) purpose of use of the conductive ink composition, (ii) a desired property thereof, (iii) the type of the metals used in combination, and the like. However, in cases where the conductive ink composition is used as the wire material for the circuit substrate such as a TFT array substrate, it is preferable that the metal fine particle contain the noble metal as a main component. However, in cases where copper is used as the metal other than the noble metal, copper may be a main component of the metal fine particle.

What may be used as the conductive ink composition is, e.g., the silver conductive ink composition that contains, as the colloid particle, the metal fine particle only made of silver serving as the noble metal. However, in the case of using, as the conductive ink composition, the silver-indium ink composition containing, as the colloid particle, the metal fine particle made of silver and indium, it is preferable that the rate (indium/silver (% by mass)) of indium with respect to silver in the metal fine particle be set as follows in accordance with the aforementioned purpose of use of the conductive ink composition, the aforementioned desired property, and the like. That is, in cases where the conductive ink composition is used for a wire and/or an electrode, it is preferable that the rate (indium/silver (% by mass)) of indium with respect to silver be 6% by mass or less, i.e., be more than 0% by mass but not more than 6% by mass; and it is more preferable that the rate be 2% by mass or less, i.e., be more than 0% by mass but not more than 2% by mass. On the other hand, in cases where the conductive ink composition is used for a reflective member, it is preferable that the rate (indium/silver (% by mass)) of indium with respect to silver be 0.4% by mass or less, i.e., be more than 0% by mass but not more than 0.4% by mass; and it is more preferable that the rate be 0.2% by mass or less, i.e., be more than 0% by mass but not more than 0.2% by mass.

When a large amount of indium is used, i.e., when the content (indium concentration) of indium is large in an obtained metal film, the plasma resistance can be improved. On the other hand, when the content (indium concentration) of indium is small in the obtained metal film, the plasma resistance is decreased, but the electric resistance can be decreased and the reflective property can be improved. Note that the resistance becomes higher as the content of the indium is larger in the obtained metal film. However, such alloying of silver with indium allows restraint of the property of the silver, so that the conductive ink composition according to the present embodiment allows restraint of the metal grain growth as compared with the silver ink obtained by dispersing the silver particles in the organic solvent. Moreover, the protective colloid allows restraint of metal grain growth that occurs in a portion containing a larger amount of silver as compared with the surroundings. Further, the protective colloid is made of at least two organic compounds, so that the adhesiveness to an application target can be improved as compared with the conventional conductive ink composition. Meanwhile, the reflective property is affected according to the aforementioned indium concentration. That is, the reflective property is decreased as the indium concentration is higher. Specifically, the reflectance of the metal film with respect to light rays having a short wavelength is tend to be decreased as compared with that of a deposition film, as described in Examples below. However, as described above, high reflectance and low electric resistance can be realized at a time by the addition of indium to silver, i.e., by using the metal film as the reflective member, especially as a reflective electrode, which metal film is made from the solid solution (alloy) of silver and indium. Further, as described in Examples below, very high reflectance with respect to light rays having a long wavelength of 450 nm or longer can be obtained by adding an appropriate amount of indium to silver, i.e., by using, as the conductive ink composition, a silver-indium conductive ink composition using the aforementioned protective colloid. Such reflectance is better than that of an aluminum film formed by way of the sputtering.

The solid material according to the present embodiment is a colloid particle (metal colloid particle) obtained by covering (coating) the metal fine particles with the protective colloids. Each of the colloid particles has a particle diameter of approximately Y+2 nm to Y+5 nm, Y indicating the diameter of each of the metal particles.

Note that, it is assumed that the present embodiment uses metal fine particles whose average particle diameter is in a range of 2 nm to 5 nm, except when specifically described; however, the present invention is not limited to this. Each particle diameter of such fine particles (ultrafine particles) is so small that each of the fine particles makes contact with the application target in many points, and that the film to be formed can be thinner. This makes it possible to render the surface smoothness to a wire and/or an electrode with ease.

Further, the protective colloid used in the present embodiment is not particularly limited as long as the protective colloid is made from at least two organic compounds. Specifically, the protective colloid is a compound (low-molecular weight compound) made from at least two organic compounds, and/or is a mixture. That is, the protective colloid is a compound (low-molecular weight) made from at least two organic compounds, or is a mixture (mixture of organic compounds) made from a raw material made of at least two organic compounds, or is a mixture of the compound and the mixture.

The protective colloid is not particularly limited as long as the protective colloid satisfies the above condition. However, it is preferable that the protective colloid be a compound and/or a mixture, each of which is made from a raw material (monomer composition) containing an (A) amine and a (B) carboxylic acid as main components (active components). Further, it is more preferable that the protective colloid be a compound and/or a mixture, each of which is made from a raw material including an (A) amine, and a (B) carboxylic acid including (i) a carboxylic acid (hereinafter, referred to as "low-molecular weight carboxylic acid") having relatively low-molecular weight, and (ii) a carboxylic acid (hereinafter, referred to as "low-molecular weight carboxylic acid") having relatively high-molecular weight. It is further preferable that the protective colloid be a compound and/or a mixture made from a raw material including a low-molecular weight carboxylic acid, a high-molecular weight carboxylic acid, and an amine.

The low-molecular weight carboxylic acid used in the present embodiment is a carboxylic acid having 4 carbon atoms to 9 carbon atoms (i.e., at least one carboxylic acid selected from carboxylic acids having 4 carbon atoms to 9 carbon atoms). The high-molecular weight carboxylic acid used therein is a carboxylic acid having 10 carbon atoms to 30 carbon atoms (i.e., at least one carboxylic acid selected from carboxylic acids having 10 carbon atoms to 30 carbon atoms.)

In other words, it is preferable that the (B) carboxylic acid for use in the protective colloid be a mixture of (I) at least one carboxylic acid selected from the carboxylic acids having 4 carbon atoms to 10 carbon atoms, and (II) at least one carboxylic acid selected from carboxylic acids having 10 carbon atoms to 30 carbon atoms. Further, it is preferable that the average number of carbon atoms in the (B) carboxylic acid ranges from 5 to 25.

The present inventors diligently studied, and found that the adhesiveness to an application target can be improved and the grain growth of the noble metal can be restrained by using such a protective colloid that is made from the (A) amine and the (B) carboxylic acid which is a mixture of (I) the carboxylic acid selected from the carboxylic acids having 4 carbon atoms to 9 carbon atoms, and (II) the carboxylic acid selected from the carboxylic acids having 10 carbon atoms to 30 carbon atoms, and the average number of the carbon atoms in the (B) carboxylic acid ranges from 5 to 25. Such improvement and restraint can be obtained (i) even in a region having a small content of the metal (additional metal) other than the noble metal, or (ii) even in cases where the metal fine particle is only made of a noble metal.

Further, it is preferable that the low-molecular weight carboxylic acid be a carboxylic acid (i) having 4 carbon atoms to 8 carbon atoms (i.e., at least one carboxylic acid selected from the carboxylic acids having 4 carbon atoms to 8 carbon atoms). Further, it is preferable that the high-molecular weight carboxylic acid be a carboxylic acid (ii) having 20 carbon atoms to 30 carbon atoms (i.e., at least one carboxylic acid selected from the carboxylic acids having 4 carbon atoms to 8 carbon atoms), or a mixture (iii) of carboxylic acids having 10 carbon atoms to 30 carbon atoms, the average number of the carbon atoms in the mixture ranging from 15 to 25.

In the present embodiment, the (B) carboxylic acid may be a mixture of the carboxylic acids (i) and (ii), or of the carboxylic acid (i) and the mixture (iii). The carboxylic acid (i) refers to the carboxylic acid having 4 carbon atoms to 8 carbon atoms. The carboxylic acid (ii) refers to the carboxylic acid having 20 carbon atoms to 30 carbon atoms. The mixture (iii) refers to the mixture of the carboxylic acids having 10 carbon atoms to 30 carbon atoms, the average number of the carbon atoms in the mixture ranging from 15 to 25.

Respective rates of the (A) amine and the (B) carboxylic acid are not particularly limited in the raw material; however, it is preferable that the rate of the (A) amine fall within a range from 40 mol % to 79 mol %, and that the rate of the (B) carboxylic acid fall within a range of 21 mol % to 60 mol % (note that total of the rates is 100%). In cases where the mixture of the low-molecular weight carboxylic acid and the high-molecular weight carboxylic acid is used as the (B) carboxylic acid, it is preferable that a rate of the low-molecular weight carboxylic acid fall within a range from 2 mol % to 40 mol %, and that a rate of the high-molecular weight carboxylic acid fall within a range from 1 mol % to 20 mol %, and that a rate of the (A) amine fall within a range from 40 mol % to 79 mol % (note that total of the rates is 100%). The low-molecular weight carboxylic acid specifically refers to at least one carboxylic acid selected from the carboxylic acids having 4 carbon atoms to 9 carbon atoms, and desirably refers to at least one carboxylic acid selected from the carboxylic acids having 4 carbon atoms to 8 carbon atoms. The high-molecular weight carboxylic acid specifically refers to at least one carboxylic acid selected from the carboxylic acids having 10 carbon atoms to 30 carbon atoms, and desirably refers to at least one carboxylic acid selected from the carboxylic acids having 20 carbon atoms to 30 carbon atoms, or desirably refers to a mixture of carboxylic acids having carbon atoms having 10 carbon atoms and 30 carbon atoms, the average number of the carbon atoms in the mixture ranging from 5 to 25.

Further, in cases where the (B) carboxylic acid contains a solid carboxylic acid having a high melting point, it is preferable to melt such a solid carboxylic acid by adding, to the (B) carboxylic acid, a carboxylic acid having carbon atoms less than the carboxylic acid having the high melting point. The addition is carried out in consideration of the relation between the respective mol rates of the low-molecular weight carboxylic acid and the high-molecular weight carboxylic acid.

Specific examples of such a high-molecular weight carboxylic acid include: decanonic acid, dodecanoic acid, tetradecanoic acid, pentadecanoic acid, hexadecanoic acid, octadecanoic acid, octadecenoic acid, octadecadienoic acid, docosanoic acid, and the like. These high-molecular weight carboxylic acids may be solely used, or two or more of them may be used in appropriate combination. Further, as the high-molecular weight carboxylic acid, the above-exemplified high-molecular weight carboxylic acids may be used in appropriate combination as described above, or a high-molecular weight carboxylic acid having molecular weight distribution may be used. A specific example of such a high-molecular weight carboxylic acid is naphthenic acid, which is a mixture of acid things found in crude oil. Note that the naphthenic acid may be used in combination with the other carboxylic acids. Note also that commercially available naphthenic acid contains components other than the carboxylic acid, and some of the components are not the components (active components) serving as the protective colloid. However, such components can be removed from the system by washing, e.g., in a step of removing irrelevant protective colloids. Accordingly, such components can be removed from a final product conductive ink composition of the present application. As such, the raw material may contain the components other than the active components, i.e., the components other than the (A) amine and the (B) carboxylic acid.

Meanwhile, specific examples of the aforementioned low-molecular weight carboxylic acid include: butyric acid, pentanoic acid, hexanoic acid, octanoic acid, and the like. These low-molecular weight carboxylic acids may be solely used, or two or more of them may be used in appropriate combination.

Further, suitably used as the (A) amine in the present embodiment is alkylamine, particularly, alkylamine having 5 carbon atoms to 20 carbon atoms.

Particularly suitably used for the protective colloid are: (i) a protective colloid made from naphthenic acid, hexanoic acid, and octylamine; (ii) a protective colloid made from octadecadienoic acid, hexanoic acid, and octylamine. Note that the present embodiment uses naphthenic acid as the high-molecular weight carboxylic acid, because naphthenic acid is available with ease and the naphthenic acid has the molecular weight distribution. Specifically, the present embodiment uses a naphthenic acid which has a weight-average molecular weight of approximately 270 and which contains naphthenic acids, unsaturated carboxylic acids, esters, diol, alkane, and the like. However, the present invention is not limited to this, and may use any high-molecular weight carboxylic acid satisfying the above condition.

In the present embodiment, the (B) carboxylic acid may be a chain carboxylic acid, a monocyclic carboxylic acid, or a polycyclic carboxylic acid as described above.

In the case of using the metal fine particles consisting of the alloy containing at least the noble metal as described above, the protective colloid may be made of at least two organic compounds, and may contain the components other than the (A) amine and the (B) carboxylic acid. Such components other than the (A) amine and the (B) carboxylic acid, and respective contents of the components are not particularly limited. However, it is preferable that the protective colloid contain the (A) amine and the (B) carboxylic acid as the main components. Also, it is preferable that the protective colloid be made from the (A) amine and the (B) carboxylic acid.

Further, a hydrocarbon having 10 carbon atoms to 35 carbon atoms is preferable for the organic solvent (dispersion medium). Particularly preferable therefor is a side-chain aliphatic hydrocarbon having 16 carbon atoms to 30 carbon atoms. Specific examples of the organic solvent include nonpolar solvents such as tetradecane, heptamethylnonane, and tetramethylpentadecane; however, the organic solvent is not limited to these. These organic solvents may be solely used, or two or more of them may be used in appropriate combination.

Each of the organic solvents is available with ease, and the organic solvent allows good and stable dispersion of the metal particles, which are coated with the protective colloids. Moreover, the organic solvent has a low boiling point, so that removal of the organic solvent can be easy by way of a drying or heating (e.g., baking) treatment.

In the present embodiment, there is no particular limitation in terms of the content rate of the metal fine particles in the final product conductive ink composition, i.e., in the conductive ink composition serving as the conductive ink. However, it is preferable that the content rate fall within a range from 30% by mass to 70% by mass. Note that, as a specific example, the present embodiment uses the conductive ink composition containing the metal fine particles at a content of 30% by mass to 40% by mass, except when specifically described; however, the present invention is not limited to this. It is preferable that the rate of the metal fine particles be as high as possible in the conductive ink composition. In other words, it is preferable that the conductive ink composition contain the metal fine particles in the possible highest concentration.

Further, the content rate of the protective colloids depends on the content rate of the metal fine particles in the conductive ink composition serving as the conductive ink composition; however, it is preferable that the rate of the protective colloids fall within a range of 8% by mass to 27% by mass. The protective colloids are excessively used with respect to the metal fine particles. For example, in the present embodiment, the used amount of the protective colloids is 15 times larger, in terms of mol, than the used amount of the metal fine particles; however, the amount of the protective colloids may be as large as or larger, in terms of mol, than the amount of the metal fine particles. An irrelevant protective colloid is removed from the system (the conductive ink composition) by washing after the formation of the colloid particles (metal colloid particles).

The following explains a method for producing the colloid particles and the conductive ink composition containing the colloid particles, with reference to an example of producing metal fine particles, each of which is made of a metal containing silver and indium.

The conductive ink composition can be produced with ease as follows. That is, metallic salts (metal ions) are subjected to a reduction treatment in the presence of the protective colloids, for the purpose of depositing the colloid particles. Thereafter, irrelevant protective colloids are removed by washing. Thereafter, the solvent used in the above treatment is replaced with the target organic solvent (dispersion medium). By dispersing the colloid particles in the organic solvent (dispersion medium), the conductive ink composition (conductive ink) according to the present embodiment is obtained in the form of a metal colloid liquid.

Figure 2:
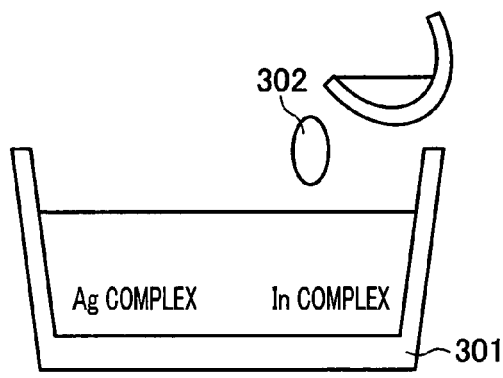
FIG. 2(a) to FIG. 2(c) are diagrams respectively illustrating steps of manufacturing a conductive ink composition according to one embodiment of the present invention.
Figure 2:
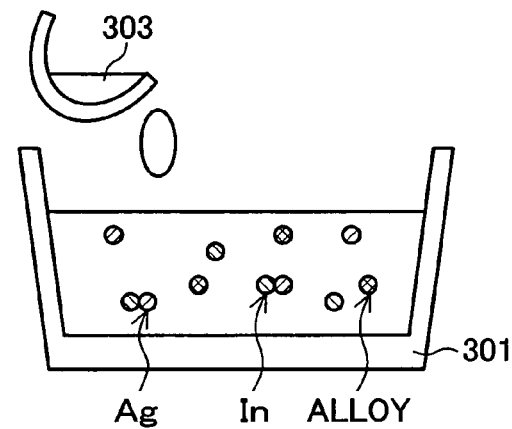
Figure 2:
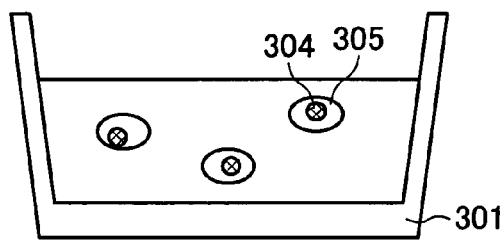

More specifically, for example, a solvent, metallic salts, and a protective colloid raw material 302 are firstly provided in a reaction container 301 for the sake of preparing a metallic salt solution as shown in FIG. 2(a). Note that the preparation of the metallic salt solution may be carried out by adding the protective colloid raw material 302 to the solvent in which the metallic salts are dissolved. In this case, the protective colloid raw material 302 is added as a dispersing agent for preventing an aggregation of the metal fine particles. Alternatively, the preparation of the metallic salt solution may be carried out by dissolving the metallic salt in the solvent containing the protective colloid raw material 302 serving as the dispersing agent. Note also that each of the metallic salts serves as a complex ion (silver complex; indium complex) in the metallic salt solution (metal ion solution).

Thereafter, as shown in FIG. 2(b), a reducing agent 303 is added to the metallic salt solution such that the two metals, i.e., silver and indium are reduced. This causes alloying of silver and indium in the process of the grain growth. Accordingly, silver-indium alloy particles are deposited. Therefore, the solvent in the reaction container contains: silver, indium, and the silver-indium alloy particles (described as "metal fine particles 304" in FIG. 2(c)).

The metal fine particles 304 thus deposited, i.e., for example, the aforementioned alloy fine particles are adhered to protective colloids 305 as shown in FIG. 2(c), with the result that the metal fine particles 304 are coated with the protective colloids 305. With this, the colloid particles are obtained. Carried out thereafter is removal of irrelevant protective colloids 305 forming no colloid fine particle. Then, the colloid fine particles are washed, and the solvent in the reaction container 301 is replaced with a target organic solvent (dispersion medium). This allows acquirement of the conductive ink composition according to the present embodiment.

Note that a particle diameter of the metal fine particle 304 can be controlled by controlling the reduction reaction, and by controlling the selection of the protective colloids.

In the aforementioned method, the alloying is carried out in the process of the grain growth by reducing silver ion and indium ion, as described above. However, when the particles thus reduced are fused to be the colloid particles, there are possibly produced some colloid particles made of one metal. Moreover, the respective rates of the metals are possibly different in the obtained alloys. However, in the method, it is not important that all the colloid particles have the same content rates of the metals (the respective rates of silver and indium in each colloid particle, in the above example). What is important is that: a plurality of metals are distributed in the finally obtained film, and the effect by such alloying can be accordingly obtained unlike in the case of using the metal fine particles each made of one metal.

Specific examples of the solvent (organic solvent) used in the preparation of the metallic salt solution in the present embodiment are: toluene; xylene; hexane; 2,2,4-trimethylpentane; and the like. However, the solvent is not particularly limited. Preferably used one as the solvent in the examples is 2,2,4-trimethylpentane because the protective colloid raw material 302, the metallic salts, and the reducing agent 303 (reducing agent solution) are dissolved in 2,2,4-trimethylpentane with ease, and because removal of the 2,2,4-trimethylpentane is easy.

However, each of the protective colloids is liquid, so that the metallic salt solution can be prepared by using only the protective colloid, i.e., can be prepared without using the solvent for dissolving of the metallic salt.

Examples of the metallic salts (metal compounds) used in the present embodiment include: acetic acid silver and acetic acid indium; however, the present embodiment is not limited to these. Examples of silver compounds other than acetic acid silver include: nitric acid silver, perchloric acid silver, benzoic acid silver, formic acid silver, propionic acid silver, and the like. Further, examples of indium compounds other than acetic acid indium include: nitric acid indium, sulfuric acid indium, acetylacetone indium, indium hydroxide, 2-ethyl hexanoic acid. These metallic salts may be solely used, or two or more of them may be used in appropriate combination. In the case of producing the metal fine particles each made of silver, at least one of the exemplified silver compounds is used as the metallic salt. Note that the metallic salts are not limited to the silver compounds and the indium compounds, and are appropriately selected and used in appropriate combination.

The concentration of the metallic salts is so set as to fall within a range from, for example, 15 mmol/L to 500 mmol/L; however, the solvent is not necessarily required as described above. Therefore, the concentration of the metallic salts is not limited to the range.

Note that, as described above, the added amount of the protective colloids (the protective colloid raw material 302) is as large as or larger than the substance amount of the metal, in terms of mol. For example, the added amount of the protective colloid is 15 times larger than the substance amount of the metal.

Further, for example, sodium borohydride can be used as the reducing agent 303. The sodium borohydride is used as, e.g., 2-propanol solution (30 mmol/L); however, the use of the sodium borohydride is not limited to this, and the sodium borohydride can be dissolved in the above-exemplified solvent (organic solvent) such as 2,2,4-trimethylpentane.

The other examples of the reducing agent 303 include: lithium borohydride, hydrazine, triisopropoxy-aluminum, and the like. Such strong reducing agents are suitably used as the reducing agent 303.

The reducing agent 303 is used 1 to 4 times more than the metal fine particles, in terms of equivalent weight.

The reducing agent 303 is dropped at a rate of, e.g., 5 mL per minute to 100 mL per minute. That is, the reducing agent 303 is not added at a time, and the reducing agent 303 is dropped (added) at a predetermined rate, or the reducing agent 303 is dropped a plurality of times and is stirred. By adding the reducing agent 303 in this way, each particle diameter of the metal fine particles to be obtained can be controlled.

Reaction temperature, reaction pressure, reaction time in the above reaction are not particularly limited; however, the reaction can be obtained by, for example, stirring the dropped reducing agent for 1 hour after the dropping of the reducing agent at room temperature under atmospheric air.

Note that, in the reaction solution, an amount of the amine such as octylamine is excessively larger than the amount of the metal fine particles, so that the reaction solution has an approximately 10 pH to 11 pH before the washing.

A way of the washing is not particularly limited; however, the washing can be carried out, for example, in the following manner. That is, the colloid solution containing the reduced colloid particles is concentrated, and then excess of methanol or ethanol is added to the colloid solution, and then the colloid solution is filtered.

Note that the present embodiment teaches the reduction treatment by exemplifying the way of adding the reducing agent 303 to the metallic salt solution; however, in stead of the reducing agent 303, the reducing may be carried out by way of UV (ultraviolet) light, electron ray, heat energy, and the like. That is, the reducing may be carried out by way of any reduction treatment method allowing reduction of the metal ion.

As described above, the present embodiment allows easy formation of a metal film (metal thin film) as follows. That is, the metal fine particles are coated with the protective colloids, and then the metal fine particles thus coated are dispersed in the organic solvent (dispersion medium), and then the application is carried out with respect to the application target, and then the drying treatment or the heating treatment such as a baking treatment is carried out at a temperature of 250° C. to 350° C.

Namely, the treatment such as the baking with respect to the conductive ink composition makes it possible to easily form the wire made from the conductive ink composition. The conductive ink composition was obtained by dispersing the solid material in the organic solvent, and was applied to a surface of a substrate, i.e., to the application target.

Upon baking the solid material in the conductive ink composition, the protective colloids coating the metal fine particles are removed. In other words, the baking of the colloid particles removes the organic material on the surface of the metal fine particle. This causes the metal fine particles to be fused together. As such, the present embodiment allows formation of a metal film having low electric resistance.

Note that a remaining amount of the protective colloids surviving the baking is 5% by mass in the obtained metal film, i.e., the bake film. The composition of the metal film obtained by the baking, e.g., the composition of the silver-indium alloy can be evaluated by carrying out (i) elementary analysis such as EDS (energy dispersion type X ray analysis) analysis and EPMA (X ray micro analyzer) analysis; or (ii) quantitative analysis in accordance with the ICP (inductively coupled plasma) light emission analysis method or the like. Further, the remaining amount of the organic components can be evaluated in accordance with heat analysis such as TG (thermo-gravity analysis).

Examples of the method for applying the conductive ink composition to the application target include the inkjet method, the spin coating method, and the like.

See the following example utilizing the spin coating method for the formation of the metal film. That is, the metal film can be obtained by (i) applying, to a glass substrate in accordance with the spin coating method, the conductive ink composition obtained by dispersing the solid material in the organic solvent (dispersion medium), and then (ii) drying or heating (for example, baking) the conductive ink composition thus applied.

A condition of the spin coating is not particularly limited, but may fall within a range of, for example, 500 rpm to 2000 rpm. For example, spin coating at 1000 rpm for 30 seconds allows formation of a film (conductive ink composition film) that has a film thickness of 2500 Å (250 nm), and that is made from the conductive ink composition. Note that the condition of the spin coating may be appropriately adjusted according to a desired film thickness, and is therefore not particularly limited.

Further, baking pressure exerted on the conductive ink composition, and baking temperature thereof are not particularly limited; however, the baking is normally carried out under atmospheric air at a temperature of 250° C. to 350° C. Further, baking time is not particularly limited, and may be determined appropriately according to (i) a film thickness of the conductive ink composition film, (ii) the baking temperature, and the like.

For example, the baking was carried out, at 300° C. for an hour under atmospheric air, with respect to the conductive ink composition film containing indium at a rate of 1 atomic % (1.06% by mass) with respect to silver. The metal film (bake film) obtained by the baking had a resistance of approximately 10 μΩ·cm.

The surface smoothness of the metal film, i.e., the state of the grain growth can be easily observed with the use of, e.g., a SEM (scan type electronic microscope) having a magnification of, e.g., 10000 to 30000. However, even when such a SEM is not used, the grain growth can be observed with eyes depending on extent of the grain growth. Specifically, when no grain growth occurred, the surface of the film is a "mirror surface". Meanwhile, when the grain growth occurred, the surface of the film looks whitish.

Generally, the noble metal is stable, so that the noble metal has low reactivity to a substrate. For this reason, the noble metal has poor adhesiveness to the substrate. In the sputtering, the effect of striking the particles against substrate allows improvement of the adhesiveness of the noble metal to the substrate. However, in the case of applying the conductive ink composition, such a striking effect cannot be expected, so that the adhesiveness is acquired only by way of affinity with respect to the substrate. Therefore, normally, a metal that easily reacts to oxygen is laminated between the substrate and the noble metal. With this, oxygenic affinity with respect to the substrate, and affinity, caused by metal bond and diffusion, with respect to the noble metal allows the noble metal and the substrate to be tightly adhered to each other.

Conventionally, the silver ink is generally used as the inkjet ink; however, such a conventional silver ink suffers from not only the problem of the aforementioned property of the noble metal, but also a problem that it is difficult for the obtained metal film to be used, as a wire, just the way the metal film is because high temperature baking causes noticeable grain growth.

Therefore, in cases where silver is used as the wire material, a treatment for improving the adhesiveness is required to be rendered to the substrate, or a thin film is required to be formed, on the silver wire, as a protective film for preventing (i) the surface smoothness deterioration due to heat, (ii) film deterioration due to etching gas, and (iii) peel-off of the film. In other words, a plurality of the thin films are provided on the substrate, with the result that the number of steps of manufacturing the circuit substrate is increased. This causes cost increase.

In light of this, the present inventors diligently studied and found that: e.g., alloying of silver with a metal, such as indium, other than a noble metal allows reduction of the grain growth of the silver, with the result that the adhesiveness is improved. With this, a plurality of thin films are not required to be provided on the substrate. This prevents the increase of the steps of manufacturing the circuit substrate, and accordingly prevents the cost increase.

However, the present inventor further studied and found that: the high temperature baking still causes formation of many projections (grain growth) each having (i) diameter of approximately 1000 Å to approximately 5000 Å (approximately 100 nm to approximately 500 nm) and (ii) height of approximately 1000 Å to approximately 5000 Å, even though the use of the aforementioned silver-indium alloy allows improvement of the adhesiveness to the glass substrate and of the surface smoothness under high temperature baking as compared with the case of using the conductive ink composition made of only silver.

In light of this, the present inventors further studied and found that such grain growth, presumably occurring in portions containing larger amount of silver as compared with surroundings, can be restrained by using the protective colloids while restraining the property of the noble metal, i.e., restraining the property of silver by the alloying of the silver in this case. Further, the present inventors found that the use of the protective colloids each made of at least two organic compounds allows improvement of the adhesiveness to the application target as compared with the conventional technique.

The present inventors further found that: such an effect is noticeable especially when silver is used, and the protective colloids allow noticeable restraint of the grain growth.

The present inventor further studied and found that more noticeable restraint of the grain growth can be obtained by further devising each of the protective colloids. As described above, such a specific protective colloid is made from the raw material containing the (A) amine and the (B) carboxylic acid, particularly, is made from the (A) amine and the (B) carboxylic acid containing the low-molecular weight carboxylic acid and the high-molecular weight acid. The use of such a protective colloid allows improvement in the adhesiveness, to the application target, of the region containing a small amount of the added metal in the film made from the conductive ink composition. Such a region refers to, e.g., the region containing a small amount of indium in the silver-indium metal film. Further, even in the case where each of the metal fine particles is made of only a single noble metal, the use of the protective colloids allows improvement of the adhesiveness, and restraint of the grain growth. In other words, the use of such protective colloids solves the problem in the film containing no indium, i.e., the film containing only silver.

FIG. 1 is a diagram using a scanning electronic micrograph (magnification of 30000) illustrating a surface of a metal film obtained by annealing, at a temperature of 300° C. for 1 hour under $N_2$ gas atmosphere, a silver-indium ink film using protective colloids (see Example 2 below; protective colloids each made of hexanoic acid, naphthenic acid, and octylamine). Note that the rate of indium was set at 1 atomic % with respect to silver in the silver-indium ink film. Note also that, used as the scanning electronic microscope is "S-4100 (product name)" SEM (scan type electronic microscope) provided by Hitachi High-Technologies Corporation. Note that 1 atomic % of indium (In) in the silver-indium alloy (AgIn) is equivalent to 1.06% by mass of indium (In).

Figure 25:
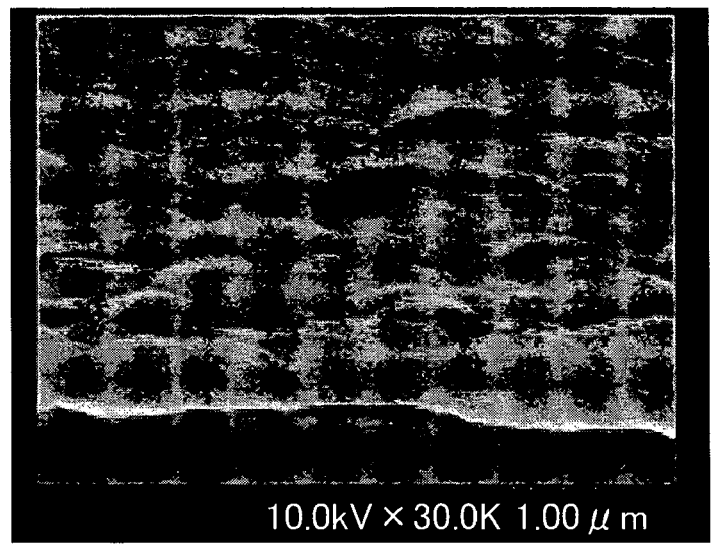
FIG. 25 is a diagram using a scanning electronic micrograph (magnification of 30000) illustrating a surface of a deposition film that is made of only silver, and that is obtained by carrying out a heat annealing treatment for 1.5 hours at a temperature of 300° C. under $N_2$ gas atmosphere.

For the purpose of comparison, FIG. 25 is a diagram using a scanning electronic micrograph (magnification of 30000) illustrating a surface of a deposition film (hereinafter, referred to as "silver only" deposition film) made of only silver, the silver only deposition film being obtained by carrying out a heat annealing treatment at a temperature of 300° C. for 1.5 hours under $N_2$ gas atmosphere. Note that the formation of the silver only deposition film is carried out in accordance with the deposition method by using the "high-vacuum evaporation apparatus EBX-10D (product name)" (an electronic beam deposition apparatus provided by ULVAC, Inc (ex-ULVAC Japan Ltd).

Figure 26:
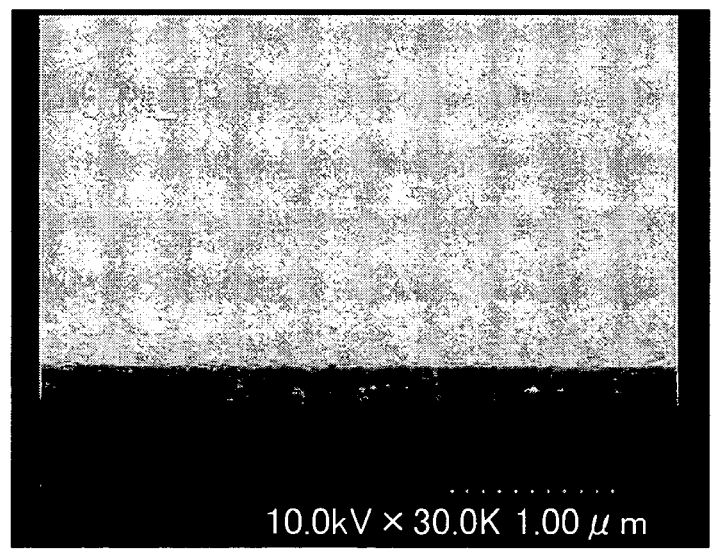
FIG. 26 is a diagram using a scaning electronic micrograph (magnification of 30000) illustrating a surface of a silver-indium deposition film obtained by carrying out a heat annealing treatment for 1.5 hours at a temperature of 300° C. under $N_2$ gas atmosphere.

Further, FIG. 26 is a diagram using a scanning electronic micrograph (magnification of 30000) illustrating a surface of a silver-indium film that contains indium at a rate of 3.0% by mass, and that is obtained by carrying out a heat annealing at a temperature of 300° C. for 1.5 hours under $N_2$ gas atmosphere.

Figure 27:
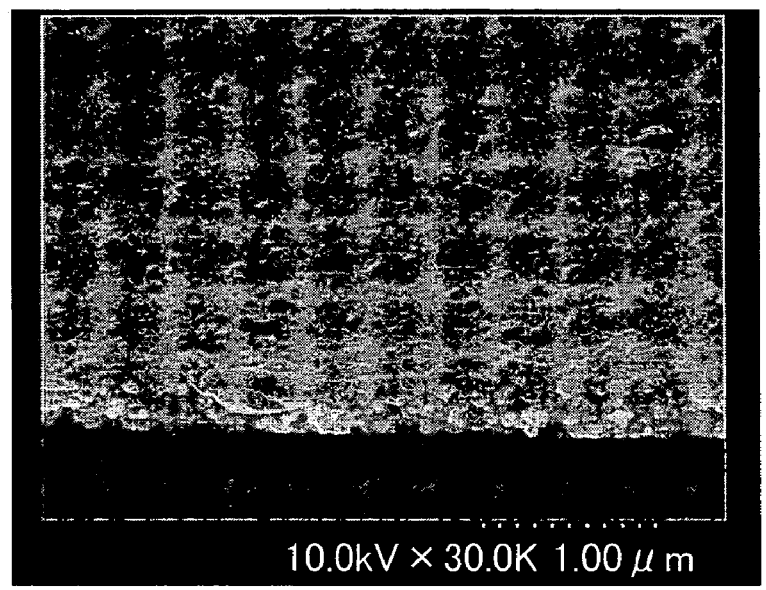
FIG. 27 is a diagram using a scanning electronic micrograph (magnification of 30000) illustrating a surface of a silver-indium ink film using a protective colloid made of naphthenic acid and octylamine, the silver-indium ink film being obtained by way of annealing carried out for 1 hour at a temperature of 300° C. under $N_2$ gas atmosphere.

FIG. 27 is a diagram using a scanning electronic micrograph (magnification of 30000) illustrating a surface of a metal film obtained by annealing, at a temperature of 300° C. for 1 hour under $N_2$ gas atmosphere, a silver-indium ink film using protective colloids described in Example 6. Each of the protective colloids is made from octylamine, and the same naphthenic acid as the naphtenic acid used for the protective colloids shown in FIG. 1.

Figure 32:
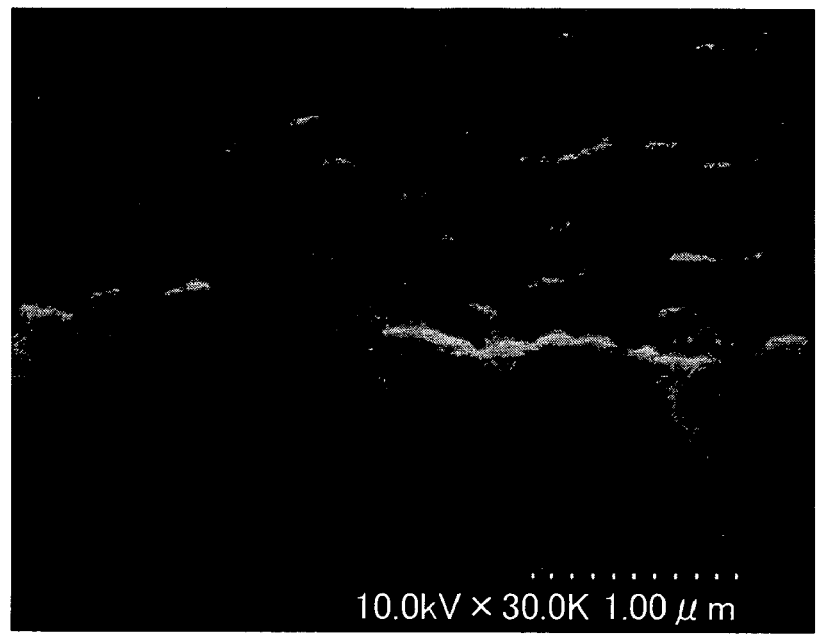
FIG. 32 is a diagram using a scanning electronic micrograph (magnification of 30000) illustrating a surface of a silver ink film using a protective colloid made of octylamine, the silver ink film being obtained by way of annealing carried out for 30 minutes at a temperature of 300° C. under $N_2$ gas atmosphere.
Figure 33:
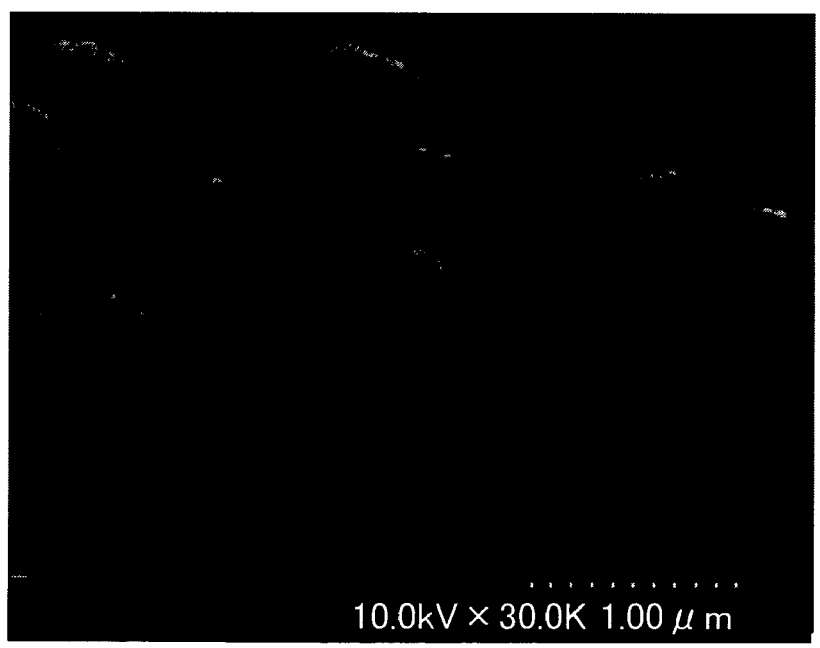
FIG. 33 is a diagram using a scanning electronic micrograph (magnification of 30000) illustrating a surface of a silver ink film using a protective colloid made of naphthenic acid and octylamine, the silver ink film being obtained by annealing carried out for 30 minutes at a temperature of 300° C. under $N_2$ gas atmosphere.

Further, for the purpose of comparison, FIG. 32 is a diagram using a scanning electronic micrograph (magnification of 30000) illustrating a surface of a metal film obtained by annealing, at a temperature of 300° C. for 30 minutes under $N_2$ gas atmosphere, a silver ink film using protective colloids each made from octylamine. Further, FIG. 33 is a diagram using a scanning electronic micrograph (magnification of 30000) illustrating a surface of a metal film obtained by annealing, at a temperature of 300° C. for 30 minutes under $N_2$ gas atmosphere, a silver ink film using protective colloids each made from naphthenic acid and octylamine.

Note that specific manufacturing conditions other than the above conditions, and specific manufacturing methods are in accordance with conditions and methods described in explanation below and Examples below. Further, in order to form the above ink films, the application operations of the conductive ink composition are respectively carried out under the same condition, with respect to the substrates, i.e., with respect to the application targets.

As shown in FIG. 32, it is observed that the annealing causes fusion and growth of silver nanoparticles of the silver conductive ink composition applied to the substrate, i.e., the application target. With this, the silver nanoparticles are spread in a "network" manner. The silver conductive ink composition is for the sake of comparison, and uses the metal fine particles each only made of silver, and uses the protective colloids each made from only one organic compound.

Further, large vacant holes are observed in a surface and a cross sectional surface of the ink film made from the silver conductive ink composition using the. protective colloids each made from only one organic compound. Further, the surface is significantly rough, and the surface allows light to pass therethrough. Namely, the reflective efficiency is bad. The vacant holes are considered as the reason why the light passes through the ink film made from the silver conductive ink composition using the protective colloids each made from only one organic compound.

As described above, the ink film shown in FIG. 32 has the significantly rough film surface. All over the film surface, there is formed the irregularity caused by the silver grain growth and the fusion. This greatly reduces the adhesiveness to the substrate.

Further, the ink film shown in FIG. 32 has a thicker film thickness than the respective ink films shown in FIG. 27 and FIG. 1. It is considered that this is because the ink film shown in FIG. 32 has the considerable number of vacant holes.

See FIG. 33. As is the case with the ink film shown in FIG. 32, the annealing of only 30 minutes also causes noticeable silver grain growth (height of each particle is 500 nm or greater) of the silver conductive ink composition which was applied to the substrate, i.e., the application target, and which uses (i) the metal fine particles each only consisting of silver, and (ii) the protective colloids made from naphthenic acid and octylamine. Therefore, the obtained ink film has a significantly irregular film thickness. Specifically, although the silver grain growth causes the ink film shown in FIG. 33 to have a particle height of 500 nm or greater, a film thickness of the ink film under each of the particles is so thin as to be approximately 100 nm. It is considered that such a thin film thickness is obtained in the region free from the grain growth because the silver grain growth absorbs circumferential silver. Further, there are small holes in a surface and a cross sectional surface of the ink film shown in FIG. 33.

For the sake of checking an effect of the addition of indium, a comparison is firstly made between the deposition film shown in FIG. 25 and the deposition film shown in FIG. 26. The comparison clarifies that the addition of indium allows improvement of the surface of the film as shown in FIG. 26, while the surface of the film made of only silver is rough.

Next, a comparison is made between (i) the silver ink film (see FIG. 33) that uses the metal fine particles each made of only silver and that uses the protective colloids each made from naphthenic acid and octylamine, and (ii) the silver-indium ink film (see FIG. 27) that contains indium at a rate of 1 atomic % with respect to silver, and that uses the protective colloids each made from naphthenic acid and octylamine. The comparison clarifies that, in the silver-indium ink film, the addition of indium allows restraint of the silver grain growth. Specifically, a size of each particle is apparently smaller than the size of each metal fine particle made of only silver. Moreover, there are no small holes in the silver-indium ink, unlike in the ink film shown in FIG. 33. Note that, also in the ink film shown in FIG. 1, a size of each particle is apparently smaller than the size of each metal fine particle made of only silver. Moreover, there are no small holes in the silver-indium ink, unlike in the ink film shown in FIG. 33.

Further, a comparison is made among (i) the silver ink film (see FIG. 32) using the protective colloids each only made from one organic compound, and (ii) the ink films respectively shown in FIG. 1 and FIG. 27. As shown in FIG. 1 and FIG. 27, the use of the conductive ink composition according to the present embodiment allows considerable restraint of the metal grain growth, and accordingly allows great improvement in the surface smoothness of the obtained ink film. Further, the film detachment (film peel-off) shown in FIG. 32 can be prevented by restraining the metal grain growth as shown in FIG. 1 and FIG. 27 by using the conductive ink composition according to the present embodiment. This indicates that the use of the conductive ink composition allows great improvement in the adhesiveness of the obtained ink film to the substrate, as compared with the conventional technique.

Further, as shown in FIG. 1 and FIG. 27, the use of the conductive ink composition according to the present embodiment allows prevention of the formation of the vacant holes (see FIG. 32), which formation is due to the metal grain growth and the fusion. This makes it possible to prevent light to pass through the ink film, the passing being caused by the vacant holes. With this, the reflective efficiency can be improved as compared with the conventional technique.

Further, although the addition of indium, and the protective colloids allow improvement of the rough film surface of the silver-indium ink film shown in FIG. 27, the grain growth is still observed in the silver-indium ink film. However, as shown in FIG. 1, the selection of the protective colloids allows notable restraint of the grain growth.

These results clarify that the surface smoothness (flatness) is excellent in the metal film obtained by drying or heating (e.g., baking) the conductive ink composition according to the present embodiment, particularly, the conductive ink composition using the protective colloids having the aforementioned molecular weight distribution. Therefore, even when such a metal film is provided under a device, such as a TFT, which is easily affected by the surface condition and the surface roughness of the lower portion wire (lower side wire), the metal film gives no adverse effect to the device. In other words, the use of the metal film as the lower portion wire (lower side wire) allows reduction of leakage defect etc., which is due to (i) the discontinuity of the upper portion wire (upper side wire) in the cross portion (overlap portion) of the wires, and/or (ii) the film discontinuity, in the cross portion, of the insulating film provided between the lower portion wire and the upper portion wire.

As such, the applied wire having a good surface and low electric resistance can be formed by using, as the ink serving as the wire material, the conductive ink composition using the protective colloids.

The conductive ink composition can be used suitably for (i) a wire in an FPD (flat panel display); particularly, (ii) a cross portion (overlap portion) of wires; and (iii) an electrode serving as a lower layer of the device, such as a TFT, which is easily affected by the surface roughness.

The wire made from the conductive ink composition can be formed by, e.g., performing the following steps (1) to (4).

(1) Firstly, a pattern is formed on a substrate with the use of a bank (division wall). Specifically, a resist is provided on the substrate by carrying out spin-coating, and then the resist is pre-baked, and then pattern exposure, development, and post-baking are carried out.

Note that wire width and height of the bank in the pattern are not particularly limited; however, the wire width may be 30 μm, and the height of the bank may be 2 μm.

(2) Next, the substrate having the formed pattern is subjected to a plasma treatment under, e.g., $CF_4$ gas atmosphere. With this, a surface of the bank is subjected to a fluoric treatment, and the organic material on the substrate is decomposed and removed.

(3) Thereafter, the conductive ink composition is applied to the wire pattern surrounded by the bank, with the use of an inkjet apparatus. Note that a size of a droplet jetted by the inkjet apparatus is not particularly limited, but may be 6 pl or so.

(4) After applying the conductive ink composition to all over the wire pattern, the substrate is baked at a temperature of, e.g., 300° C. such that the conductive ink composition is metalliized.

The following specifically explains further details of the formation of the wire.

Figure 3:
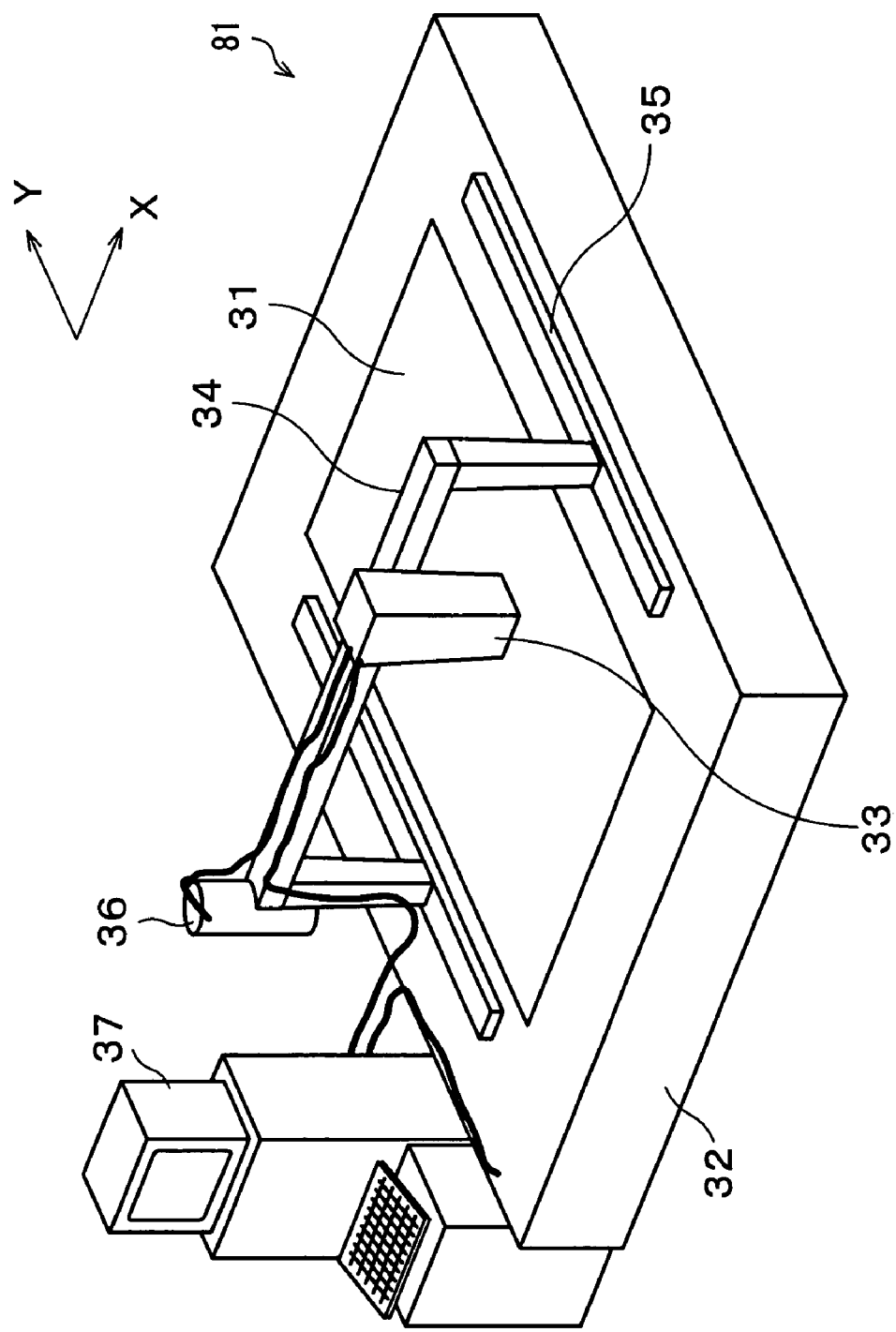
FIG. 3 is a block diagram illustrating an example of a pattern forming apparatus for manufacturing a circuit substrate according to the present invention.

Suitably used for the manufacture of the circuit substrate according to the present embodiment, i.e., suitably used for the pattern formation on the circuit substrate is an inkjet apparatus (pattern forming apparatus) for discharging or dropping a wire material, an electrode material, or the like in accordance with the "inkjet method (droplet discharging method)". FIG. 3 schematically illustrates a structure of the pattern forming apparatus.

Such a pattern forming apparatus 81 shown in FIG. 3 includes: (i) a setting table 32 for mounting a substrate thereon; (ii) an inkjet head 33 serving as a droplet supplying apparatus (droplet discharging means); (iii) an X direction driving section 34 for moving the inkjet head 33 in an X direction shown in FIG. 3; and (iv) a Y direction driving section 35 for moving the inkjet head 33 in a Y direction. The inkjet head 33 discharges, to the substrate 31 on the setting table 32, the conductive ink composition according to the present embodiment, in the form of a flowable droplet containing a wire material or an electrode material.

Further, the pattern forming apparatus 81 is provided with (i) an ink supplying system 36 for supplying, to the inkjet head 33, the conductive ink composition (ink) according to the present embodiment as the flowable wire material; and (ii) a control unit 37 for carrying out various types of control such as control over the discharging from the inkjet head 33, and control over the driving of the X direction driving section 34 and the Y direction driving section 35. The control unit 37 sends application location information to the X direction driving section 34 and the Y direction driving section 35, and sends discharging information to a head driver (not shown) of the inkjet head 33. With this, the inkjet head 33 operates in synchronism with the X direction driving section 34 and the Y direction driving section 35 such that a desired amount of the droplet (conductive ink composition) is supplied to a target location on the substrate 31.

The inkjet head 33 may be a piezo-type inkjet head using a piezo-actuator, or a bubble type inkjet head having a heater, or another type inkjet head. A discharge amount of the ink from the inkjet head 33 can be controlled by using an inkjet head most suitably designed according to a desired discharge amount of the ink. Alternatively, the discharge amount can be controlled by merely changing a diameter of a discharging nozzle hole of the inkjet head 33. Instead of the inkjet head 33, any droplet supplying apparatus capable of supplying a droplet can be used as the droplet supplying apparatus. A specific example of such a droplet supplying apparatus is an apparatus for merely dropping a droplet.

Further, the pattern forming apparatus 81 may be such a pattern forming apparatus that uses (i) a region lyophilic with respect to the wire material and (ii) a region lyophobic with respect to the wire material such that a predetermined pattern is formed by application, dipping, or the like. The lyophilic region and the lyophobic region are formed in advance on the substrate 31.

The conductive ink composition according to the present embodiment is suitably used as the formation material of, e.g., the wire in the circuit substrate, which wire requires the surface smoothness. Such a circuit substrate is suitably used for an electronic apparatus such as a display apparatus.

The following explains the circuit substrate and the electronic apparatus, each of which is according to the present embodiment, with reference to FIG. 4 to FIG. 7(a) and FIG. 7(b).

Note that the explanation below exemplifies a TFT array substrate as the circuit substrate according to the present embodiment, and exemplifies, as the electronic apparatus according to the present embodiment, a liquid crystal display apparatus using the TFT array substrate. However, the present invention is not limited to these.

Figure 4:
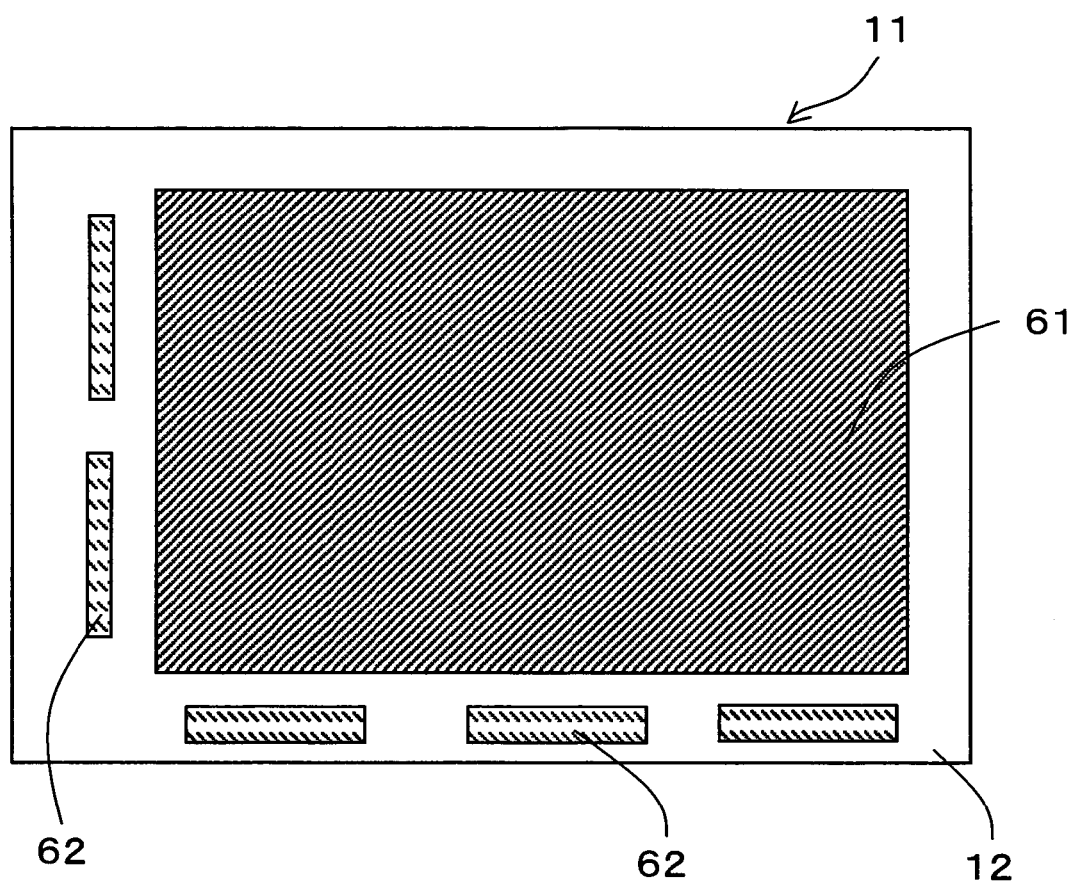
FIG. 4 is a plan view schematically illustrating a structure of a TFT array substrate in a liquid crystal display apparatus according to one embodiment of the present invention.
Figure 5:
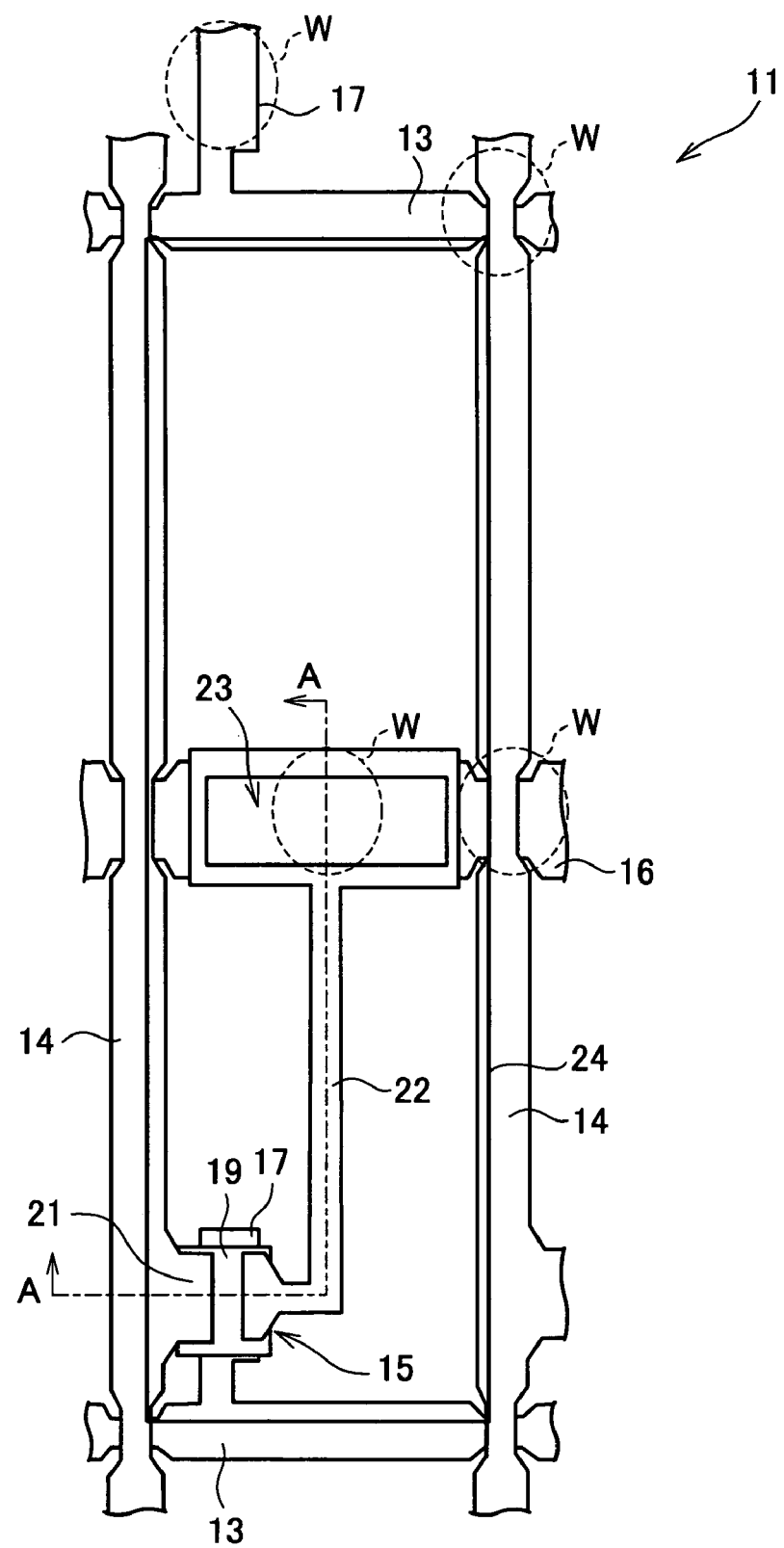
FIG. 5 is a plan view schematically illustrating a structure of a pixel in the TFT array substrate shown in FIG. 4.
Figure 6:
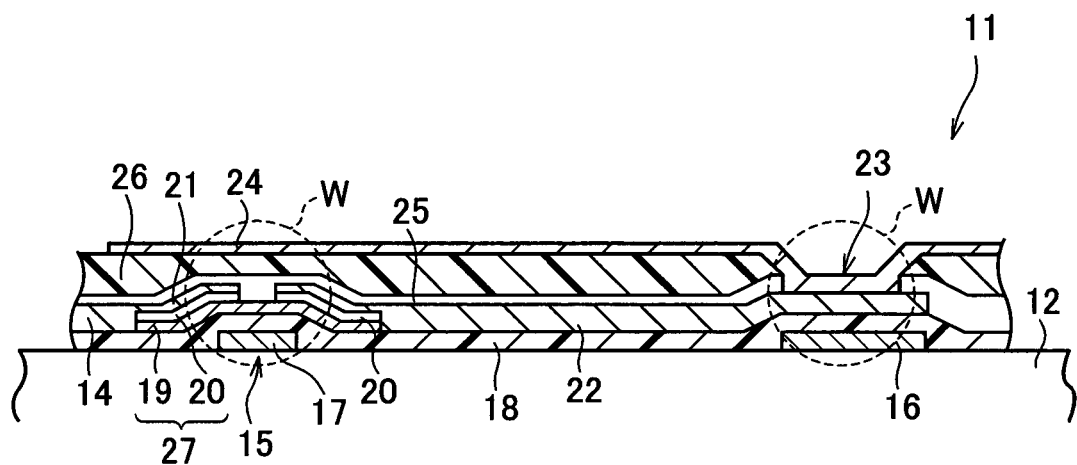
FIG. 6 is a cross sectional view taken along line A-A in FIG. 5 showing the TFT array substrate.
Figure 7A:
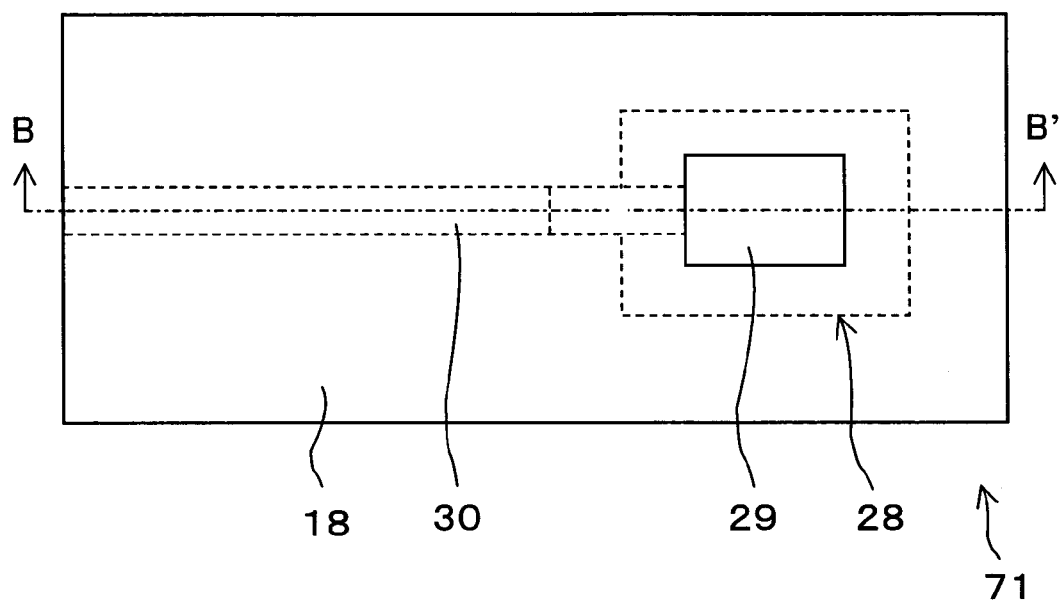
FIG. 7(a) is a plan view schematically illustrating a structure of one terminal portion of the TFT array substrate shown in FIG. 4.
Figure 7B:
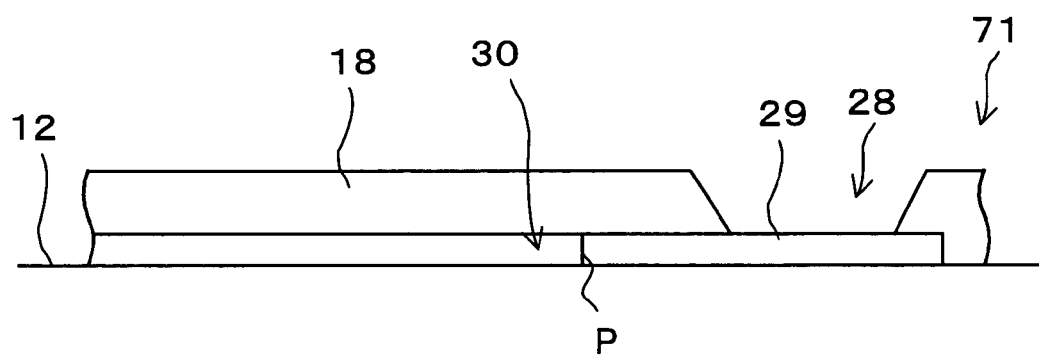
FIG. 7(b) is a cross sectional view taken along line B-B in FIG. 7(a) showing the terminal portion.

FIG. 4 is a plan view schematically illustrating a TFT array substrate in the liquid crystal display apparatus according to the present embodiment. FIG. 5 is a plan view schematically illustrating a structure of a pixel in the TFT array substrate shown in FIG. 4. FIG. 6 is a cross sectional view taken along line A-A in FIG. 5 showing the TFT array substrate. FIG. 7(a) is a plan view schematically illustrating a structure of one terminal portion in the TFT array substrate shown in FIG. 4. FIG. 7(b) is a cross sectional view taken along line B-B in FIG. 7(a) showing the terminal portion.

As shown in FIG. 4, such a TFT array substrate 11 according to the present embodiment has the following structure. That is, a pixel formation region 61 having a plurality of pixels (one of which is shown in FIG. 5) is provided on a glass substrate 12. Around the pixel formation region 61, there are provided a plurality of terminal portion formation regions 62 each having a plurality of terminal portions 28 shown in FIG. 7(a) and FIG. 7(b).

As shown in FIG. 5 and FIG. 6, in the TFT array substrate 11 according to the present embodiment, gate wires 13 and source wires 14 are formed in a matrix manner on the glass substrate (insulating substrate) 12. In the vicinity of an intersectional portion of each gate wire 13 and each source wire 14, a TFT 15 serving as a switching device is provided. Between adjacent gate wires 13, a storage capacitor wire 16 is provided.

As shown in FIG. 6, there are provided, on the glass substrate 12, the storage capacitor wire 16 and a gate electrode 17 extending from the gate wire 13. Further, a gate insulating layer 18 is so formed as to cover the gate electrode 17 and the storage capacitor wire 16.

Above the gate electrode 17 with the gate insulating layer 18 therebetween, a semiconductor layer 27, a source electrode 21, and a drain electrode wire 22 are provided. The semiconductor layer 27 includes an amorphous silicon layer 19 and an n+ type silicon layer 20. With this, the TFT 15 is formed. Here, the source electrode 21 extends from the source wire 14.

Further, the drain electrode wire 22 extends from the TFT 15 to a contact hole 23, and serves as a drain electrode of the TFT 15, and electrically connects the TFT 15 to a pixel electrode 24, and forms an electric capacitor together with the storage capacitor wire 16 in the contact hole 23. Further, on the drain electrode wire 22, a protective layer 25, an interlayer insulating layer 26, and the pixel electrode 24 are formed in this order. The protective layer 25 covers the TFT 15, and the interlayer insulating layer 26 is for leveling or the like, and the pixel electrode 24 applies a voltage to a liquid crystal or the like.

Further, as shown in FIG. 7(a) and FIG. 7(b), each terminal portion 28 is arranged such that: a terminal wire 30 and a terminal electrode 29 are provided on the glass substrate 12, and the gate insulating 18 is provided on the terminal wire 30 and the terminal electrode 29. Namely, the terminal portion 28 is arranged such that the terminal wire 30 and a part of the terminal electrode 29 are covered with the gate insulating layer 18. The terminal portion 28 serves as a connecting portion for electrically connecting the TFT array substrate 11 to an external circuit substrate, a driver IC, and the like. The terminal electrode 29 is provided so as to improve the electric connection with the external circuit substrate, the driving IC, and the like. The terminal wire 30 is connected to the gate wire 13, the source wire 14, and the like in the pixel formation region 61.

Note that, in the present embodiment, the terminal wire 30 and the terminal electrode 29 are each formed on the glass substrate 12, and are each made of a silver-indium alloy, which is a silver alloy material having an identical composition. However, content rate of indium with respect to silver in the terminal wire 30 is different from content rate of indium with respect to silver in the terminal electrode 29. Here, the content rate of indium with respect to silver in the terminal wire 30 is so adjusted as to be smaller than the content rate of indium with respect to silver in the terminal electrode 29.

Next, the following explains a method for manufacturing the TFT array substrate 11 according to the present embodiment with the use of the conductive ink composition, with reference to FIG. 3 to FIG. 24.

Figure 8:
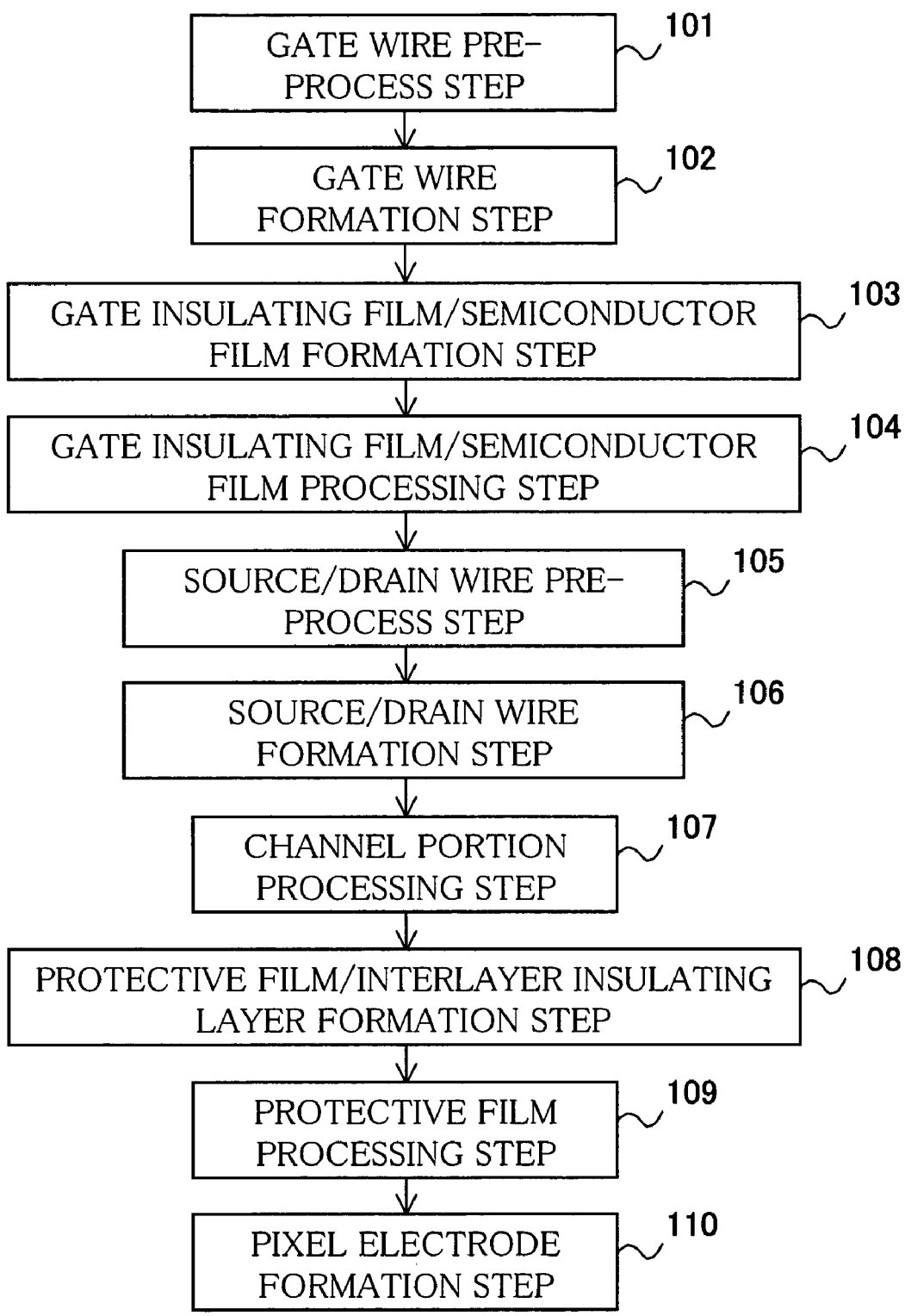
FIG. 8 is a process chart illustrating steps of manufacturing the TFT array substrate of the liquid crystal display apparatus according to one embodiment of the present invention.

As shown in FIG. 8, in the present embodiment, the TFT array substrate 11 is manufactured by performing a gate wire pre-process step 101, a gate wire formation step 102, a gate insulating film/semiconductor film formation step 103, a gate insulating film/semiconductor film processing step 104, a source/drain wire pre-process step 105, a source/drain wire formation step 106, a channel portion processing step 107, a protective film/interlayer insulating layer formation step 108, a protective film processing step 109, and a pixel electrode formation step 110.

(The Gate Wire Pre-process Step 101)

Figure 9A:
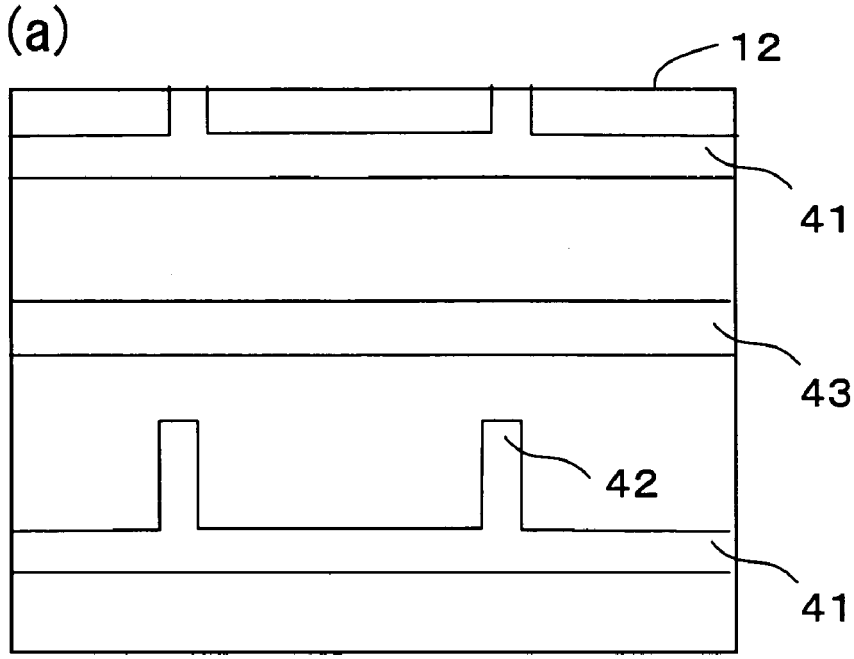
FIG. 9(a) is a plan view schematically illustrating the TFT array substrate having been through a gate wire pre-process step.
Figure 10A:
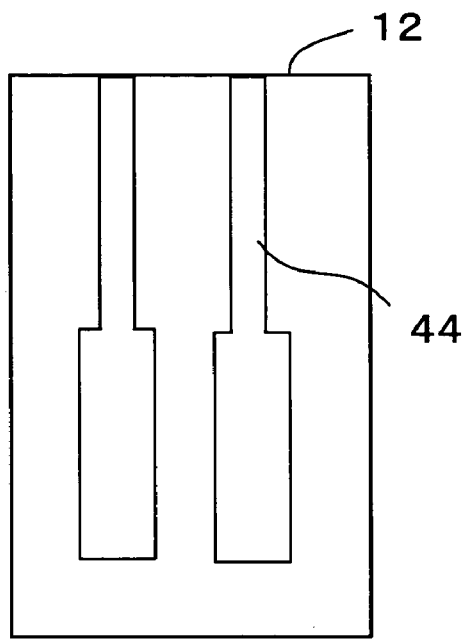
FIG. 10(a) is a plan view schematically illustrating a structure of the terminal portion of the TFT array substrate having been through the gate wire pre-process step.

In the gate wire pre-process step 101, the pattern forming apparatus 81 shown in FIG. 3 is used to carry out the pre-process of forming the gate wire 13, the gate electrode 17, and the storage capacitor wire 16, and the like. FIG. 9(a) and FIG. 10(a) are plan views respectively illustrating the pixel portion and the terminal portion of the TFT array substrate 11 having been through the gate wire pre-process step 101. Specifically, FIG. 9(a) is a plan view illustrating the pixel formation region 61 (pixel portion) on the glass substrate 12 shown in FIG. 4. FIG. 10(a) is a plan view illustrating the terminal portion formation region 62 (terminal portion).

In the gate wire pre-process step 101, a pre-process step for forming a desired wire pattern is carried out in such a manner that a flowable wire material discharged (dropped) by the pattern forming apparatus 81 is applied to a desired region.

Mainly, there are two methods for the pre-process.

A first method is to carry out patterning by way of a hydrophilic/hydrophobic treatment (lyophilic/lyophobic treatment) such that the hydrophilic region (lyophilic region) corresponds to (i) a gate wire formation region 41 for forming the gate wire 13, (ii) a gate electrode formation region 42 for forming the gate electrode 17, (iii) a storage capacitor wire formation region 43 for forming the storage capacitor wire 16, and (iv) a terminal wire formation region 44 for forming the terminal wire 30 and the terminal electrode 29 (terminal portion 28); and such that the hydrophobic region (lyophobic region) corresponds to a no-wire formation region corresponding to a region other than the above regions.

A second method is to form a guide (division wall) for regulating liquid flow in such a manner that the guide extends along the gate wire formation region 41, the gate electrode formation region 42, the storage capacitor wire formation region 43, and the terminal wire formation region 44.

A typical example of the first method is a photocatalytic hydrophilic/hydrophobic (lyophilic/lyophobic) process using titanium dioxide. On the other hand, a typical example of the second method is a method of forming a guide by carrying out photolithography with respect to a resist material. For the sake of rendering hydrophilic (lyophilic) property and hydrophobic (lyophobic) property to the guide or a surface of the substrate, the guide or the substrate is possibly exposed in a plasma atmosphere obtained by introducing $CF_4$ gas and $O_2$ gas. The resist used here is detached after the wire formation.

Carried out as the pre-process in the present embodiment is the photocatalytic process using titanium dioxide. Specifically, a mixture of fluorochemical nonionic surfactant "ZONYL FSN" (product name; provided by Du Pont) and isopropyl alcohol was applied to the glass substrate 12 of the TFT array substrate 11. Further, on a mask for the gate wire pattern, a photocatalytic layer is formed by applying, by way of the spin coating, a dispersion obtained by dispersing titanium dioxide fine particles in ethanol. Then, baking was carried out at a temperature of 150° C. Thereafter, exposure (UV exposure) using the mask was carried out with respect to the glass substrate 12. The exposure was carried out in such a manner that UV light having a wavelength of 365 nm is irradiated to the glass substrate 12 for 2 minutes at an intensity of 70 mW/cm$^2$.

Here, the following explains how the hydrophilic (lyophilic) region and the hydrophobic (lyophobic) region are formed by using titanium dioxide, with reference to FIG. 11(a) to FIG. 11(d).

FIG. 11(a) illustrates the TFT array substrate 11 in which a first film 2 is formed on a glass substrate 1 by applying, to the glass substrate 1 in accordance with the spin coating method, the mixture of fluorochemical nonionic surfactant "ZONYL FSN" (product name; provided by Du Pont) and isopropyl alcohol.

FIG. 11(b) illustrates the UV exposure via a mask 4 for the gate wire pattern, the mask 4 being provided on the transparent glass substrate 3. A dispersion obtained by dispersing the titanium dioxide fine particles in ethanol is applied to a pattern surface of the mask 4 such that a photocatalytic layer 5 is formed, and a heating treatment is carried out thereto at a temperature of 150° C.

The exposure carried out under the above condition allows improvement of a wettability only in a portion 6 having been subjected to the UV exposure. With this, the hydrophilic (lyophilic) pattern is formed as shown in FIG. 11(c) and FIG. 11(d).

(The Gate Wire Formation Step 102)

Next, the following explains the gate wire formation step 102, with reference to FIG. 9(b), FIG. 9(c), FIG. 10(b), and FIG. 10(c).

Figure 9B:
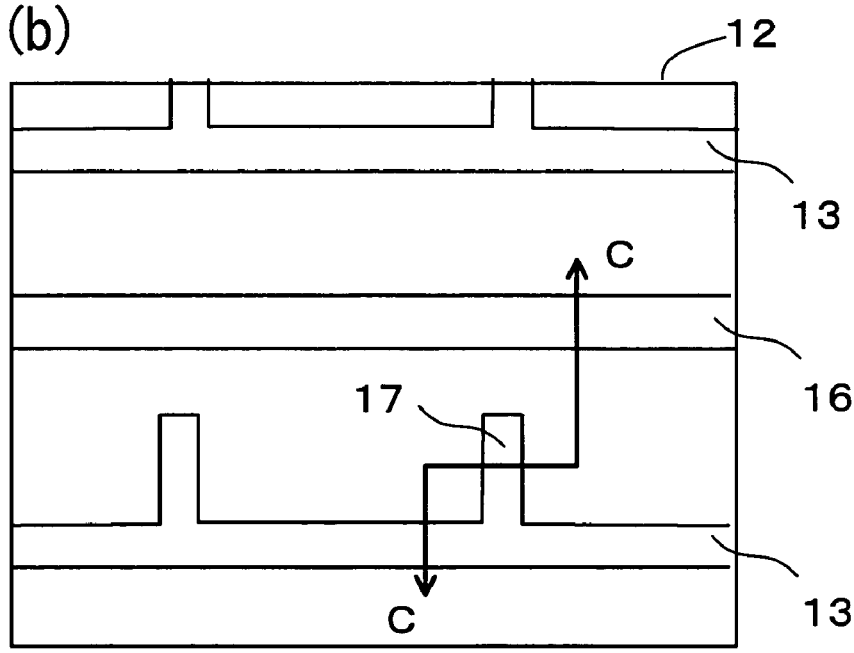
FIG. 9(b) is a plan view illustrating a pixel portion after the gate wire pre-process step.
Figure 9C:
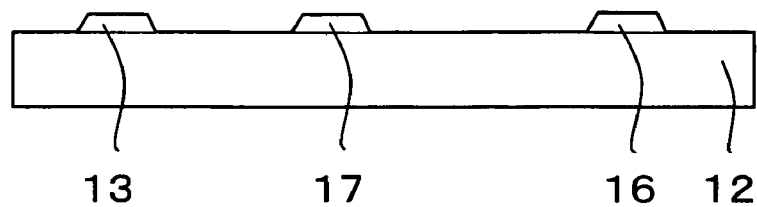
FIG. 9(c) is a cross sectional view taken along line C-C in FIG. 9(b).
Figure 10B:
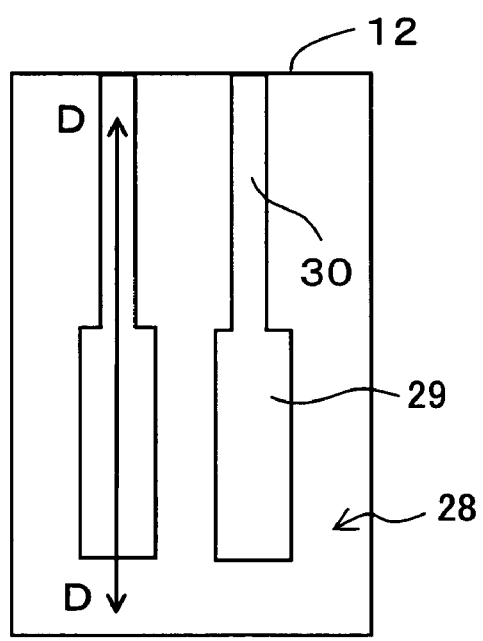
FIG. 10(b) is a schematic plan view respectively illustrating the terminal portion after the gate wire formation step.
Figure 10C:
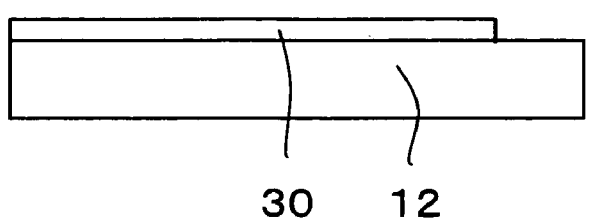
FIG. 10(c) is a cross sectional view taken along line D-D in FIG. 10(b).
Figure 11:
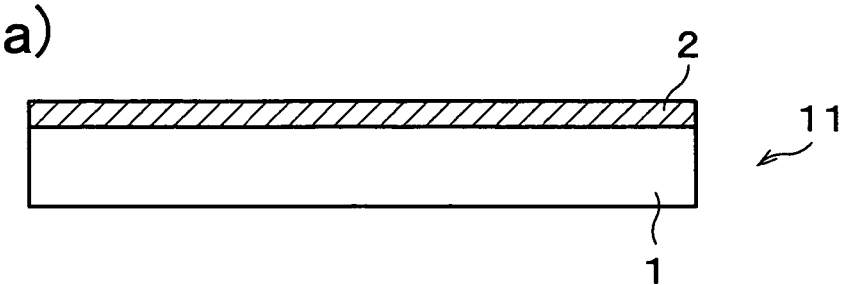
FIG. 11(a) to FIG. 11(d) are diagrams illustrating the steps of forming a hydrophilic (lyophilic) region and a hydrophobic (lyophobic) region, in the gate wire pre-process step.
Figure 11:
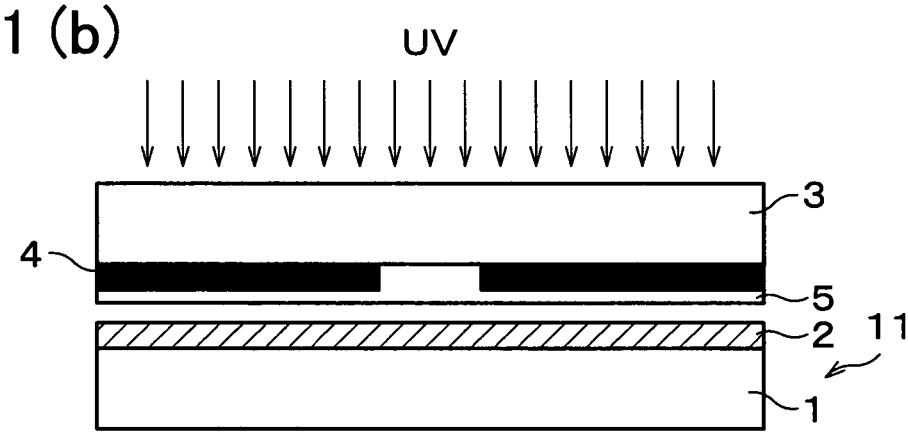
Figure 11:
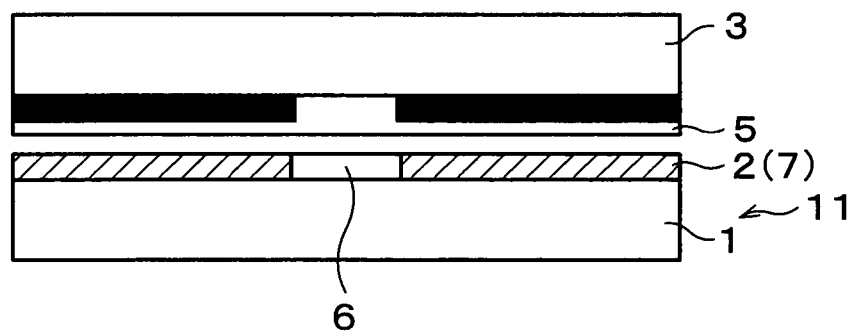
Figure 11:
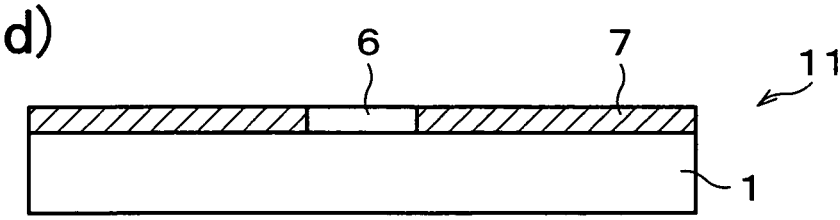

FIG. 9(b), FIG. 9(c), FIG. 10(b), and FIG. 10(c) are plan views illustrating the glass substrate 12 having been through the gate wire formation step 102. Specifically, FIG. 9(b) is a plan view illustrating the pixel formation region 61 (pixel portion) of the glass substrate 12 shown in FIG. 4. FIG. 10(b) is a plan view illustrating the terminal portion formation region 62 (terminal portion). FIG. 9(c) is a cross sectional view taken along line C-C in FIG. 9(b), and FIG. 10(c) is a cross sectional view taken along line D-D in FIG. 10(b).

In the gate wire formation step 102, the pattern forming apparatus 81 is used so as to apply the conductive ink composition according to the present embodiment, to the hydrophilic region (lyophilic region) of the glass substrate 12 (see FIG. 9(a) and FIG. 10(a)) serving as the aforementioned substrate 31. This allows formation of the wires such as the gate wire 13, the gate electrode 17, the storage capacitor wire 16, the terminal wire 30, as shown in FIG. 9(b), FIG. 9(c), FIG. 10(b), and FIG. 10(c). The conductive ink composition is applied as the flowable wire material. The hydrophilic region (lyophilic region) refers to the region corresponding to the gate wire formation region 41, the gate electrode formation region 42, the storage capacitor wire formation region 43, the terminal wire formation region 44, and the like.

Adopted as the wire material is the conductive ink composition according to the present embodiment, which conductive ink composition is obtained by, e.g., dispersing, in the organic solvent, the silver-indium alloy particles covered with the aforementioned protective colloids (i.e., the protective colloids described in Example 2 below). Note that, in the present embodiment, the rate of indium is appropriately adjusted at approximately 5 atomic % or less with respect to silver in the conductive ink composition. A wire width is set at substantially 50 μm, and a discharging amount of the conductive ink composition is set at 5 pl.

The respective rates of silver and indium in the discharged conductive ink composition are adjusted as follows in consideration of dry etching operations to be carried out in the gate insulating film/semiconductor film processing step 104, the channel portion processing step 107, and the protective film processing step 109. That is, the rate of indium with respect to silver is adjusted at 5 atomic % in a portion to be exposed to the plasma in the steps. Whereas, in consideration that the gate wire 13 is required to have low electric resistance, the rate of indium with respect to silver is adjusted at 1% atom in a portion not to be directly exposed to the plasma, i.e., in a portion covered with the gate insulating layer 18 and the protective layer 25.

This is done in consideration of the following reasons (1) to (3): (1) an increase of indium causes an increase of the resistance against the plasma; (2) a surface of the gate wire 13 should not be deteriorated by the crystal growth etc., even though 300° C. heat application is to be carried out with respect to the gate wire 13 in the insulating film/semiconductor film formation step 103 coming after this; (3) the gate wire 13 is required to have low electric resistance minimizing the response property difference because the resistance of the gate wire 13 causes delay of a signal applied to the gate wire 13 for only several microseconds, and response properties are accordingly different between a TFT 15 provided in the vicinity of the driver IC and a TFT 15 provided far from the driver IC.

Note that the aforementioned rates can be appropriately selected according to a manufacture process, a desired property of the TFT array substrate 11, and the like.

On the surface having been through the hydrophilic process (lyophilic process), the flowable wire material discharged from the inkjet head 33 spreads along the gate wire formation region 41, so that the application of the flowable wire material is carried out at intervals of 10 μm to 100 μm. After the application, baking is carried out for 1 hour at a temperature of 300° C. This allows formation of the gate wire 13, the gate electrode 17, the storage capacitor wire 16, and the terminal wire 30, each of which is made of silver and indium.

Here, the gate wire 13, the gate electrode 17, the storage capacitor wire 16, and the terminal wire 30 are made from the above flowable wire material, i.e., from the conductive ink composition according to the present embodiment. With this, there occurs no grain growth observed in the conventional similar wire material. That is, when using such a conventional flowable silver wire material, the grain growth occurs due to the baking, so that the top-bottom leakage causing the defect occurs with ease.

Note that the baking temperature is 300° C. because the heat application of approximately 300° C. will be carried out in the gate insulating film/semiconductor film formation step 103 coming after this step. Therefore, the baking temperature is not limited to this temperature.

Figure 12B:
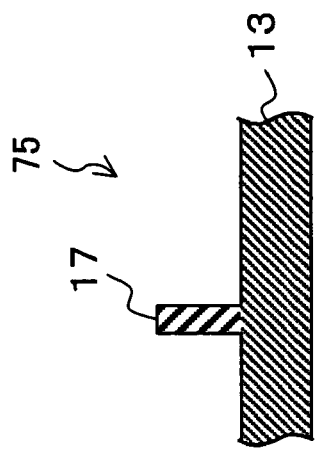
FIG. 12(b) is a block diagram schematically illustrating a structure of a gate electrode portion of the gate wire shown in FIG. 12(a).
Figure 12C:
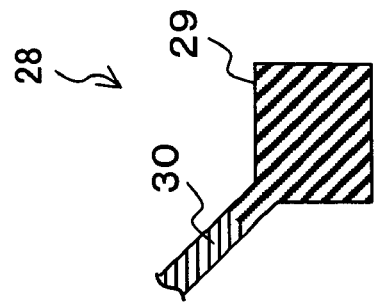
FIG. 12(c) is a block diagram schematically illustrating a structure of a terminal electrode portion of the gate wire shown in FIG. 12(a).
Figure 12A:
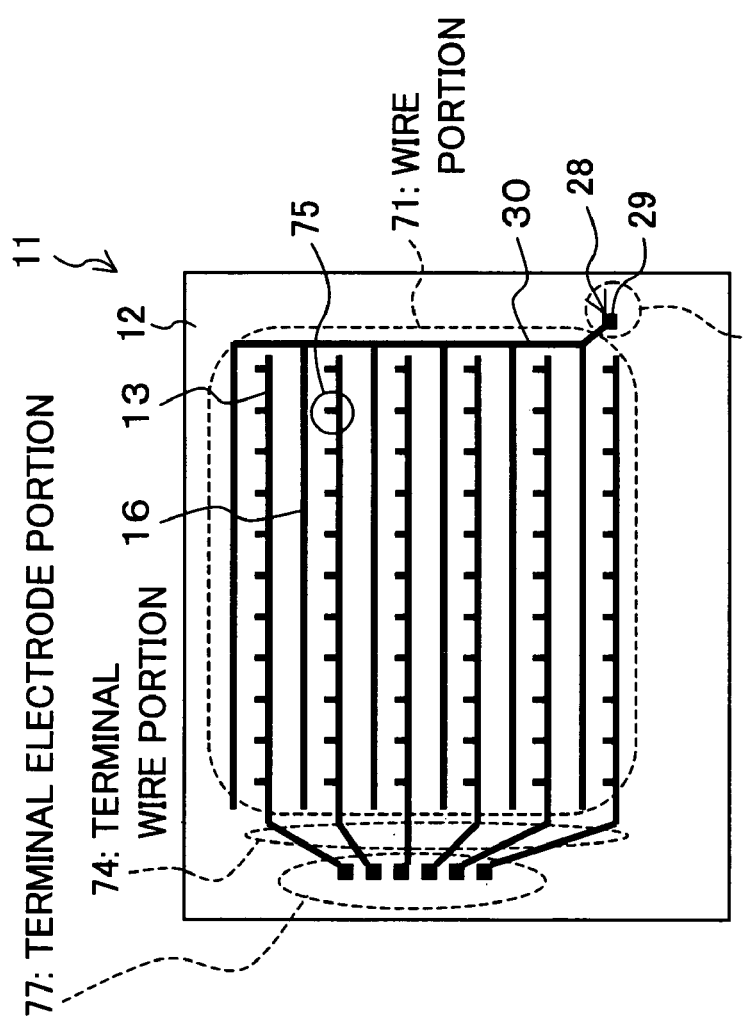
FIG. 12(a) is a block diagram schematically illustrating an overall structure of a gate wire.

Explained next is a specific method of forming the gate wire 13 in accordance with the inkjet method. FIG. 12(a) is a block diagram schematically illustrating an overall structure of the gate wire. FIG. 12(b) is a block diagram schematically illustrating a structure of the gate electrode portion of the gate wire shown in FIG. 12(a). FIG. 12(c) is a block diagram schematically illustrating a structure in the terminal electrode portion of the gate wire shown in FIG. 12(a). The gate wire 13, the storage capacitor wire 16, and the terminal wire 30 are provided in a wire portion 71 of the TFT array substrate 11. Further, the gate wire 13 is connected, in a terminal electrode portion 72 located in an end of the glass substrate 12, to a terminal electrode of the driver IC (not shown) via a terminal wire portion 74. Further, the storage capacitor wire 16 is connected to the terminal wire 30 in the other end of the glass substrate 12.

In the present embodiment, as described above, the wires in the wire portion 71 are made of the silver-indium alloy in which the rate of indium is 1 atomic % with respect to silver, and the terminal electrode 29 in the terminal electrode portion 73 is made of the silver-indium alloy in which the rate of indium is 5 atomic % with respect to silver. To accomplish the formation the wire portion 71 and the terminal electrode 29, the conductive ink compositions having the different mixture rates are separately provided in the inkjet head 33 of the pattern forming apparatus 81 shown in FIG. 3. Note that the number of prepared heads of the jet head 33 corresponds to the number of the conductive ink compositions. In the present embodiment, as shown in FIG. 12(a) and FIG. 12(b), two heads (see FIG. 13(a) and FIG. 13(b)) are respectively prepared for (i) the conductive ink composition containing indium at a rate of 1 atomic % with respect to silver, and (ii) the conductive ink composition containing indium at a rate of 5 atomic % with respect to silver.

In other words, in the present embodiment, for the formation of the terminal wire 30 and the terminal electrode 29 respectively made of the silver alloy materials whose contents of indium are different, the inkjet head 33 is required to have at least a mechanism allowing the discharge of the flowable wire materials respectively made of the silver alloy materials whose mixture rates are different, as shown in FIG. 7(b). The terminal wire 30 and the terminal electrode 29 are to be formed on the glass substrate 12.

Figure 13A:
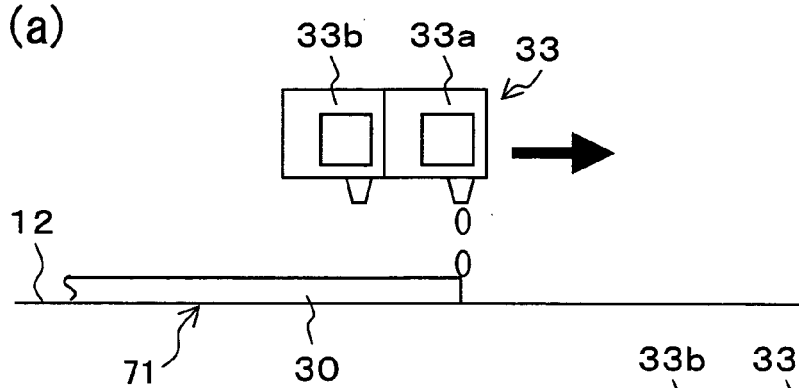
FIG. 13(a) to FIG. 13(e) are diagrams illustrating steps of forming the wire portion of the TFT array substrate, and the terminal portion of the terminal electrode section, the wire portion and the terminal portion being shown in FIG. 12(a) to FIG. 12(c).
Figure 13B:
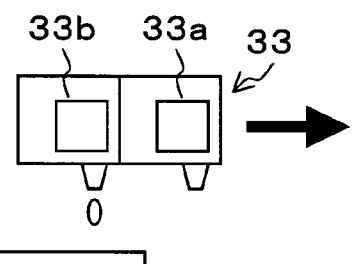

Therefore, in the present embodiment, as shown in FIG. 13(a) and FIG. 13(b), the inkjet head 33 includes, for example, (i) a first head 33a for discharging, as the flowable wire material, the low resistance material for the wire portion; and (ii) a second head 33b for discharging, as the flowable wire material, the plasma resistance material for the terminal portion. The second head 33b and the first head 33a are provided in this order, in terms of a traveling direction (a direction indicated by an arrow in FIG. 13(a) and FIG. 13(b)) of the inkjet head 33. By arbitrarily switching the first head 33a and the second head 33b, a desired flowable wire material is discharged.

FIG. 13(a) to FIG. 13(e) respectively illustrate steps of forming (i) the wire portion 71 in the TFT array substrate shown in FIG. 12(a) to FIG. 12(c), and (ii) the terminal portion 28 in terminal electrode portion 73.

See FIG. 13(a). Firstly carried out here is application of the conductive ink composition (wire portion low resistance material) containing indium at a rate of 1 atomic % with respect to silver. The application is carried out, by using the first head 33a, with respect to the wire portion 71, specifically, with respect to the formation region of the terminal wire 30 within the gate wire formation region 41 (see FIG. 9(a)) and within the terminal wire formation region 44 (see FIG. 10(a)). The first head 33a is exclusively used for the application of such a conductive ink material. See FIG. 13(b). Carried out next is application of the conductive ink composition (terminal portion plasma resistance material) containing indium at a rate of 5 atomic % with respect to silver. The application is carried out, by using the second head 33b, with respect to the terminal electrode portion 73, specifically, with respect to the formation region of the terminal electrode 29 within the terminal wire formation region 44 (see FIG. 10(a)). The second head 33b is exclusively used for the application of such a conductive ink material.

Because the two conductive ink compositions are flowable materials, the conductive ink compositions are mixed together on the glass substrate 12 after being discharged. This allows electric connection between the terminal wire 30 and the terminal electrode 29 after the incoming baking step, the terminal wire 30 and the terminal electrode 29 being respectively made of the conductive ink compositions. Therefore, a state is osculant in the region (hereinafter, referred to as "border portion P") in which the conductive ink compositions make contact with each other or are mixed with each other as shown in FIG. 7(b) and FIG. 13(b). On this occasion, the conductive ink composition serving as the wire portion low resistance material should not flow into the formation region of the terminal electrode 29. For prevention of such flow-in, the heads for discharging the conductive ink materials are switched from the first head 33a to the second head 33b at a location sufficiently before the formation region of the terminal electrode 29. For example, the switching of the conductive ink materials to be discharged is carried out several hundred micrometers before the formation region of the terminal electrode 29. This is sufficient. Of course, the application (discharge) of the conductive ink composition may be firstly carried out with respect to the formation region of the terminal portion 28.

This makes a property difference between at least the two portions in the wire, i.e., between the terminal wire 30 and the terminal electrode 29 in the present embodiment (see FIG. 12(c) and FIG. 13(b)). Likewise, as shown in FIG. 12(b), in the present embodiment, the gate wire 13 and the gate electrode 17 in the gate electrode portion 75 are caused to have different properties by differing the respective rates, of indium with respect to silver, in the conductive ink compositions to be used.

Important in the TFT array substrate 11 are: (i) the acquirement of the low electric resistance in the terminal wire 30 and the gate wire 13, (ii) the acquirement of the plasma etching resistance in the terminal electrode 29, and (iii) the acquirement of the surface smoothness (flatness) in the gate electrode 17 even under heat application. A reason for the importance of the surface smoothness lies in that the semiconductor layer 27 is formed above the gate electrode 17 with the gate insulating layer 18 therebetween, as described above.

The semiconductor layer 27 has a thickness of approximately 500 Å (50 nm). This is extremely thinner as compared with respective thicknesses (3000 Å to 5000 Å, i.e., 300 nm to 500 nm) of the wires constituting the wire portion 71. Further, the semiconductor layer 27 is a very important layer because the semiconductor layer 27 determines the property of the TFT 15.

So, it is preferable that the smoothness required for the gate electrode 17 never exceed the film thickness of the semiconductor layer 27. In other words, it is preferable that the irregularity to be formed on the gate electrode 17 be 50 nm or less, and it is more preferable that the irregularity be 10 nm or less.

Each of the metal fine particles, constituting the conductive ink composition serving as the application material (ink), has a size of several nm. Therefore, an irregularity reflecting the particle diameter of the metal fine particle is inevitably formed on the gate electrode 17 and the surface of the semiconductor layer 27 formed on the gate electrode 17. However, in cases where the grain growth exceeding 50 nm is caused by the baking (approximately 300° C.), the gate electrode 17 formed below the semiconductor layer 27 is likely to have an insufficient property.

For this reason, the smoothness is required in the gate electrode 17. Therefore, it is preferable that the conductive ink composition according to the present embodiment be used for the formation of the gate electrode 17, even though the conductive ink composition according to the present embodiment is not necessarily required to be used for the formation of the gate wire 13 except the intersecting portion of the gate wire 13 and the source wire 14. In other words, the conductive ink composition according to the present embodiment may be used for only the formation of the gate electrode 17 in the wire portion 71. Of course, the conductive ink composition according to the present embodiment may be used for the formation of all the members in the wire portion 71.

In cases where the conductive ink composition according to the present embodiment is used for only the formation of the gate electrode 17, the formation of the gate electrode 17 may be carried out, for example, as follows with the use of a first head 91 and a second head 92, rather than the first head 33a and the second head 33b of the inkjet head 33. That is, after forming the gate wire 13 by discharging, from the first head 91, a publicly well-known flowable wire material M allowing low electric resistance, the heads are switched from the first head 91 to the second head 92, and the second head 92 discharges a conductive ink composition N according to the present embodiment.

Figure 15:
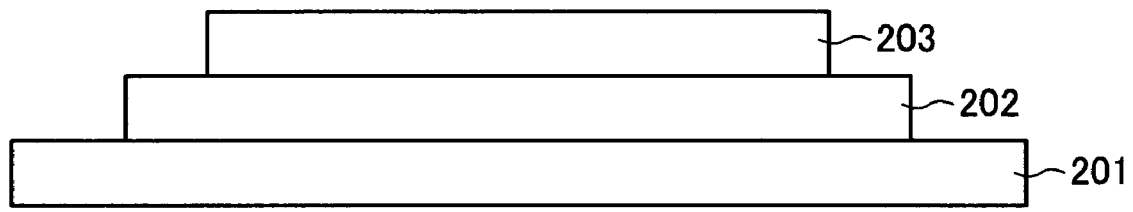
FIG. 15 is a diagram schematically illustrating that the present invention allows improvement in flatness of the wire.

As described above, the grain growth is restrained by using, for the formation of the gate electrode 17, the conductive ink composition according to the present embodiment. This allows improvement of the flatness of the gate electrode 17 that is to be the lower portion wire 20, as shown in FIG. 15. Accordingly, no discontinuity occurs in the gate insulating layer 18 serving as the insulating layer 202. With this, no top-bottom leakage occurs between the gate electrode 17 and the semiconductor layer 27 that is to be the upper portion wire 203. This improves yielding ratio, and stabilizes the property of the TFT.

Here, the following explains a flow of the aforementioned gate wire formation step 102, with reference to FIG. 13(a) to FIG. 13(e). Note that the flowable wire material used in the present embodiment is such a flowable wire material that has the protective colloids according to the present embodiment as described above, and that the function of the flowable wire material never depends on the content of indium therein.

See FIG. 13(a). Firstly carried out is the formation of the terminal wire 30 by discharging the flowable wire material, made of the wire portion low resistance material, from the first head 33a of the inkjet head 33 to the wire formation region of the glass substrate 12, which wire formation region was subjected to the hydrophilic/hydrophobic (lyophilic/lyophobic) process in the gate wire pre-process step 101. In this case, the wire formation region refers to the terminal wire formation region 44.

See FIG. 13(b). Carried out next is the formation of the terminal electrode 29 by discharging the flowable wire material (terminal portion plasma resistance material) from the second head 33b of the inkjet head 33 to the formation region of the terminal electrode 29 in the glass substrate 12 having the formed terminal wire 30. The flowable wire material has better plasma resistance than the aforementioned wire portion low resistance material, and contains a large amount of indium.

Figure 13C:
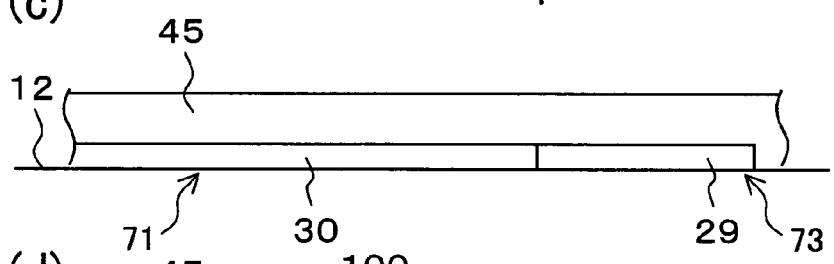

See FIG. 13(c). The terminal wire 30 and the terminal electrode 29 thus formed on the glass substrate 12 are baked, and the gate insulating film 45 that is to be the protective film are so formed as to cover the terminal wire 30 and the terminal electrode 29.

Figure 13D:
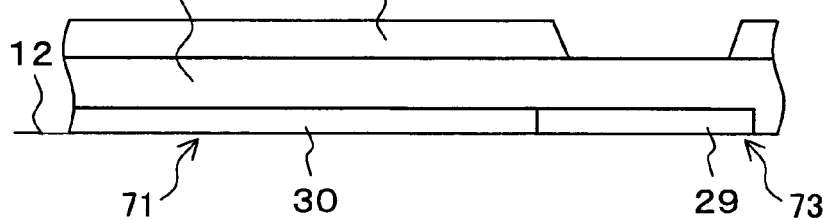

See FIG. 13(d). Thereafter, a resist material 100 is provided as a mask such that a portion of the gate insulating film 45 is exposed, which portion corresponds to the terminal electrode 29. Then, patterning is carried out by way of the mask exposure or the like.

Figure 13E:
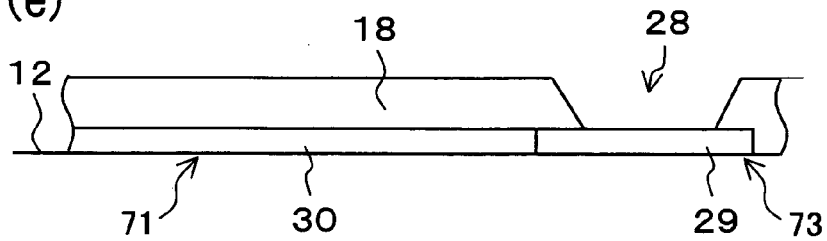
Figure 14A:
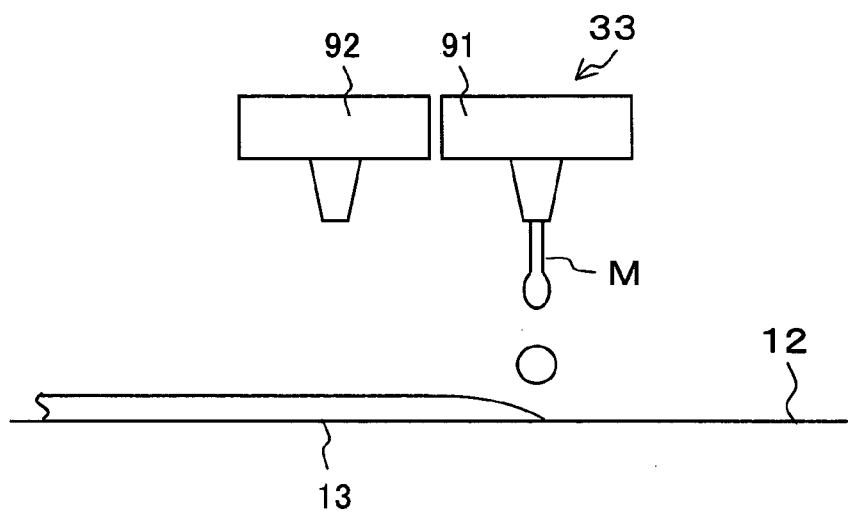
FIG. 14(a) and FIG. 14(b) are diagrams illustrating steps of forming the gate electrode in cases where the conductive ink composition according to the present embodiment is used only for the gate electrode.
Figure 14B:
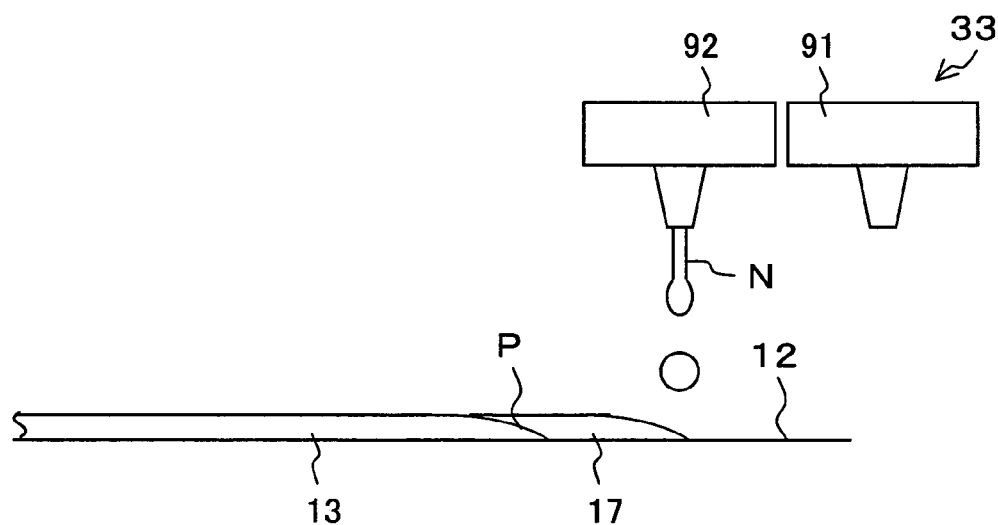

Finally, see FIG. 13(e). Etching is carried out with respect to the region, corresponding to the terminal electrode 29, of the gate insulating film 45. Thereafter, the resist material 100 is detached. With this, the terminal portion 28 is formed.

In the case where the inkjet head 33 has the two heads capable of respectively dealing with the two flowable wire materials based on the functions, the ink supplying system 36, the control unit 37, the discharge location information, and the like are required to accommodate to this.

The terminal portion 28 formed in this way is shown in FIG. 7(a) and FIG. 7(b). Note that the terminal wire 30 and the terminal electrode 29 make contact with each other, and are electrically connected to each other.

Because the terminal wire 30 is covered with the gate insulating layer 18, any material allowing the heat resistance and the adhesiveness to the glass substrate may be selected as the wire material for the terminal wire 30. That is, the terminal wire 30 is not particularly required to have the plasma resistance of the aforementioned process resistances because the terminal wire 30 is never exposed to the dry etching atmosphere.

In the present embodiment, the conductive ink composition (wire portion low resistance material) is prepared such that the content of indium is 1 atomic % with respect to silver in the terminal wire 30. In this case, the terminal wire 30 has an electric resistance of approximately 7 μΩ·cm. Further, in the present embodiment, as is the case with the terminal wire 30, the conductive ink composition (wire portion low resistance material) is prepared for the formation of the gate wire 13 and the storage capacitor wire 16, and/or the gate electrode 17 in the pixel formation region 61 such that the content of indium is 1 atomic % with respect to silver in each of the gate wire 13, the gate electrode 17, and the storage capacitor wire 16.

On the contrary, the terminal electrode 29 is exposed to the dry etching atmosphere via over-etching after the removal of the insulating film, in the etching step for removing the insulating film on the terminal for purpose of attaining the electric connection. For this reason, it is important for the terminal electrode 29 to have the plasma resistance allowing the terminal electrode 29 to be free from the deterioration due to the dry etching atmosphere. In light of this, the conductive ink composition (terminal portion plasma resistance material) is prepared such that the content of the indium is 5 atomic % with respect to silver. The terminal electrode 29 is quite shorter in terms of length as compared with the gate wire 13, the source wire 14, and the terminal wire 30 on the TFT array substrate 11. Therefore, the electric resistance of the terminal electrode 29 may be larger than those of the other portions.

In the present embodiment, the inkjet head 33 uses the first head 33a and the second head 33b so as to form the terminal wire 30 and the terminal electrode 29 by respectively discharging, from the first head 33a and the second head 33b, the two flowable wire materials whose contents of indium with respect to silver are different. Specifically, upon forming the terminal wire 30, the conductive ink composition containing indium at a rate of 1 atomic % with respect to silver is discharged, as the wire material, to the region (the formation region of the terminal wire 30) for forming the terminal wire 30. Meanwhile, upon forming the terminal electrode 29, the conductive ink composition containing indium at a rate of 5 atomic % with respect to silver is discharged, as the wire material, to the region (the formation region of the terminal electrode 29) for forming the terminal electrode 29.

Further, the conductive ink composition identical to the one used for the formation in the terminal wire 30 is discharged as the wire material, to the region for forming the gate wire 13, the gate electrode 17, and the storage capacitor wire 16. The region is within the pixel formation region 61. After the discharging, the baking is carried out for 1 hour at a temperature of 300° C., with the result that the predetermined terminal wire 30, the predetermined terminal electrode 29, and the like are obtained. As such, the wire having low electric resistance is formed by using, with respect to the wire portion within the pixel formation region 61, the flowable wire material containing of indium at a rate of 1 atomic %.

(The Gate Insulating Film/semiconductor Film Formation Step 103)

The following explains the gate insulating film/semiconductor film formation step 103, with reference to FIG. 16(a), FIG. 16(b), FIG. 17(a), and FIG. 17(b).

Figure 16A:
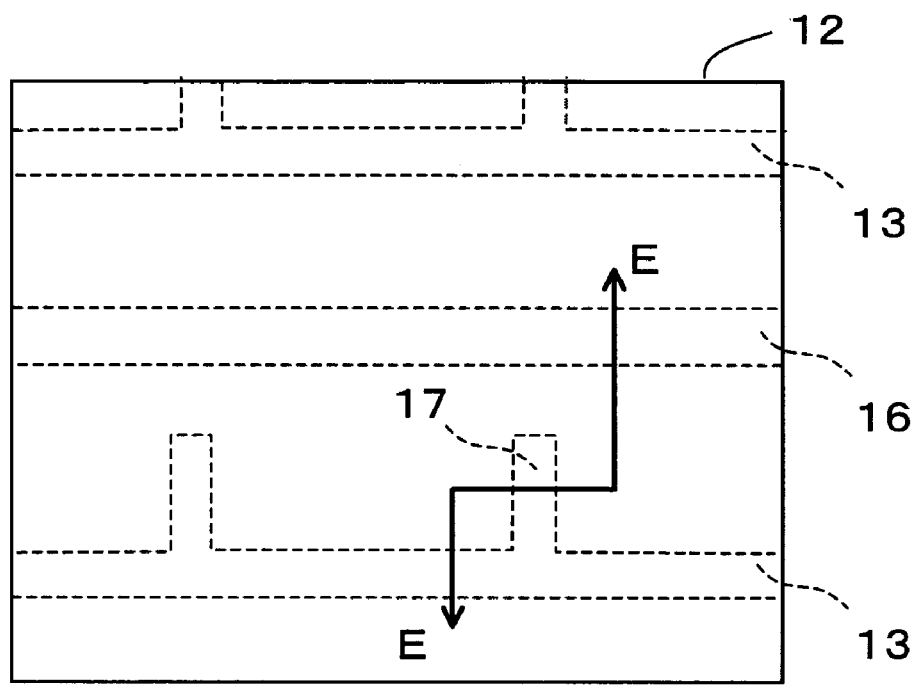
FIG. 16(a) is a plan view schematically illustrating the structure of the pixel portion of the TFT array substrate having been through the gate insulating film/semiconductor film formation step.
Figure 16B:
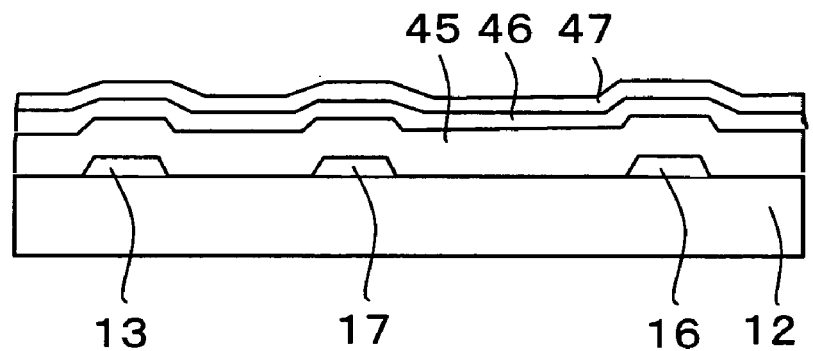
FIG. 16(b) is a cross sectional view taken along line F-F in FIG. 16(a).
Figure 17A:
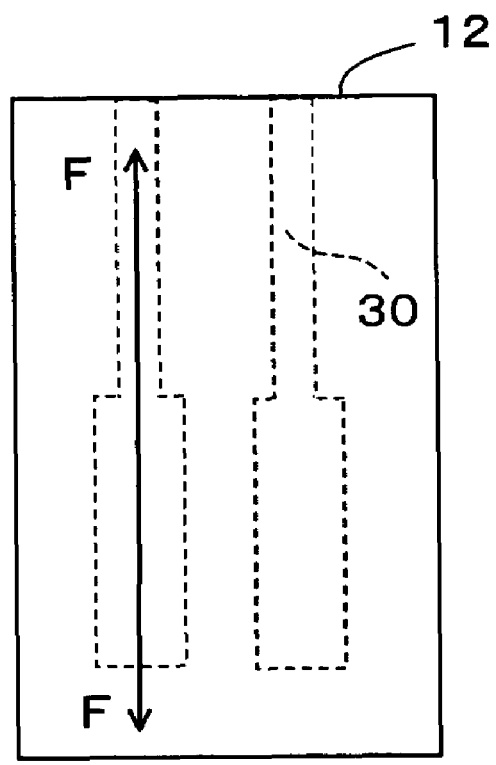
FIG. 17(a) is a plan view schematically illustrating the terminal portion of the TFT array substrate having been through a gate insulating film/semiconductor film formation step.
Figure 17B:
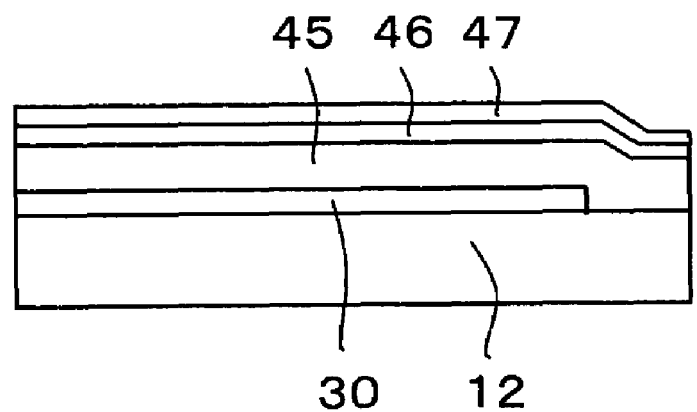
FIG. 17(b) is a cross sectional view taken along line F-F in FIG. 17(a).

FIG. 16(a), FIG. 16(b), FIG. 17(a), and FIG. 17(b) each illustrate the glass substrate 12 having been through the gate insulating film/semiconductor film formation step 103. Specifically, FIG. 16(a) is a plan view illustrating the pixel formation region 61 (pixel portion) on the glass substrate 12. FIG. 17(a) is a plan view illustrating the terminal portion formation region 62 (terminal portion) on the glass substrate 12. FIG. 16(b) is a cross sectional view taken along line E-E in FIG. 16(a). FIG. 17(b) is a cross sectional view taken along line F-F in FIG. 17(a).

As shown in FIG. 16(a), FIG. 16(b), FIG. 17(a), and FIG. 17(b), in the gate insulating film/semiconductor film formation step 103, the following films are sequentially formed on the glass substrate 12 having been through the gate wire formation step 102: (i) the gate insulating film 45, which will be the gate insulating layer 18; (ii) an amorphous silicon film 46, which will be the amorphous silicon layer 19; and (iii) an n+ type silicon film 47, which will be the n+ type silicon layer 20. Here, the gate insulating film 45 is made of silicon nitride. Each of the films is formed under a temperature of 300° C. in accordance with the CVD method. The gate insulating film 45 has a thickness of, e.g., 0.3 µm. The amorphous silicon film 46 has a thickness of, e.g., 0.15 µm. The n+ type silicon film 47 has a thickness of, e.g., 0.04 µm.

As described in the above step, the conductive ink composition according to the present embodiment is used for the formation of the gate wire 13. This allows restraint of the crystal growth. Accordingly, the surface of the gate wire 13 never becomes rough even under such a high temperature of 300° C. This allows acquirement of the gate wire 13 having a better surface as compared with the cases of using the conductive ink composition made of only silver, or of using the conductive ink composition using no protective colloids according to the present embodiment. This allows no leakage with the semiconductor layer 27 and the source electrode 21 via the gate insulating layer 18, the semiconductor layer 27 and the source electrode 21 being formed above the gate wire 13. Accordingly, the yielding ratio is improved, and the property of the TFT is stabilized.

(The Gate Insulating Film/semiconductor Film Processing Step 104)

Next, the following explains the gate insulating film/semiconductor film processing step 104, with reference to FIG. 18(a), FIG. 18(b), FIG. 19(a), and FIG. 19(b).

Figure 18A:
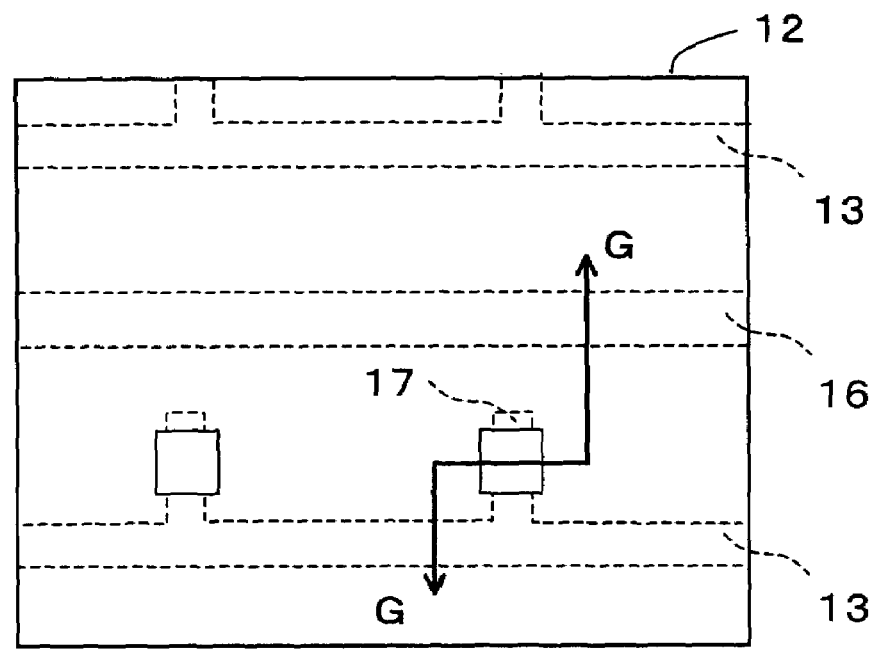
FIG. 18(a) is a plan view schematically illustrating the pixel portion of the TFT array substrate having been through a gate insulating film/semiconductor film processing step.
Figure 18B:
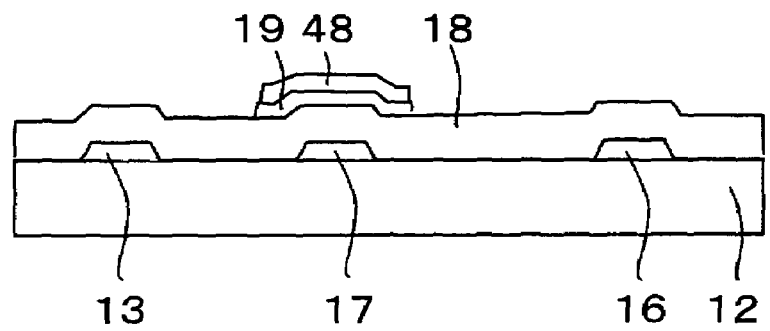
FIG. 18(b) is a cross sectional view taken along line G-G in FIG. 18(a).
Figure 19A:
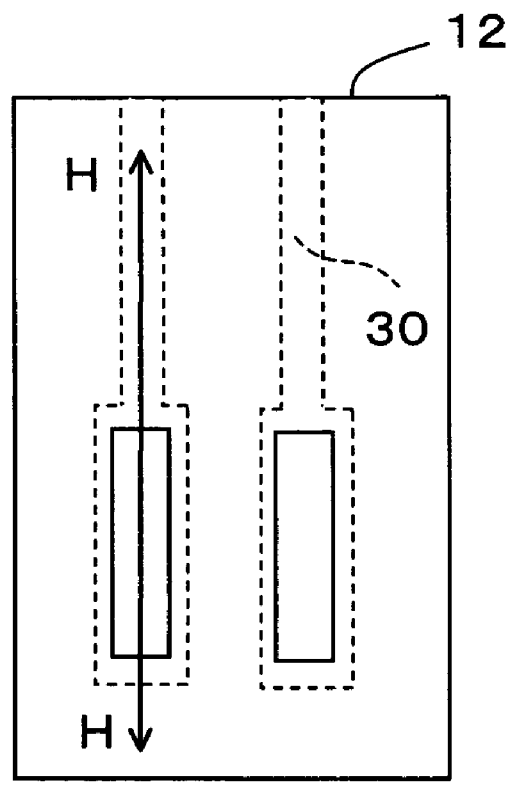
FIG. 19(a) is a plan view schematically illustrating the terminal portion of the TFT array substrate having been through the gate insulating film/semiconductor film processing step.
Figure 19B:
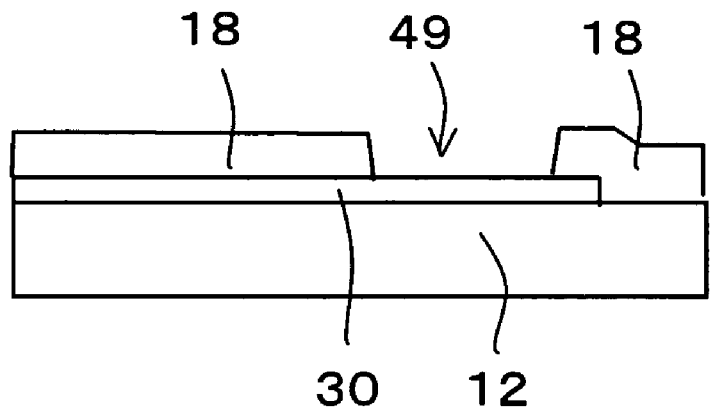
FIG. 19(b) is a cross sectional view taken along line H-H in FIG. 19(a).

FIG. 18(a), FIG. 18(b), FIG. 19(a), and FIG. 19(b) each illustrate completion of the gate insulating film/semiconductor film processing step 104. FIG. 18(a) is a plan view illustrating the pixel formation region 61 (pixel portion) on the glass substrate 12. FIG. 19(a) is a plan view illustrating the terminal portion formation region 62 (terminal portion) on the glass substrate 12. FIG. 18(b) is a cross sectional view taken along line G-G in FIG. 18(a). FIG. 19(b) is a cross sectional view taken along line H-H in FIG. 19(a).

In the gate insulating film/semiconductor film processing step 104, first photolithography is carried out such that the amorphous silicon film 46 (see FIG. 16(b)) is processed to be the amorphous silicon layer 19, and such that the n+ type silicon film 47 (see FIG. 17(b)) is processed to be an n+ type silicon processed film 48 that will be the n+ type silicon layer 20, as apparent from FIG. 18(a), FIG. 18(b), FIG. 19(a), and FIG. 19(b). In the pixel formation region 61, the amorphous silicon layer 19 and the n+ type silicon processed film 48 are left above the gate electrode 17 in an "island" manner. On the contrary, in the terminal portion formation region 62, the amorphous silicon layer 19 and the n+ type silicon processed film 48 are removed by the processing. Note that the processing (etching) is carried out in accordance with the dry etching method by introducing mixture gas of sulfur hexafluoride ($SF_6$) gas and hydrogen chloride (HCl) gas. Note that, until this moment, the gate insulating film 45 covers all over the surface of the glass substrate 12, so that the terminal wire 30 and the like are not exposed to the dry etching atmosphere.

Next, second photolithography is carried out so as to process the gate insulating film 45 shown in FIG. 16(b) and FIG. 17(b). In the terminal portion formation region 62, the gate insulating film 45 is partially etched, with the result that the gate insulating layer 18 and the aperture portion 49 are obtained. The etching is carried out in accordance with the dry etching method by introducing mixture gas of $CF_4$ gas and $O_2$ gas.

Note that, in the terminal portion formation region 62, the content of indium is set in advance at approximately 5 atomic % with respect to silver, in consideration of the plasma resistance.

(The Source/drain Wire Pre-process Step 105)

Figure 20A:
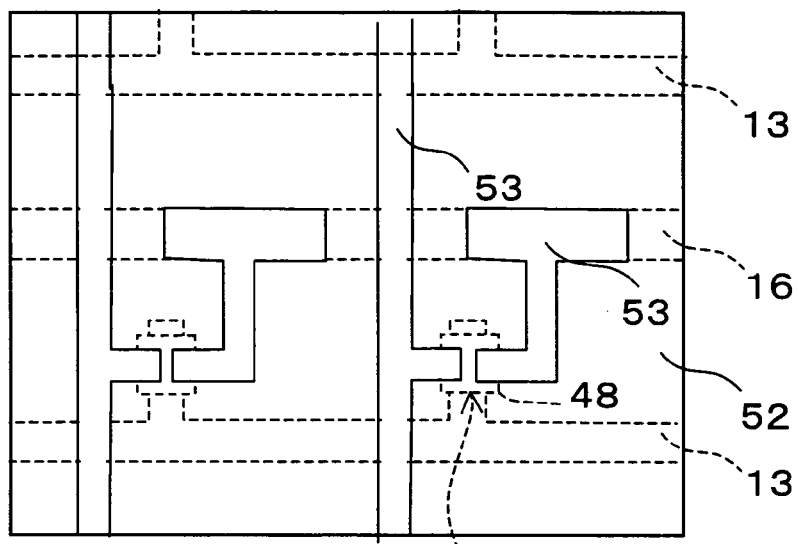
FIG. 20(a) is a plan view schematically illustrating the pixel portion after completion of a source/drain wire processing step.

Next, the following explains the source/drain wire pre-process step 105 with reference to FIG. 20(a). FIG. 20(a) is a plan view schematically illustrating the structure of the pixel portion after completion of the source/drain wire pre-process step 105. In other words, FIG. 20(a) illustrates that a wire guide 52 for the formation of the source wire 14, the source electrode 21, and the drain electrode wire 22 are formed on the glass substrate 12 having been through the gate insolating film/semiconductor film processing step 104.

Note that, in the source/drain wire formation step 106 described later, no wires or the like are formed in the terminal portion formation region 62. For this reason, the explanation here is only about the pixel formation region 61.

In the step, the wire guide 52 made from a photo resist material is so formed as to exclude the region (source-drain formation region 53) for forming the source wire 14, the source electrode 21, and the drain electrode wire 22. Specifically, a photo resist is applied to the glass substrate 12 having been through the gate insulating film/semiconductor film processing step 104, and then pre-baking is carried out. Thereafter, exposure and development are carried out with the use of a photo mask, and then post-baking is carried out. With the wire guide 52 thus formed, a region for forming the source wire 14 and the source electrode 21 has a line width of 10 μm, and a region constituting the drain electrode wire 22 has a line width of 10 μm to 40 μm. Further, an interval between the source electrode 21 and the drain electrode wire 22, i.e., a length of a TFT channel portion 51 is set at 4 μm.

Note that the upper surface of the gate insulating layer 18 may be subjected to a hydrophilic (lyophilic) treatment using oxygen plasma such that the surface to be the priming surface becomes well hydrophilic with respect to the wire material to be applied by the pattern forming apparatus. Note also that the wire guide 52 may be exposed to $CF_4$ plasma so as to have a hydrophobic (lyophobic) property.

Further, instead of using the wire guide 52 thus formed, the hydrophilic/hydrophobic (lyophilic/lyophobic) treatments may be carried out, according to the wire/electrode pattern, by way of the photocatalyst used for the formation of the gate electrode.

(The Source/drain Wire Formation Step 106)

Figure 20B:
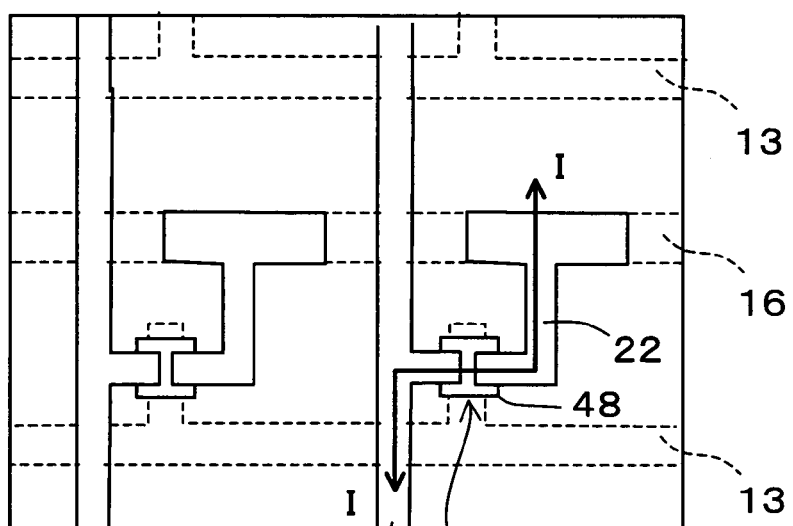
FIG. 20(b) is a plan view schematically illustrating the pixel portion after completion of a source/drain wire formation step.
Figure 20C:
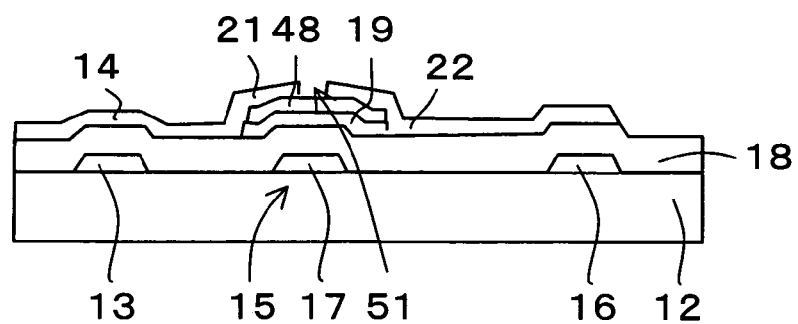
FIG. 20(c) is a cross sectional view taken along line I-I in FIG. 20(b).

The following explains the source/drain wire formation step 106 with reference to FIG. 20(b) and FIG. 20(c). FIG. 20(b) and FIG. 20(c) each illustrate completion of the source/drain wire formation step 106. FIG. 20(b) is a plan view illustrating the pixel formation region (pixel portion) of the glass substrate 12. FIG. 20(c) is a cross sectional view taken along line I-I in FIG. 20(b).

Note that no wire or the like is formed in the terminal portion formation region 62 in the source-drain wire formation step 106 as described above, so that explanation here is also only about the pixel formation region 61.

In the source/drain wire formation step 106, the wire guide 52 formed in the previous step is used for the formation of the source wire 14, the source electrode 21, and the drain electrode wire 22 as shown in FIG. 20(b) and FIG. 20(c). Note that the pattern forming apparatus 81 shown in FIG. 3 is used as an application apparatus.

Used as the wire material is, for example, the conductive ink composition material according to the present embodiment, i.e., the conductive ink composition material obtained by dispersing, in the organic solvent, the silver-indium alloy fine particles each coated with the aforementioned protective colloids (specifically, the protective colloids described in Example 2 below). In consideration of the dry etching operations to be carried out in the channel portion processing step 107 and the protective film processing step 109, the rate of indium is set at approximately 5 atomic % with respect to silver in the conductive ink composition such that the plasma resistance is rendered.

Note that the rate may be appropriately selected according to a manufacture process and a desired property of the TFT array substrate 11.

In the source/drain wire formation step 106, a discharge amount of the conductive ink composition from the inkjet head 33 of the pattern forming apparatus 81 is 2 pl such that the formed film has a film thickness of 0.3 μm. Further, the baking is carried out at a temperature of 250° C. lower than the temperature of 300° C. at which the amorphous silicon film 46 and the like were formed. The wire guide 52 is removed by an organic solvent.

(The Channel Portion Processing Step 107)

Figure 21:
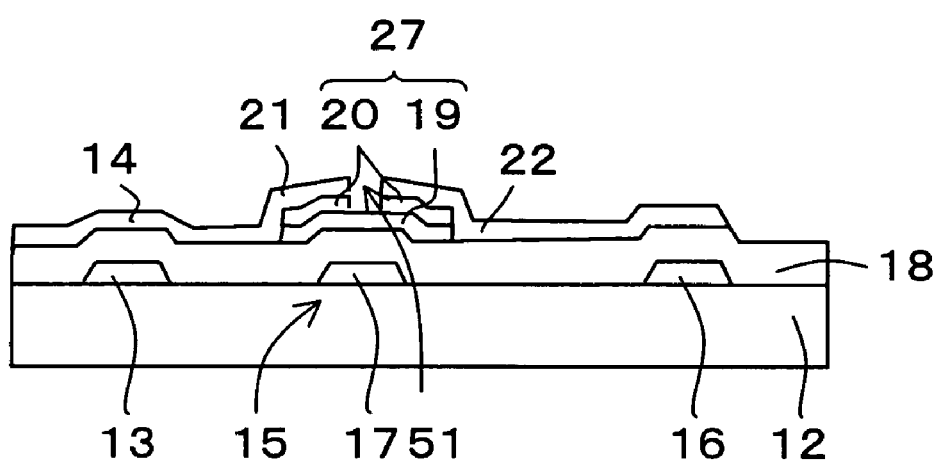
FIG. 21 is a cross sectional view taken along the line I-I in FIG. 20(b), schematically illustrating the structure of the pixel portion after completion of a channel portion processing step.
Figure 22:
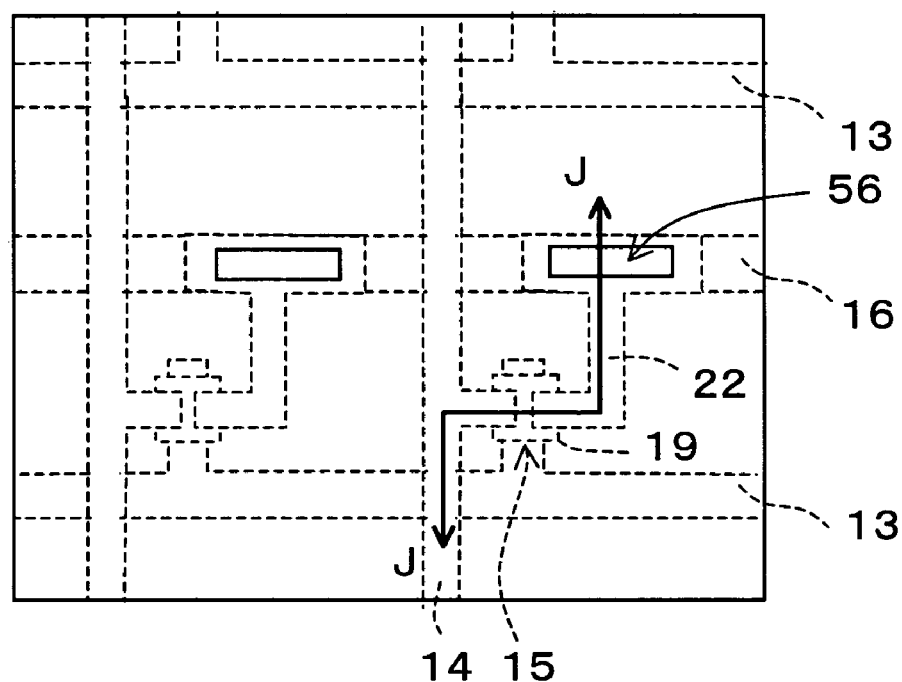
FIG. 22(a) is a plan view schematically illustrating the structure of the pixel portion after completion of a protective film/interlayer insulating film formation step.
FIG. 22(b) is a cross sectional view taken along line J-J in FIG. 22(a).
Figure 22:
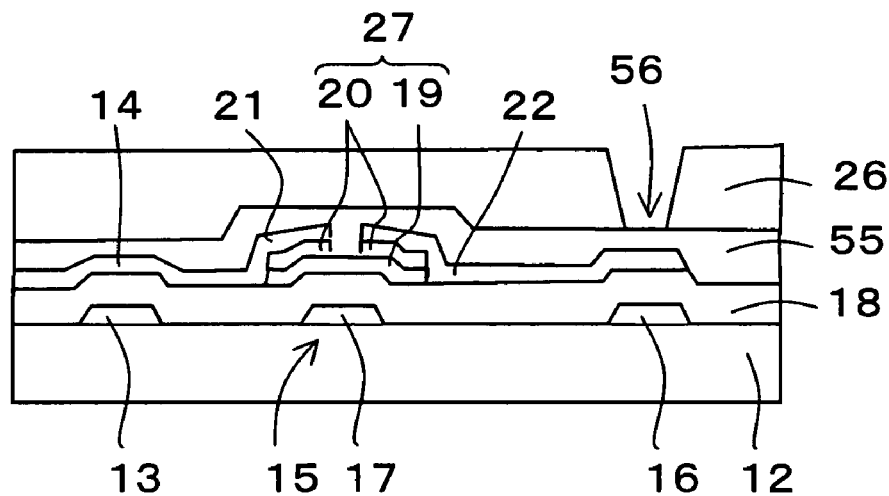

Next, the following explains the channel portion processing step 107 with reference to FIG. 21. FIG. 21 is a cross sectional view taken along line I-I in FIG. 20(b), illustrating completion of the channel portion processing step 107.

In the channel portion processing step 107, the channel portion 51 of the TFT (see FIG. 21) is processed by way of dry etching using gaseous chlorine. On this occasion, the processing uses no photolithography, but uses the respective patterns of the source electrode 21 and the drain electrode wire 22.

(The Protective Film/interlayer Insulating Layer Formation Step 108)

Figure 23A:
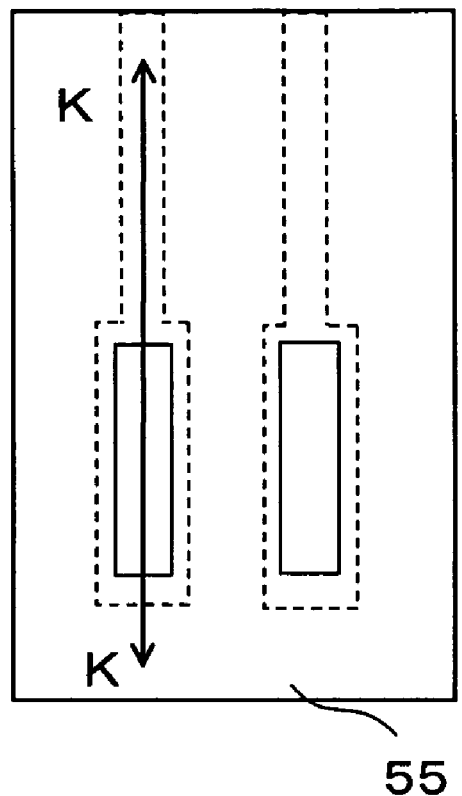
FIG. 23(a) is a plan view schematically illustrating the structure of the terminal portion after the completion of the protective film/interlayer insulating film formation step.
Figure 23B:
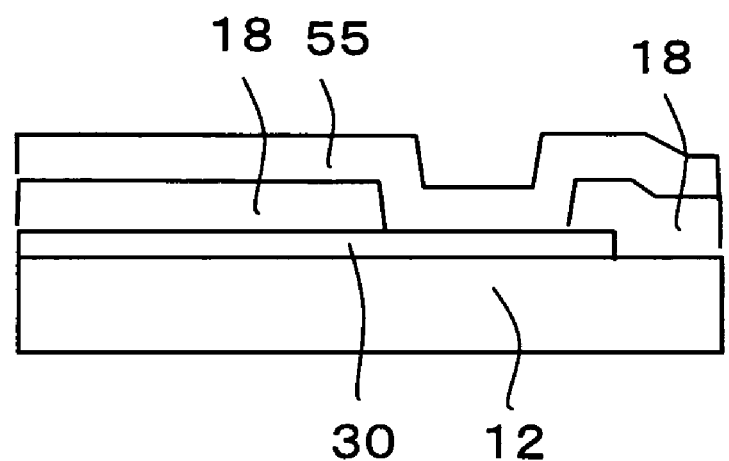
FIG. 23(b) is a cross sectional view taken along line K-K in FIG. 23(a).

Next, the following explains the protective film/interlayer insulating layer formation step 108 with reference to FIG. 22(a), FIG. 22(b), FIG. 23(a), and FIG. 23(b), each of which illustrates completion of the protective film/interlayer insulating layer formation step 108. FIG. 22(a) is a plan view illustrating the pixel formation region 61 (pixel portion) on the glass substrate 12. FIG. 23(a) is a plan view illustrating the terminal formation region 62 (terminal portion) on the glass substrate 12. FIG. 22(b) is a cross sectional view taken along line J-J in FIG. 22(a). FIG. 23(b) is a cross sectional view taken along line K-K in FIG. 23(a).

See FIG. 22(a), FIG. 22(b), FIG. 23(a), and FIG. 23(b). Firstly in the protective film/interlayer insulating layer formation step 108, a silicon nitride film 55 serving as the protective film is formed, in accordance with the CVD method, on the glass substrate 12 having been through the previous steps. On this occasion, the substrate has a temperature of 200° C.

Next, a photosensitive acryl resin material is applied to the silicon nitride film 55. Then, exposure using a mask, development, and baking are carried out. This allows acquirement of the interlayer insulating layer 26 having a predetermined pattern. The interlayer insulating layer 26 has a portion in which the drain electrode wire 22 and the storage capacitor wire 16 overlap with each other, and an aperture portion 56 is provided in the portion. On the other hand, no interlayer insulating layer 26 is provided in the terminal portion formation region 62 as shown in FIG. 23(b).

(The Protective Film Processing Step 109)

Figure 24A:
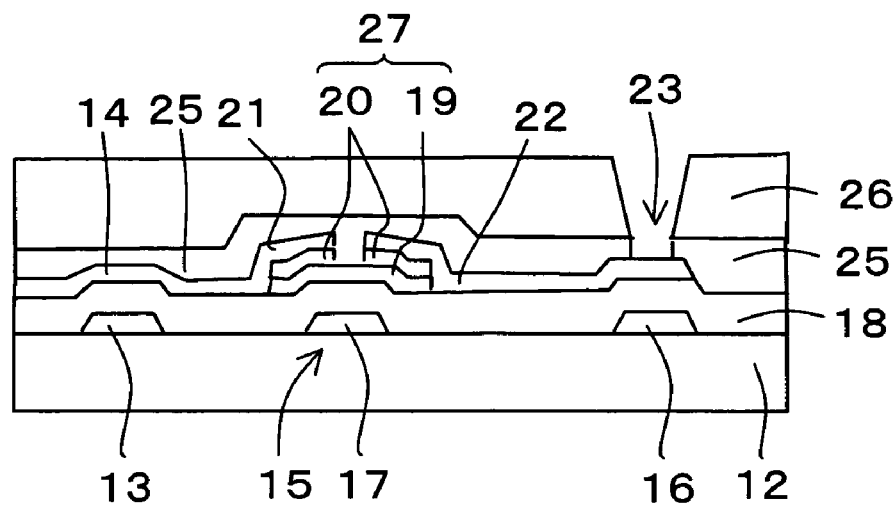
FIG. 24(a) is a cross sectional view taken along the line J-J shown in FIG. 22(a), schematically illustrating the pixel portion after completion of a protective film processing step.
Figure 24B:
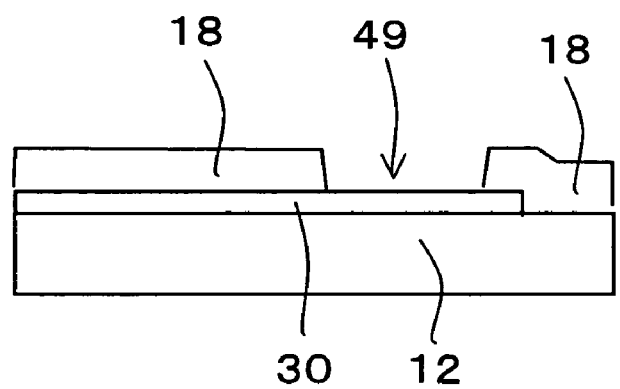
FIG. 24(b) is a cross sectional view taken along the line K-K shown in FIG. 22(a), schematically illustrating the structure of the terminal portion after the completion of the protective film processing step.

Next, the following explains the protective processing step 109 with reference to FIG. 24(a) and FIG. 24(b). FIG. 24(a) is a cross sectional view taken along the line J-J in FIG. 22(a), illustrating completion of the protective film processing step 109. FIG. 24(b) is a cross sectional view taken along the line K-K in FIG. 23(a), illustrating completion of the protective film processing step 109.

In the protective film processing step 109, the silicon nitride film 55 formed in the protective film/interlayer insulating layer formation step 108 is processed by using the pattern of the interlayer insulating layer 26. In the pixel formation region 61, etching is carried out with respect to a portion of the silicon nitride film 55 (see FIG. 22(a), FIG.

22(*b*), FIG. 23(*a*), and FIG. 23(*b*)), which portion is just below the aperture portion 56. This allows formation of the protective layer 25 (protective film) and the contact hole 23 as shown in FIG. 24(*a*). On the other hand, in the terminal portion formation region 62, the silicon nitride film 55 all over the terminal portion formation region 62 is etched and removed as shown in FIG. 24(*b*). Note that the etching is carried out in accordance with the dry etching method by introducing a mixture gas of $CF_4$ gas and $O_2$ gas.

(The Pixel Electrode Formation Step 110)

In this final step, the pixel electrode 24, and an ITO (indium tin oxide) film to be the terminal electrode 29 (see FIG. 6, FIG. 7(*a*), and FIG. 7(*b*)) are formed, in accordance with the sputtering method, on the substrate (see FIG. 24(*a*) and FIG. 24(*b*)) having the interlayer insulating layer 26. The substrate has a temperature of 200° C. on this occasion. Next, patterning is carried out with respect to the ITO film by way of photolithography. This allows acquirement of the TFT array substrate 11 shown in FIG. 4 to FIG. 7(*a*) and FIG. 7(*b*).

Figure 28:
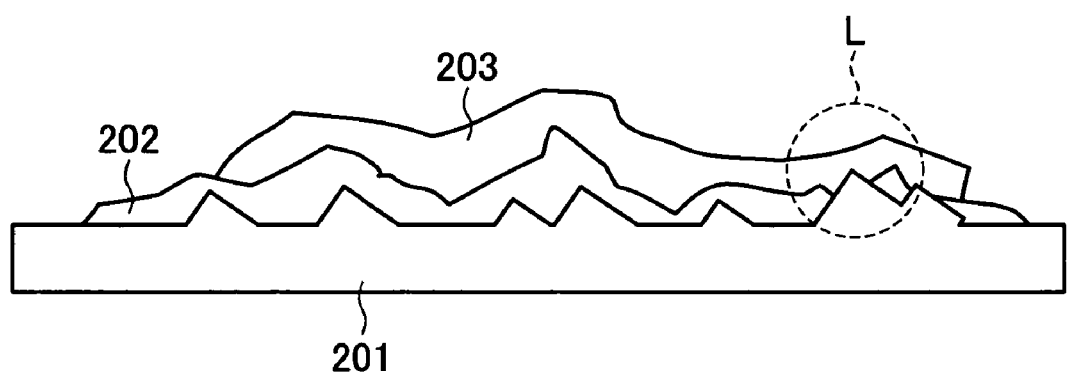
FIG. 28 is a diagram schematically illustrating leakage between an upper portion wire and a lower portion wire, the leakage being caused by grain growth of a noble metal.

The conductive ink composition according to the present embodiment makes it difficult for the grain growth to occur during the baking, furthermore, never causes the grain growth, unlike the conventional wire material. Such an excellent property (heat resistance) never causes the surface roughness even when the substrate is under the high temperature of 200° C. or 300° C. This allows acquirement of the wire and/or the electrode each having a good surface smoothness. Specifically speaking, the wire and the electrode refer to the gate wire 13, the storage capacitor wire 16, the gate electrode 17, and the like. Especially, the gate electrode 17 and the semiconductor layer 27 are formed face to face with the gate insulating layer 18 therebetween, and the storage capacitor wire 16 and the drain electrode wire 22 are formed face to face with the gate insulating layer 18 therebetween, the gate wire 13 and the source wire 14 are formed face to face with the gate insulating layer 18 therebetween in the cross (overlap) portion at which the gate wire 13 and the source wire 14 overlap with each other. Conventionally, in these portions, the gate insulating layer 18 is caused to be discontinuous by the grain growth occurring upon the baking of the wire material of forming the wires and/or the electrodes. This causes short-circuit between the upper wire and the lower wire, i.e., this causes, e.g., the top-bottom leakage shown in FIG. 28.

However, the use of the conductive ink composition according to the present embodiment allows the restraint of the grain growth, and accordingly allows the improvement in the surface smoothness (flatness) of the application film. With this, the film discontinuity due to the irregularity caused by the grain growth never occurs in the thin film formed on the application film, i.e., in the insulating layer 202 (see FIG. 15) formed on the lower portion wire 201. As a result, no defect L (short-circuit) shown in FIG. 28 occurs. Therefore, as described above, it is very effective when the conductive ink composition according to the present embodiment is applied as the wire material for the wires (the lower portion wire 201 and the upper portion wire 203) sandwiching the insulating layer 202, especially, is applied as the wire material for the lower portion wire 201. Accordingly, the yielding ratio is improved. Further, in cases where the conductive ink composition according to the present embodiment is used for the wires of the liquid crystal display apparatus (LCD) as described above, the followings are prevented: (i) the top-bottom leakage in the overlap portion of the gate wire 13 and the source wire 14, and (ii) the film discontinuity of the semiconductor layer 27 on the gate electrode 17. This stabilizes the properties of the TFT.

Note that, as described above, the bad surface of the lower portion wire 201 (lower side wire) in the overlap portion of the wires causes the top-bottom leakage between the upper wire 203 and the lower portion wire 201 via the insulating wire 202 formed on the lower wire 201. Further, the semiconductor layer 27 (approximately 500 Å=approximately 50 nm) having the amorphous silicon layer 19 is formed, with the gate insulating layer 18 therebetween, in the formation portion (TFT portion) of the TFT 15, and the formation portion (the gate electrode portion 75; see FIG. 12(*a*) and FIG. 12(*c*)) of the gate electrode 17. Therefore, the surface roughness in the gate electrode 17 causes deterioration of the TFT property, and the film discontinuity of the gate insulating layer 18.

Further, also in the formation portion (storage capacitor wire portion) of the storage capacitor wire 16, the bad surface of the lower portion wire 201 (lower side wire) causes the film discontinuity of the gate insulating layer 18, and the leakage between the upper wire and the lower wire. With this, the storage capacitor wire 16 cannot possibly work as a capacitor.

For this reason, it is preferable that the semiconductor layer 27 (a-Si layer) have a flatness of 50 nm or less, and that the other portions (the wires and/or the electrodes) have a flatness of 150 nm or less.

Particularly, because the storage capacitor wire 16 (storage capacitor wire portion) is required to form a capacitor together with the drain electrode wire 22 with the gate insulating layer 18 therebetween, the storage capacitor wire 16 is required to be flat in a larger area as compared with the gate electrode 17 (the gate electrode portion 75; see FIG. 12(*a*) and FIG. 12(*c*)). In order to attain a good surface of the storage capacitor wire 16, the conductive ink composition according to the present embodiment is used. This is very effective in the formation of the capacitor. In this case, as described above, the different conductive ink compositions are used by way of the different heads, and the conductive ink composition according to the present embodiment is used, e.g., only for the storage capacitor wire 16. Of course, all the members may be formed by using the conductive ink compositions according to the present embodiment.

A region W shown in FIG. 5 and FIG. 6 indicates a region especially requiring the flatness in the TFT array substrate 11 according to the present embodiment.

Note that, the present embodiment uses, as the wire material, the conductive ink composition according to the present embodiment, i.e., the conductive ink composition obtained by dispersing, in the organic solvent, the silver-indium alloy fine particles coated with the protective colloids serving as an organic film. The rate of indium is appropriately set at approximately 5 atomic % or less with respect to silver in the conductive ink composition. However, the rate of indium with respect to silver can be appropriately selected according to the manufacture process, the desired properties of the TFT array substrate 11, or the like.

As such, in the present embodiment, the conductive ink composition contains the solid material including the metal fine particles each coated with protective colloids each made of at least two organic compounds, each of the metal fine particles being made of a plurality of metals, at least one of which is a noble metal. More specifically, each of the metal fine particles is made of, e.g., an alloy containing at least a noble metal. This allows restraint of the metal grain growth, and accordingly allows formation of the film (metal film)

having excellent surface smoothness, and better adhesiveness to the application target as compared with the conventional film.

In other words, the present embodiment makes it possible to provide the conductive ink composition that allows restraint of the metal grain growth, and that accordingly allows formation of a film having excellent surface smoothness and excellent adhesiveness to the application target. Further, the present embodiment makes it possible to provide (i) an electrode and/or a wire, (ii) a thin film formation substrate or a circuit substrate, (iii) an electronic apparatus, and the like, each of which utilizes the conductive ink composition. In other words, the present embodiment makes it possible to provide (i) a wire, an electrode, and a thin film formation substrate, each of which has excellent surface smoothness and excellent adhesiveness to the application target, the excellent surface smoothness and the excellent adhesiveness being obtained by the restraint of the metal grain growth; (ii) a circuit substrate, which includes the wire and/or the electrode; (iii) an electronic apparatus using the circuit substrate. A specific example of the circuit substrate is an active matrix substrate (TFT array substrate) or the like, and a specific example of the electronic apparatus is a (liquid crystal) display apparatus or the like.

In other words, the present embodiment makes it possible to provide the thin film formation substrate or the circuit substrate, each of which is obtained by carrying out, for example, a drying treatment or a heating treatment (e.g., baking) with respect to the conductive ink composition.

For example, in the present embodiment, a heating treatment of 250° C. to 350° C. may be carried out with respect to the conductive ink composition for use in the substrate, the wire, the electrode, the active matrix substrate, and the circuit substrate.

Further, the present embodiment makes it possible to provide the wire or the electrode, each of which is made from the conductive ink composition, and each of which is formed on the base substrate (priming substrate).

Further, the present embodiment makes it possible to provide an active matrix substrate in which a plurality of signal lines made from the conductive ink composition are provided in a matrix manner, and in which a switching device is provided in the vicinity of each intersection of the signals lines.

Further, the present embodiment makes it possible to provide an active substrate in which a plurality of signal lines are provided in a matrix manner, and in which a signal line (i.e., a lower portion wire in a cross portion of the signal lines) provided in a lower portion is made from the conductive ink composition, and in which a switching device is provided in the vicinity of each intersection of the signals lines.

Further, the present embodiment makes it possible to provide an active matrix substrate in which a plurality of signal lines are provided in a matrix manner, and in which a switching device is provided in each intersection of the signal lines, and in which an electrode (e.g., gate electrode) for turning ON/OFF of the switching device is provided under the switching device and is made from the conductive ink composition.

Note that the conductive ink composition may contain, in addition to the aforementioned organic solvent (dispersion medium), publicly known various conventional additives that never prevent the effect to be given by the conductive ink composition. Examples of such additives include: a dispersant, a viscosity adjusting agent, a surface tension adjustment agent, and the like.

The conductive ink composition according to the present embodiment can be used for a reflective member such as a light reflective electrode (hereinafter, simply referred to as "reflective electrode") provided in a TFT array substrate for use in a reflection type TFT liquid crystal display apparatus or the like. In this case, the excellent heat resistance of the conductive ink composition allows preservation of the surface smoothness even when high temperature baking of, e.g., 200° C. or 300° C. is carried out, unlike in the film formed by using the conventional silver ink made only of silver. Accordingly, light scattering falls within a range aimed upon designing, with the result that the light reflective electrode can keep sufficient light reflectance. This sufficiently brings out the property as the TFT array substrate.

Note that the conductive ink composition may be used not only for the reflective member provided in the circuit substrate such as the TFT array substrate, but also for a reflective member such as an individual reflective plate. In other words, the reflective member according to the present embodiment is not required to be provided in the circuit substrate, but may be used individually.

The following explains an example of manufacturing a TFT array substrate 11 using, as the reflective electrode (reflective plate; pixel electrode), a metal film made from silver-indium conductive ink composition serving as the conductive ink composition according to the present embodiment.

Note that the same steps until the channel portion processing step 107 are carried out as above for the manufacture of the TFT array substrate 11 for use in the reflection type TFT liquid crystal display apparatus. Therefore, the following explains the protective film/interlayer insulating layer formation step 108 and the later steps.

(The Protective Film/interlayer Insulating Layer Formation Step 108)

In the present protective film/interlayer insulating layer formation step 108, an application type insulating material (sol-gel material) formed in accordance with the sol-gel method is applied to the silicon nitride film 55, instead of the photosensitive acryl resin material. In the step of baking the silver-indium conductive ink composition, the sol-gel material exhibits heat resistance (high temperature resistance) higher than that of the photosensitive acryl resin material. Further, the use of the sol-gel material makes it possible to level irregularity in the formation portion (TFT portion) of the TFT 15, the silicon nitride film 55 being formed in the formation portion.

Note that, in the present protective film/interlayer insulating film formation step 108, the silicon nitride film 55 is formed at a temperature of 250° C. in consideration of the step of baking the sol-gel material. After the formation of the silicon nitride film 55, the sol-gel material is applied to the silicon nitride film 55, and baking is carried out at a temperature of 250° C. in the similar manner.

Note that the sol-gel material is not photosensitive. Therefore, in the present protective film/interlayer insulating layer formation step 108, a resist is further applied to the sol-gel material applied to the silicon nitride film 55. Then, exposure using a mask, development, and baking are carried out for the acquirement of the interlayer insulating layer 26 having a predetermined pattern.

(The Protective Film Processing Step 109)

Next, as is the case with the foregoing protective film processing step 109, dry etching is carried out with respect to the silicon nitride film 55 such that the protective layer 25 and the contact hole 23 are formed.

The dry etching uses a mixture gas of $CF_4$ gas and $O_2$ gas, as is the case with the foregoing protective film processing step 109. Thereafter, the resist is removed, thereby obtaining the same structure as the structure shown in FIG. 24(a) and FIG. 24(b). Note that the dry etching is carried out at a time with respect to (i) the layer made from the sol-gel material, and (ii) the silicon nitride film 55 formed under the sol-gel material.

(The Pixel Electrode Formation Step 110)

Next, spin coating of the conductive ink composition according to the present embodiment is carried out with respect to the substrate (i.e., the substrate shown in FIG. 24(a) and FIG. 24(b)) for 30 seconds at 1500 rpm. This allows formation of a film (conductive ink composition film) that has a thickness of 250 nm, and that is made from the conductive ink composition.

In the conductive ink composition, the rate of indium is 0.1 atomic % with respect to silver. Moreover, the conductive ink composition (reflective electrode low resistance material) uses protective colloids described in Example 11 below.

Next, baking is carried out for 1 hour at a temperature of 250° C. under atmospheric air. The metal film (bake film) made from the conductive ink composition has a reflectance of 94% with respect to light having a wavelength of 550 nm.

Next, photolithography is carried out so as to pattern the metal film (bake film) made from the conductive ink composition. As shown in FIG. 6, FIG. 7(a), and FIG. 7(b), this allows acquirement of the TFT array substrate 11 that is arranged such that the pixel electrode 24 and the terminal electrode 29 are on the substrate (see FIG. 24(a) and FIG. 24(b)) having the interlayer insulating layer 26. Each of the pixel electrode 24 and the terminal electrode 29 serves as the reflective electrode, and is made from the conductive ink composition. In other words, the above method allows acquirement of the TFT array substrate 11 having the same structure as the TFT array substrate 11 (see FIG. 4 to FIG. 7(a) and FIG. 7(b)) in which the pixel electrode 24 (reflective electrode) made from the conductive ink composition is formed on the interlayer insulating layer 26.

Note that, in the aforementioned reflective electrode formation step, the reflective electrode is formed in such a manner that: the conductive ink composition is applied, in accordance with the spin coating method, to the substrate (see FIG. 24(a) and FIG. 24(b)) having the interlayer insulating layer 26, and then the baking and the patterning are carried out. However, the method for forming the reflective electrode is not limited to this, and the reflective electrode may be formed in a different way. For example, the reflective electrode can be formed as follows. That is, a resist is formed on the substrate (see FIG. 24(a) and FIG. 24(b)) having the interlayer insulating layer 26, and patterning is carried out with respect to the resist for the sake of forming a guide for patterning and forming the reflective electrode. Thereafter, the conductive ink composition according to the present embodiment is applied, baked, and removed by an organic solvent. Note that the organic solvent may be appropriately selected, according to a resist to be used, so as to melt the resist. For this reason, the organic solvent is not particularly limited.

Even under the baking temperature of 200° C. or 300° C., the excellent heat resistance of the conductive ink material allows preservation of the surface smoothness in the reflective electrode obtained in this way, unlike in the film made from the conventional silver ink made of only silver. With the above method, the light scattering falls within the range aimed upon designing. This makes it possible to provide the TFT array substrate 11 having the light reflective electrode capable of keeping sufficient light reflectance.

Note that the above specific example uses the silver-indium conductive ink composition as the conductive ink composition according to the present embodiment; however, the present embodiment is not limited to this, and the silver conductive ink composition according to the present embodiment may be used as described above. The silver conductive ink composition uses the metal fine particles each made of only silver.

As described above, the use of the specific protective colloids allows improvement in the adhesiveness, to the application target, of the region containing a small amount of the added metal in the film made from the conductive ink composition. A specific example of such a region is the region containing a small amount of indium in the silver-indium metal film. Further, the use of the specific protective colloids allows the restraint of the metal grain growth even in cases where the metal fine particles are only made of a noble metal, and accordingly allows improvement of the adhesiveness to the application target. The specific protective colloids refer to the protective colloids each made from the (A) amine and the (B) carboxylic acid, which is a mixture of (i) at least one carboxylic acid selected from carboxylic acid having 4 carbon atoms to 9 carbon atoms, and (ii) at least one carboxylic acid selected from carboxylic acid having 5 carbon atoms to 25 carbon atoms, the average number of the carbon atoms in the (B) carboxylic acid ranging from 5 to 25.

Figure 30:
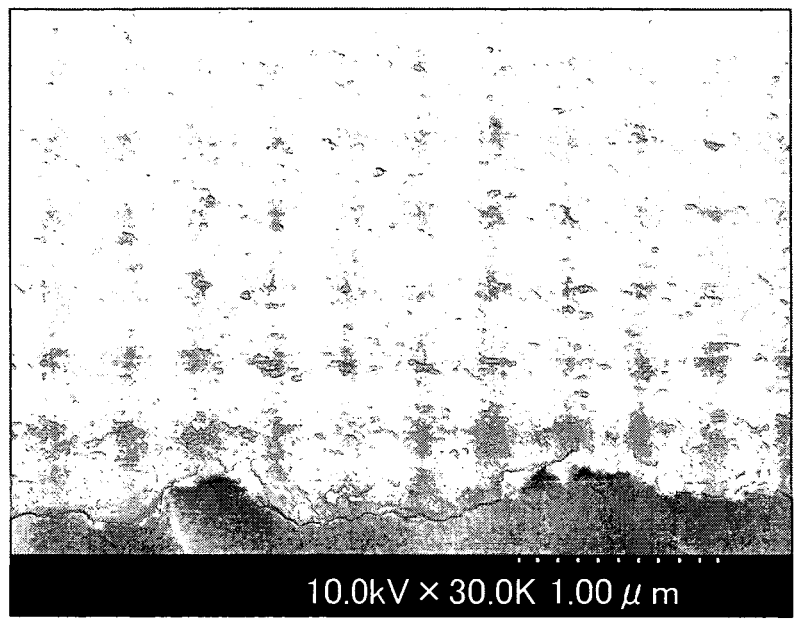
FIG. 30 is a diagram using a scanning electronic micrograph (magnification of 30000) illustrating a surface of a silver ink film using a protective colloid made from octadecadienoic acid, hexanoic acid, and octylamine, the silver ink film being obtained by way of annealing carried out for 1 hour at a temperature of 300° C. under $N_2$ gas atmosphere.

FIG. 30 is a diagram using a scanning electronic micrograph (magnification of 30000) illustrating a surface of a metal film obtained by annealing, for 1 hour at a temperature of 300° C. under $N_2$ gas atmosphere, a silver ink film using protective colloids described in Example 11. Each of the protective colloids is made from octadecadienoic acid, hexanoic acid, and octylamine.

Figure 31:
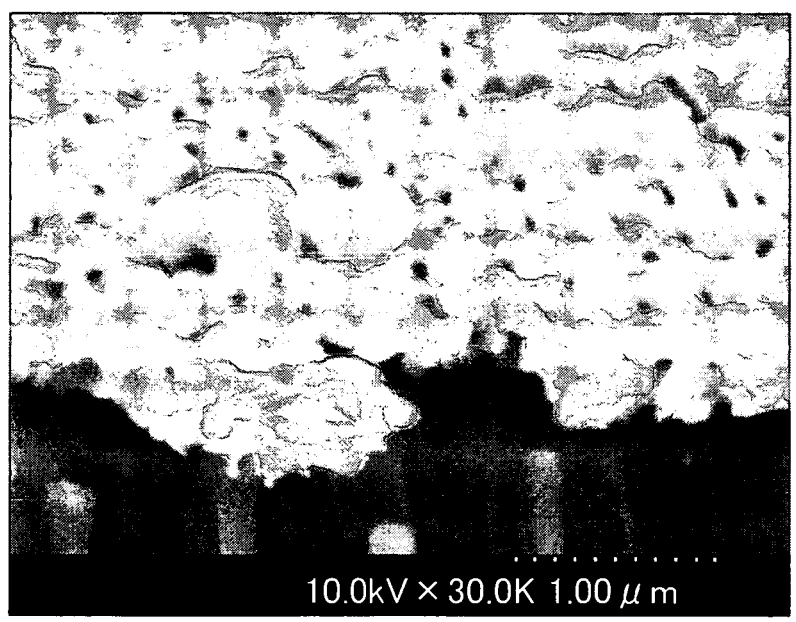
FIG. 31 is a diagram using a scanning electronic micrograph (magnification of 30000) illustrating a surface of a silver ink film using a protective colloid made of pentadecanonic acid and octylamine, the silver ink film being obtained by way of annealing carried out for an hour at a temperature of 300° C. under $N_2$ gas atmosphere.

FIG. 31 is for the sake of comparison, and is a diagram using a scanning electronic micrograph (magnification of 30000) illustrating a surface of a metal film obtained by annealing, for 1 hour at a temperature of 300° C. under $N_2$ gas atmosphere, a silver ink film using protective colloids each made from pentadecanonic acid and octylamine.

See FIG. 31. The protective colloids used in the case where the metal fine particles are made of only silver are the protective colloids each made from pentadecanonic acid and octylamine. In this case, less silver grain growth occurs as compared with the silver ink film (see FIG. 33) using the protective colloids each made from naphthenic acid and octylamine; however, the irregularity and the grain growth are still observed in the film surface of the obtained metal film. Moreover, small pits are observed in the film surface and a cross sectional surface of the metal film. Further, the result shown in FIG. 31 clarifies that: even when using the protective colloids each made from pentadecanonic acid and octylamine, the silver grain growth is never noticeably restrained in the silver ink film (see FIG. 32) using the metal fine particles made of only silver. Further, in the vicinity of the cross sectional surface of the silver ink film shown in FIG. 31, the film is peeled off from the substrate (priming material), i.e., the application target. This indicates that the adhesiveness is weak.

On the contrary, as shown in FIG. 30, the use of the specific protective colloids allows notable restraint of the grain growth in the surface of the film, as compared with the surface of the metal film shown in FIG. 31 to FIG. 33. Moreover, no small holes are observed in the surface of the metal film and a cross sectional surface thereof. This indicates that the metal film shown in FIG. 30 has a very good surface. Further, no film is peeled off in the vicinity of the cross sectional surface. This indicates that the adhesiveness to the substrate is improved.

As such, the use of the specific protective colloids allows restraint of the metal grain growth even in the case where each metal fine particle is only made of a noble metal. Accordingly, the present embodiment makes it possible to provide (i) a circuit substrate including a low electric resistance wire, an electrode, and a reflective member, each of which is excellent in terms of the surface smoothness, the adhesiveness to the application target, and the reflective property (reflective efficiency); (ii) an electronic apparatus using the circuit substrate. A specific example of the circuit substrate is an active matrix substrate (TFT array substrate) or the like, and a specific example of the electronic apparatus is a (liquid crystal) display apparatus or the like.

Further, the conductive ink composition according to the present embodiment, the wire, and the wire forming method are applicable to a bus electrode and a data electrode each provided on a glass substrate constituting a PDP (plasma display panel). The electrodes are provided in a front glass substrate or a rear glass substrate so as to drive the PDP. Conventionally, each of the electrodes is a silver electrode, a chrome-copper-chrome electrode, or an aluminum-chrome electrode, and is required to be arranged such that each chrome layer is sandwiched between the glass substrates. This is required in respect of (i) improvement in adhesiveness of copper or aluminum with respect to the substrate, and (ii) difference in expansion coefficient, otherwise the electrode cannot be used. Meanwhile, silver is conventionally known as a flowable wire material, but has a problem in heat resistance, so that high temperature baking causes the crystal grain growth. For this reason, it is difficult for silver to be used as the material for the electrode.

On the contrary, the conductive ink composition according to the present embodiment has the excellent heat resistance and the excellent adhesiveness to the glass substrate. For this reason, the conductive ink composition can be effectively used for the bus electrode and the data electrode, instead of the conventional material such as silver.

Further, the conductive ink composition according to the present embodiment, the wire, and the wire forming method are applicable to a display apparatus using an EL (electro luminescence). As is the case with the liquid crystal display apparatus, a circuit substrate having a circuit for driving the EL device usually utilizes a TFT array, so that the circuit substrate is possibly manufactured by performing the steps described in the present embodiment. For this reason, the present invention is applicable to such a display apparatus using the EL.

As described above, the conductive ink composition according to the present embodiment is suitably used for manufacture of various circuit substrates such as (i) a TFT array substrate for use in a liquid crystal display apparatus or the like, (ii) an electrode substrate for use in a PDP (plasma display panel), (iii) a print wire substrate, and (iv) a flexible wire substrate. Further, such a circuit substrate is suitably used for an electronic apparatus such as (i) a display apparatus such as a liquid crystal display apparatus, a PDP (plasma display panel), an organic EL (electro luminescence) panel, an inorganic EL panel; and (ii) an image input apparatus such as a two-dimensional image input apparatus. Examples of the two-dimensional image input apparatus include a fingerprint sensor, an X-ray image capturing apparatus, and the like.

The present invention is not limited to the embodiments above, but may be altered within the scope of the claims. An embodiment based on a proper combination of technical means disclosed in different embodiments is encompassed in the technical scope of the present invention.

The following explains further details of the present invention with reference to Examples; however, the present invention is not limited to these.

EXAMPLE 1

(Hexanoic Acid+Docosanoic Acid+Octylamine)

A sodium borohydride-2-propanol solution was prepared by adding 15 mmol of sodium borohydride to 2-propanol; (550 ml) and stirring the mixture for 3 hours at 80° C.

Meanwhile, a metallic salt solution was prepared by adding and dissolving, to 2,2,4-trimethylpentane (1.05 L), (A) octylamine (150 mmol) as the amine, (B) hexanoic acid (68 mmol) and docosanoic acid (8 mmol) as carboxylic acids, and indium acetate (0.3 mmol) and silver acetate (15 mmol) which are metal compounds.

Thereafter, to the metallic salt solution, the sodium borchydride-2-propanol solution was dropped at a rate of 10 ml/min. After the dropping, the mixture was stirred for 60 minutes and then concentrated by an evaporator. As a result of this, a brown solution was obtained. Then methanol (1 L) was added to the brown solution, so that a conductive ink composition was generated as a brown precipitation. This precipitation was collected by suction filtration.

The conductive ink composition thus obtained was dispersed in tetradecane so that an weight (mass) of the metal was 35% by mass. As a result, a silver-indium conductive ink was obtained. Using a ultraviolet visible spectrophotometer and a transmission electron microscope, nanoparticles in the conductive ink were observed. The conductive ink thus obtained was applied to a non-alkali glass substrate by spin coating, and baked (i.e. subjected to heat annealing) in a muffle furnace for 30 minutes and at 300° C. The thickness of the film obtained as a result of the baking was 273 nm, and its volume resistivity was 8.4 µΩ·cm. The adhesiveness between the film and the substrate was evaluated by a tape peel test. The tape peel test is performed as follows: after the heat annealing, an adhesive tape is attached to a film surface with a predetermined cut. The adhesive tape is then detached in such a manner as to peeling off the film surface. A case where at least a part of the film surface is peeled off is judged as unsatisfactory. Meanwhile, a case where no part of the film surface is peeled off is judged as good. The adhesiveness between the film and the substrate in the present example was good, i.e. passed the tape peel test. Also, according to the measurement of the composition by a fluorescence X-ray spectroscopic instrument, the rate of indium in the film was 0.78 atomic %. According to the observation of the film by a stylus profile measuring system and a scanning electron microscope, a center line average roughness Ra was 3.2 nm, indicating that the film was flat and smooth. Also, the shape of the film surface did not change after being exposed to an $N_2$ gas atmosphere for 60 minutes at 300° C., i.e. the film exhibited excellent heat resistance.

EXAMPLE 2

(Hexanoic Acid+Naphthenic Acid+Octylamine)

A silver-indium conductive ink was manufactured in the same conditions as in Example 1, except that docosanoic acid (8 mmol) as the carboxylic acids in (B) was replaced with naphthenic acid (2.025 g roughly equivalent to 8 mmol) whose average molecular mass was about 270, so that a film was formed on a non-alkali glass substrate. The film obtained as a result of the baking was 355 nm thick, and its volume resistivity was 9.8 μΩ·cm. The adhesiveness between the film and the substrate was good, i.e. passed the tape peel test. The rate of indium in the film was 1.0 atomic %. The center line average roughness Ra was 3.2 nm, indicating that the film was flat and smooth. Also, the shape of the film surface did not change after being exposed to an $N_2$ gas atmosphere for 60 minutes at 300° C., i.e. the film exhibited excellent heat resistance. According to the measurement of the naphthenic acid by a GC (gas chromatography)/MS(mass spectrometry), the naphthenic acid was a mixture of those having carbon numbers of from 10 to 30, and components having the carbon number of 17 was of the greatest number. Note that the substance amount of the naphthenic acid was calculated from the average molecular weight.

EXAMPLE 3

(Hexanoic Acid+Octylamine)

A silver-indium conductive ink was manufactured in the same conditions as in Example 1, except that docosanoic acid was not added and an amount of the hexanoic acid was increased to 76 mmol (i.e. only the hexanoic acid was adopted as the carboxylic acids in (B)), so that a film was formed on a non-alkali glass substrate. The film obtained as a result of the baking was 508.1 nm thick, and its volume resistivity was 12.5 μΩ·cm. The rate of indium in the film was 0.1 atomic %, and the center line average roughness Ra was 38.2 nm. The adhesiveness between the film and the substrate and the smoothness and flatness of the surface were inferior to those of Examples 1 and 2, but the surface roughness of the film and the adhesiveness between the film and the substrate were still better than those of a conventional silver ink that uses silver as a simple substance.

EXAMPLE 4

(Hexanoic Acid+Octadecanoic Acid+Octylamine)

A silver-indium conductive ink was manufactured in the same conditions as in Example 1, except that the docosanoic acid was replaced with octadecanoic acid as the carboxylic acids in (B), so that a film was formed on a non-alkali glass substrate. The rate of indium in the film thus formed was 0.1 atomic %. The adhesiveness between the film and the substrate and the smoothness and flatness of the surface were inferior to those of Examples 1 and 2, but the surface roughness of the film and the adhesiveness between the film and the substrate were still better than those of a conventional silver ink that uses silver as a simple substance.

EXAMPLE 5

(Docosanoic acid+Octylamine)

A silver-indium conductive ink was manufactured in the same conditions as in Example 1, except that hexanoic acid was not added and an amount of the docosanoic acid was increased to 76 mmol (i.e. only the docosanoic acid was adopted as the carboxylic acids in (B)), so that a film was formed on a non-alkali glass substrate. At room temperatures, the metals were not sufficiently dissolved in the solution. Meanwhile, when the film was manufactured with the temperature being kept at 60° C., aggregations were formed. These results show that the aforesaid conditions improve the adhesiveness between the film and the substrate as compared to the conventional condition, but the improvement of the adhesiveness in the present example is inferior to that in Example 1.

EXAMPLE 6

(Naphthenic Acid+Octylamine)

A silver-indium conductive ink was manufactured in the same conditions as in Example 2, except that hexanoic acid was not added and an amount of the naphthenic acid whose average molecular mass was about 270 was increased to 20.25 (roughly equivalent to 75 mmol), so that a film was formed on a non-alkali glass substrate. The film obtained as a result of the baking was 286 nm thick, and its volume resistivity was 11.8 μΩ·cm. The adhesiveness between the film and the substrate was good, i.e. passed the tape peel test. The rate of indium in the film was 0.8 atomic %. The center line average roughness Ra was 3.7 nm, indicating that the film was flat and smooth. However, when exposed to an $N_2$ gas atmosphere for 60 minutes at 300° C., particles with the diameters of several hundred nm were sparsely generated on the surface of the film. The heat resistance in the present example is inferior to those in Embodiments 1 and 2, but the surface roughness of the film was improved as compared to a typical silver ink that uses silver as a simple substance.

EXAMPLE 7

(Hexanoic Acid+Tetradecanoic Acid+Octylamine)

A silver-indium conductive ink was manufactured in the same conditions as in Example 1, except that an amount of the indium acetate was increased from 0.3 mmol to 0.4 mmol and the docosanoic acid (8.0 mmol) adopted as the carboxylic acids in (B) was replaced with tetradecanoic acid (8.0 mmol), so that a film was formed on a non-alkali glass substrate. The film obtained as a result of the baking was 422 nm thick, and its volume resistivity was 10.2 μΩ·cm. The adhesiveness between the film and the substrate was good, i.e. passed the tape peel test. The rate of indium in the film was 0.3 atom %. The center line average roughness Ra was 2.7 nm, indicating that the film was flat and smooth.

EXAMPLE 8

(Hexanoic Acid+Pentadecanoic Acid+Octylamine)

A silver-indium conductive ink was manufactured in the same conditions as in Example 1, except that an amount of the indium acetate was increased from 0.3 mmol to 0.4 mmol and the docosanoic acid (8.0 mmol) adopted as the carboxylic acids in (B) was replaced with pentadecanoic acid (8.0 mmol), so that a film was formed on a non-alkali glass substrate. The film obtained as a result of the baking was 384 nm thick, and its volume resistivity was 10.4 μΩ·cm. The adhesiveness between the film and the substrate was good, i.e. passed the tape peel test. The rate of indium in the film was 0.4 atom %. The center line average roughness Ra was 1.6 nm, indicating that the film was flat and smooth.

EXAMPLE 9

(Hexanoic Acid+Hexadecanoic Acid+Octylamine)

A silver-indium conductive ink was manufactured in the same conditions as in Example 1, except that an amount of the indium acetate was increased from 0.3 mmol to 0.4 mmol and the docosanoic acid (8.0 mmol) adopted as the carboxylic acids in (B) was replaced with hexadecanoic acid (8.0 mmol), so that a film was formed on a non-alkali glass substrate. The film obtained as a result of the baking was 450 nm thick, and its volume resistivity was 10.4 μΩ·cm. The adhesiveness between the film and the substrate was good, i.e. passed the tape peel test. The rate of indium in the film was 0.3 atom %. The center line average roughness Ra was 6.5 nm, indicating that the film was flat and smooth.

EXAMPLE 10

(Hexanoic Acid+Octadecenoic Acid+Octylamine)

A silver-indium conductive ink was manufactured in the same conditions as in Example 1, except that an amount of the indium acetate was increased from 0.3 mmol to 0.4 mmol and the docosanoic acid (8.0 mmol) adopted as the carboxylic acids in (B) was replaced with octadecenoic acid (8.0 mmol), so that a film was formed on a non-alkali glass substrate. The film obtained as a result of the baking was 450 nm thick, and its volume resistivity was 10.4 μΩ·cm. The adhesiveness between the film and the substrate was good, i.e. passed the tape peel test. The rate of indium in the film was 0.3 atom %. The center line average roughness Ra was 6.5 nm, indicating that the film was flat and smooth.

EXAMPLE 11

(Hexanoic Acid+Octadecadienoic Acid+Octylamine)

A silver-indium conductive ink was manufactured in the same conditions as in Example 1, except that an amount of the indium acetate was increased from 0.3 mmol to 0.4 mmol and the docosanoic acid (8.0 mmol) adopted as the carboxylic acids in (B) was replaced with octadecadienoic acid (8.0 mmol), so that a film was formed on a non-alkali glass substrate. The film obtained as a result of the baking was 329 nm thick, and its volume resistivity was 5.35 μΩ·cm. The adhesiveness between the film and the substrate was good, i.e. passed the tape peel test. The rate of indium in the film was 0.2 atom %. The center line average roughness Ra was 3.9 nm, indicating that the film was flat and smooth.

EXAMPLE 12

Table 1 illustrates the results of checking the presence of grain growth at a baking temperature of 300° C. and with a baking time of 30 to 90 minutes, with the type of protective colloid being variously changed. "Δ" corresponds to a case where the grain growth exceeded 50 nm but the surface roughness was improved as compared to a case of using only silver. Meanwhile, "o" corresponds to a case where the grain growth is restrained to be not more than 50 nm.

TABLE 1

| Protective Colloid | Presence of Grain Growth | Evaluation |
|---|---|---|
| Hexanoic Acid, Naphthenic Acid, Octylamine | No | o |
| Hexanoic Acid, Octylamine | Yes | Δ |
| Naphthenic Acid, Octylamine | Yes | Δ |
| Naphthenic Acid, Dodecylamine | Yes | Δ |
| Dodecanoic Acid, Dodecylamine | Yes | Δ |
| Dodecanoic Acid, Octylamine | Yes | Δ |
| Octanoic Acid, Octylamine | Yes | Δ |

As described above, according to the present invention, the conductive ink composition contains the solid material obtained by coating, with the protective colloid consisting of at least two organic compounds, the surface of the metal fine particles made of a plurality of the metals at least one of which is a noble metal. This allows formation of the film (metal film) allowing (i) the restraint of the grain growth of the metal, (ii) the good surface smoothness, and (iii) the better adhesiveness to the application target as compared with a case where the metal particles are made of only silver. Moreover, the effect of restraining the grain growth is dramatically improved by the use of the protective colloid including both the low-molecular weight carboxylic acid and the high-molecular weight carboxylic acid, in addition to the amine.

EXAMPLE 13

A silver-indium conductive ink was manufactured in the same conditions as in Example 1, except that an amount of the indium acetate was increased from 0.3 mmol to 0.4 mmol and the docosanoic acid (8.0 mmol) adopted as the carboxylic acids in (B) was replaced with octadecadienoic acid (8.0 mmol), so that a film was formed on a non-alkali glass substrate. The film obtained as a result of the heating was 300 nm thick, and its volume resistivity was 4.38 μΩ·cm. The adhesiveness between the film and the substrate was good, i.e. passed the tape peel test. Indium was detected in the film, but the rate thereof was less than 0.1 atom %. The center line average roughness Ra was 2.1 nm, indicating that the film was flat and smooth.

Figure 29:
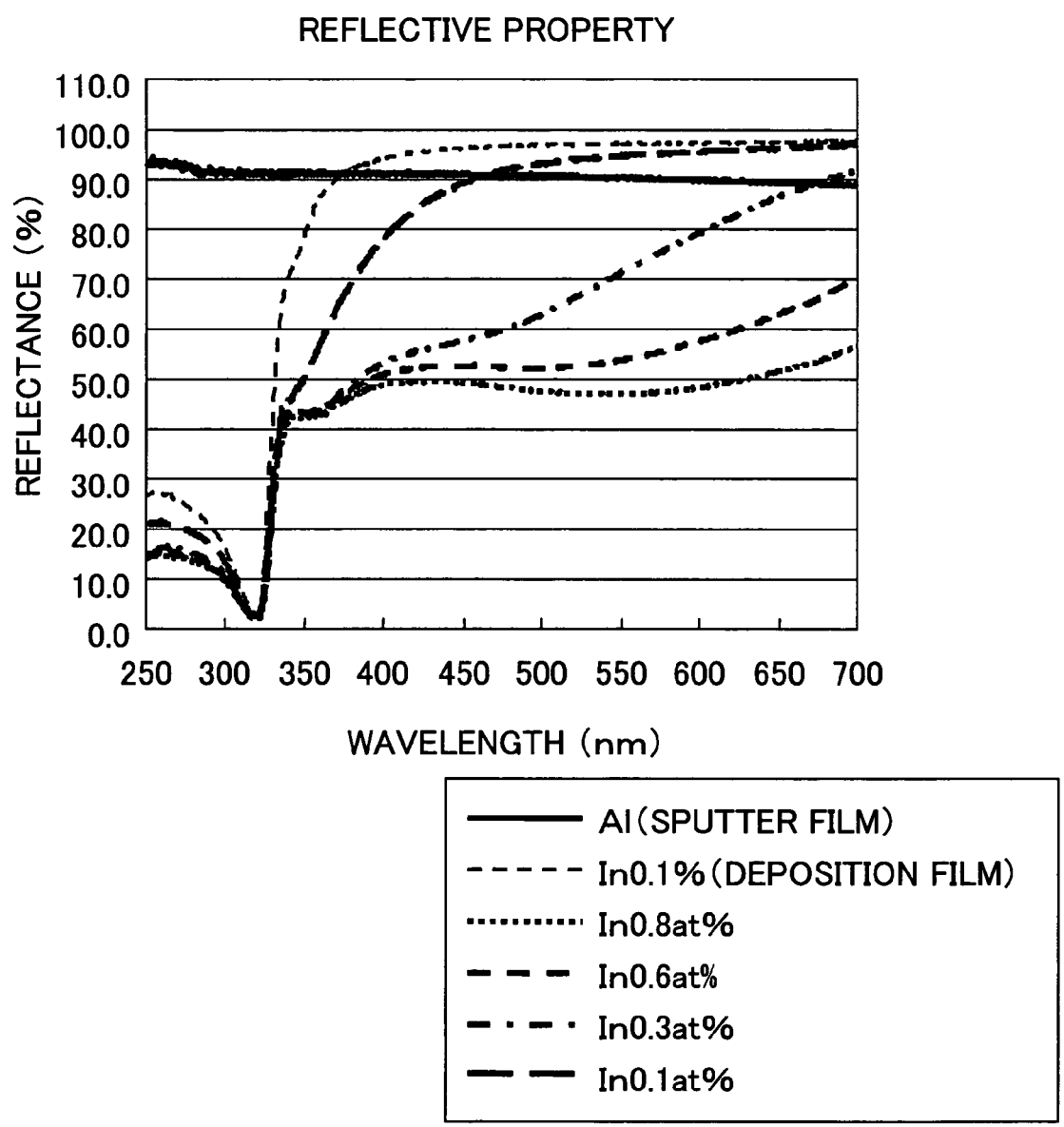
FIG. 29 is a graph illustrating respective reflective properties of metal films (see Example 13) containing different rates of indium, by way of respective reflective indexes thereof with respect to wavelength.

The reflective property of this film was measured, and the result is shown in FIG. 29. "In0.1 at %" is a film (subjected to the heating) to which the aforesaid silver-indium conductive ink, in which the hexanoic acid and octadecadienoic acid were used as the carboxylic acids, was applied. Although the reflective property was low around a 400 nm region, the reflective property of this film in the visible region was good on the whole.

In similar manners, the reflective properties of "In0.3 at %", "In0.6 at %", "In0.8 at %", "Al (sputtered film)", and "In0.1% (vapor-deposited film)" were measured. The results of the measurements are shown in FIG. 29. "In0.3 at %", "In0.6 at %", and "In0.8 at %" show the reflective properties of the bake films to which the aforesaid silver-indium conductive ink, in which the hexanoic acid and naphthenic acid were used as the carboxylic acids, was applied as shown in Example 2, and in which the rates of indium therein were 0.3 atomic %, 0.6 atomic %, and 0.8 atomic %, respectively. "Al (sputtered film)" is an aluminum film formed by sputtering. "In0.1% (vapor-deposited film)" is a vapor-deposited film which does not include protective colloid and is made by vapor-depositing silver-indium alloy, and the rate of indium (i.e. indium concentration) in the film is 0.1 atomic %. Table 2 shows the rates of indium in these films (metal films) shown in FIG. 29, and the types of protective colloid used for the conductive inks (conductive ink compositions) applied for forming the metal films. By the way, the measurements of the reflective properties were carried out using UV-Visible-NIR Spectrophotometer U-4100 (made by Hitachi High-Technologies Corporation).

TABLE 2

|  | Protective Colloid | Indium Concentration |
|---|---|---|
| In 0.1 at % | Octadecadienoic Acid<br>Hexanoic Acid<br>Octylamine | 0.1 atomic % |
| In 0.3 at % | Naphthenic Acid<br>Hexanoic Acid<br>Octylamine | 0.3 atomic % |
| In 0.6 at % | Naphthenic Acid<br>Hexanoic Acid<br>Octylamine | 0.6 atomic % |
| In 0.8 at % | Naphthenic Acid<br>Hexanoic Acid<br>Octylamine | 0.8 atomic % |
| In 0.1%<br>(vapor-deposited film) | — | 0.1 atomic % |
| Al (sputtered film) | — | — |

The results shown in FIG. 29 indicate that the reflective properties are greatly influenced by an amount of contained indium. Also, since the reflective property decreases as the rate of indium in the film increases, it turned out that an amount of indium in the film should be decreased as much as possible, in order to achieve a good reflective property.

In the meanwhile, the adhesiveness to the substrate tends to weaken as the rate of indium in the film decreases, as Examples 3 and 4 show. As a result of examinations with various concentrations of indium, it turned out that a film in which octadecadienoic acid, hexanoic acid, and octylamine are used as protective colloid excels in the adhesiveness even if an amount of contained indium (i.e. concentration of indium) is extremely low. In a case of "In0.1 at %" in FIG. 29, the adhesiveness was good even if the rate of indium in the film was less than 0.1 atomic %.

Also, as the "In0.1 at %" shows, the grain growth of silver was restrained in the film in which octadecadienoic acid, hexanoic acid, and octylamine are used as protective colloid, because of the actions of the indium and protective colloid. On this account, the film can be suitably used for a reflective plate on ground that the grain growth peculiar to silver was not observed even after the heat treatment at 300° C. The reflective property of the "In0.1 at %" film was such that the reflectance was 80% at the wavelength of 400 nm, so as not to be as good as that of the "Al (spattered film)". However, when the wavelength was longer than 450 nm, the reflectance of the "In0.1 at %" film was better than that of the Al film made by sputtering, and the reflective property of the "In0.1 at %" film was nearly as good as that of the "In0.1% (vapor-deposited film)".

Incidentally, it is assumed that the reflectance of the "In0.1 at %" film was lower than that of the "In0.1% (vapor-deposited film)" in the region of shorter wavelengths, because of an organic component remaining in the ink film. For this reason, not only the concentration of indium but also the contained organic component apparently relate to the decrease of the reflectance in reverse proportion to the concentration of indium.

EXAMPLE 14

(Silver-Indium Conductive Ink Composition)

A silver-indium conductive ink (silver-indium conductive ink composition) was manufactured in the same conditions as in Example 1, except that the indium acetate was not used, the docosanoic acid (8.0 mmol) adopted as the carboxylic acids in (B) was replaced with Octadecadienoic acid (8.0 mmol), and simple silver was used as the metal particles, so that a film was formed on a non-alkali glass substrate. The film as a result of the heating was 298 nm thick, and the volume resistivity was 3.11 μΩ·cm. The adhesiveness between the film and the substrate in the present example was good, i.e. passed the tape peel test. The center line average roughness Ra was 16.3 nm, indicating that the film was flat and smooth. In the present example, even if only silver was used as the metal, the surface roughness of the obtained film was improved as compared to conventional silver ink using simple silver, for the reason that the octadecadienoic acid, hexanoic acid, and octylamine were used as the protective colloid.

The carbon numbers or average carbon numbers of the carboxylic acids in (B) used in the aforementioned examples are shown together in Table 3.

TABLE 3

|  | Carbon number or average carbon number of carboxylic acids in (B) | (B) Carboxylic Acids |
|---|---|---|
| Example 1 | 7.68 | Hexanoic Acid, Docosanoic acid |
| Example 2 | 7.16 | Hexanoic Acid, Naphthenic Acid |
| Example 3 | 6.00 | Hexanoic Acid |
| Example 4 | 7.26 | Hexanoic Acid, Octadecanoic Acid |
| Example 5 | 22.00 | Docosanoic acid |
| Example 6 | 17.00 | Naphthenic Acid |
| Example 7 | 6.84 | Hexanoic Acid, Tetradecanoic Acid |
| Example 8 | 6.95 | Hexanoic Acid, Pentadecanoic Acid |
| Example 9 | 7.05 | Hexanoic Acid, Hexadecanoic Acid |
| Example 10 | 7.26 | Hexanoic Acid, Octadecenoic acid |
| Example 11 | 7.26 | Hexanoic Acid, Octadecadienoic acid |
| Example 12 | 7.16 | Hexanoic Acid, Naphthenic Acid |
|  | 6.00 | Hexanoic Acid |
|  | 17.00 | Naphthenic Acid |
|  | 12.00 | Dodecanoic Acid |
|  | 8.00 | Octanoic Acid |
| Example 13 | 7.26 | Hexanoic Acid, Octadecadienoic acid |
| Example 14 | 7.26 | Hexanoic Acid, Octadecadienoic acid |

As described above, the conductive ink composition according to the present invention includes the solid material made from the metal fine particles each coated with the protective colloids each made of at least two organic compounds, each of the metal fine particles consisting of a plurality of metals, at least one of which is a noble metal. A specific example of such metal fine particles is metal fine particles each made of an alloy containing at least a noble metal. The use of such a conductive ink composition allows restraint of the metal grain growth as compared with the use of the conventional conductive ink, such as the silver ink, using the metal fine particles each made of only one noble metal; and accordingly allows formation of the film (metal film) having excellent surface smoothness, better adhesiveness to the application target, and better reflective efficiency as compared with the film made from the conventional conductive ink. The conductive ink composition may be the solid material made from (i) the metal fine particles made of a plurality of metals, at least one of which is a noble metal, and (ii) protective colloids which surrounds the metal fine particles, and each of which is made from at least two organic compounds. The solid material can be dispersed in the organic solvent because the metal fine particles are surrounded (coated) by the protective colloids. Therefore, the solid material can be dispersed therein when used. Further, the conductive ink composition may be a liquid material containing the organic solvent. In other words, the conductive ink composition may be a liquid material containing (i) the metal fine particles, (ii) the protective colloids, which surrounds the metal fine particles, and each of which is made from at least two organic compounds, and (iii) the organic solvent.

That is, as described above, the conductive ink composition according to the present invention may include a solid material made from metal fine particles each coated with protective colloids each made of at least two organic compounds, said metal fine particles consisting of an alloy containing at least a noble metal.

Further, as described above, a conductive ink composition according to the present invention may be a solid material made from (i) metal fine particles consisting of a plurality of metals, at least one of which is a noble metal, and (ii) protective colloids, each of which includes at least two organic compounds and which surround the metal fine particles, said conductive ink composition being able to be dispersed in an organic solvent.

Further, each of the conductive ink compositions is preferably arranged such that the metal fine particles are included in the solid material at a rate of 60% by mass to 95% by mass, and the protective colloids are contained in the solid material at a rate of 5% by mass to 40% by mass, a total of the rates being 100% by mass.

Further, as described above, a conductive ink composition according to the present invention may be a liquid material including (i) metal fine particles consisting of a plurality of metals, at least one of which is a noble metal, (ii) protective colloids, each of which includes at least two organic compounds and which surround the metal fine particles, and (iii) an organic solvent.

The conductive ink composition is preferably arranged such that (i) the metal fine particles are contained at a rate of 15% by mass to 95% by mass, (ii) the protective colloids are contained at a rate of 1% by mass to 60% by mass, and (iii) the organic solvent is contained at a rate of 1% by mass to 60 by mass, a total of the rates being 100% by mass.

With the arrangements, the conductive ink composition contains the solid material made from the metal fine particles coated with the protective colloids each made from at least two organic compounds, the metal fine particles consisting of a plurality of metals, at least one of which is a noble metal. A specific example of such metal fine particles is metal fine particles each made of an alloy containing at least a noble metal. The use of such a conductive ink composition allows restraint of the metal fine grain growth as compared with the use of the conventional silver conductive ink using the metal fine particles consisting of only silver; and accordingly allows formation of a metal layer (metal film) having excellent surface smoothness, better adhesiveness to the application target, and better reflective efficiency as compared with those of the conventional film.

Further, it is preferable that each of the metal fine particles contains the noble metal and a metal having a standard oxidation-reduction potential of −0.45 V/NHE to +1.5 V/NHE.

Further, it is preferable that each of the metal fine particles contains the noble metal and at least one metal selected from a group consisting of iron, cobalt, nickel, copper, cadmium, indium, tin, thallium, lead, molybdenum, and bismuth.

Further, it is preferable that the metal fine particles essentially consist of silver and indium.

With the arrangement, the use of the conductive ink composition as a wire material and/or an electrode material in the circuit substrate allows restraint of the metal grain growth, and accordingly allows improvement of the adhesiveness to the insulating substrate (priming material) such as a glass substrate, as compared with the use of the metal fine particles consisting of only silver. Therefore, the arrangements allow formation of a metal layer having low electric resistance, particularly, allow formation of a wire having low electric resistance and/or an electrode having low electric resistance. Further, the metal grain growth restraint by the conductive ink composition allows better reflective efficiency in the reflective member made from the conductive ink composition, as compared with the reflective efficiency of the conventional reflective member. Therefore, the arrangements make it possible to provide the conductive ink composition allowing formation of a reflective member whose surface smoothness, adhesiveness to the application target, and reflective efficiency are improved as compared with those of the conventional reflective member. The metal layer is suitably used particularly for a reflective electrode or the like.

Further, it is preferable that each of the protective colloids be a compound and/or a mixture, each of which is made from a raw material containing an (A) amine and a (B) carboxylic acid. It is more preferable that the (B) carboxylic acid is a mixture of (I) at least one carboxylic acid selected from carboxylic acids having 4 carbon atoms to 9 carbon atoms, and (II) at least one carboxylic acid selected from carboxylic acids having 10 carbon atoms to 30 carbon atoms, and an average number of carbon atoms contained in the (B) carboxylic acid ranges from 5 to 25.

Further, it is preferable that the (A) amine be an alkylamine having 5 carbon atoms to 20 carbon atoms.

More specifically, for example, it is preferable that each of the protective colloids be made from octadecadienoic acid, hexanoic acid, and octylamine. Moreover, it is preferable that each of the protective colloids be made from naphthenic acid, hexanoic acid, and octylamine.

Further, it is preferable that each of the protective colloids be a compound and/or a mixture, each of which is made from a raw material containing: alkylamine; at least one carboxylic acid (I) selected from carboxylic acid having 4 carbon atoms to 9 carbon atoms; and at least one carboxylic acid (II) selected from carboxylic acids having 10 carbon atoms to 30 carbon atoms, a rate of the alkylamine being not less than 40 mol % but not more than 79 mol %, a rate of the carboxylic acid (I) being not less than 2 mol % but not more than 40 mol %, a rate of the carboxylic acid (II) being no less than 1 mol % but not more than 20 mol %, the total of the rates being 100 mol %.

The protective colloids allow very effective restraint of the grain growth, so that the protective colloids allow notable restraint of the metal grain growth occurring in portions of the film made from the conductive ink composition according to the present invention, which portions contain a larger amount of the noble metal than that of the surroundings. Therefore, the arrangements make it possible to manufacture a metal layer (metal film) having (i) extremely excellent surface smoothness, (ii) very good adhesiveness to an insulating substrate (priming material) such as a glass substrate, and (iii) very good reflective efficiency.

Further, as described above, the conductive ink composition according to the present invention includes the solid material made from the metal fine particles, which consist of a noble metal, and each of which is coated with the protective colloids made from the (A) amine and the (B) amine which is a mixture of (I) at least one carboxylic acid selected from carboxylic acids having 4 carbon atoms to 9 carbon atoms, and (II) at least one carboxylic acid selected from carboxylic acids having 10 carbon atoms to 30 carbon atoms, the average number of the carbon atoms contained in the (B) carboxylic acid ranging from 5 to 25. Even though the metal fine particles are each made of only the noble metal, the use of such a conductive ink composition allows restraint of the metal grain growth as compared with the conventional conductive ink, and accordingly allows formation of a metal layer (metal film) having excellent surface smoothness, better adhesiveness to the application target, and better reflective efficiency as compared with the conventional conductive ink does. Further, the conductive ink composition may be a solid material including the metal fine particles each surrounded (coated) by the protective colloids, each of the metal fine particles consisting of a noble metal, the conductive ink composition being able to be dispersed in the organic solvent. Alternatively, the conductive ink composition may be a liquid material including the organic solvent.

That is, as described above, a conductive ink composition according to the present invention may include a solid material made from metal fine particles consisting of a noble metal, each of the metal fine particles being coated with protective colloids, each of the protective colloids being made from an (A) amine and a (B) carboxylic acid, the (B) carboxylic acid being a mixture of (I) at least one carboxylic acid selected from carboxylic acids having 4 carbon atoms to 9 carbon atoms, and (II) at least one carboxylic acid selected from carboxylic acids having 10 carbon atoms to 30 carbon atoms, and an average number of carbon atoms contained in the (B) carboxylic acid ranges from 5 to 25.

Further, a conductive ink composition according to the present invention may be a solid material made from metal fine particles consisting of a noble metal, each of the metal fine particles being coated with protective colloids each including an (A) amine and a (B) carboxylic acid, the conductive ink composition being able to be dispersed in an organic solvent, the (B) carboxylic acid being a mixture of (I) at least one carboxylic acid selected from carboxylic acids having 4 carbon atoms to 9 carbon atoms, and (II) at least one carboxylic acid selected from carboxylic acids having 10 carbon atoms to 30 carbon atoms, and an average number of carbon atoms contained in the (B) carboxylic acid ranges from 5 to 25.

Each of the conductive ink compositions is preferably arranged such that the metal fine particles be contained in the solid material at a rate of 60% by mass to 95% by mass, and that the protective colloids be contained in the solid material at a rate of 5% by mass to 40% by mass, a total of the rates being 100% by mass.

Further, as described above, a conductive ink composition according to the present invention may be a liquid material including (i) metal fine particles consisting of a noble metal, (ii) protective colloids surrounding the metal fine particles, and (iii) an organic solvent, each of the protective colloids including an (A) amine and a (B) carboxylic acid, the (B) carboxylic acid being a mixture of (I) at least one carboxylic acid selected from carboxylic acids having 4 carbon atoms to 9 carbon atoms, and (II) at least one carboxylic acid selected from carboxylic acids having 10 carbon atoms to 30 carbon atoms, and an average number of carbon atoms contained in the (B) carboxylic acid ranges from 5 to 25.

In the case where the conductive ink composition is the liquid material containing the metal fine particles, the protective colloids, and the organic solvent as such, it is preferable that (i) the metal fine particles be contained at a rate of 15% by mass to 95% by mass, (ii) the protective colloids be contained at a rate of 1% by mass to 60% by mass, and (iii) the organic solvent be contained at a rate of 1% by mass to 60 by mass, a total of the rates being 100% by mass.

Further, also in the conductive ink composition using the metal fine particles consisting of only the noble metal, it is preferable that the (A) amine be an alkylamine having 5 carbon atoms to 20 carbon atoms.

Further, it is preferable that each of the protective colloids be made from octadecadienoic acid, hexanoic acid, and octylamine. Moreover, it is preferable that each of the protective colloids be made from, e.g., naphthenic acid, hexanoic acid, and octylamine.

Further, it is preferable that each of the protective colloids be a compound and/or a mixture, each of which is made from a raw material containing: alkylamine; at least one carboxylic acid (I) selected from carboxylic acid having 4 carbon atoms to 9 carbon atoms; and at least one carboxylic acid (II) selected from carboxylic acids having 10 carbon atoms to 30 carbon atoms, a rate of the alkylamine being not less than 40 mol % but not more than 79 mol %, a rate of the carboxylic acid (I) being not less than 2 mol % but not more than 40 mol %, a rate of the carboxylic acid (II) being no less than 1 mol % but not more than 20 mol %, the total of the rates being 100 mol %.

The protective colloids allow very effective restraint of the grain growth. Therefore, even when the conductive ink composition according to the present invention uses the metal fine particles consisting of only the noble metal, the metal grain growth is restrained as compared with the conventional conductive ink obtained by dispersing, in the organic solvent, the metal fine particles made of the noble metal. This allows formation of a metal layer (metal film) having excellent surface smoothness, better adhesiveness to the application target as compared with the conventional conductive ink does. A specific example of the conventional conductive ink is the silver ink. Therefore, the arrangements above make it possible to provide a conductive ink composition allowing formation of a metal layer having low electric resistance, particularly, formation of a wire having low electric resistance and/or an electrode having low electric resistance. Further, the metal grain growth restraint by the conductive ink composition allows formation of a metal layer having excellent reflective efficiency. Therefore, the arrangements make it possible to provide the conductive ink composition allowing formation of a reflective member which is excellent in terms of surface smoothness, adhesiveness to the application target, and reflective efficiency. The metal layer is especially suitably used for a reflective electrode or the like.

Further, it is preferable that the organic solvent be a carbon hydride having 10 carbon atoms to 35 carbon atoms. Moreover, it is preferable that the organic solvent be an aliphatic carbon hydride that has a side chain, and that has 16 carbon atoms to 30 carbon atoms.

The organic solvent is available with ease, and has good dispersion stability of the metal fine particles coated with the protective colloids. Further, the organic solvent has a low boiling point, so that removal of the organic solvent is easy.

Further, as described above, a reflective member according to the present invention is obtained by drying or heating (e.g., baking) the conductive ink.

Further, as described above, a circuit substrate according to the present invention includes the metal layer obtained by carrying out a drying treatment or heating treatment (e.g., baking) with respect to the conductive ink.

It is preferable that the metal layer be at least one selected from a group consisting of a wire, an electrode, and a reflective member.

Further, as described above, the electronic apparatus according to the present invention includes the circuit substrate according to the present invention.

As described above, the reflective member, the circuit substrate, the electronic apparatus, each of which is according to the present invention, include the metal layer obtained by drying or heating (e.g., baking) the conductive ink composition according to the present invention. This allows restraint of the metal grain growth, and accordingly makes it possible to provide highly reliable circuit substrate and electronic apparatus each having the metal layer having excellent surface smoothness, and better adhesiveness to the application target as compared with the conventional technique. Further, the metal grain growth is restrained better in the metal layer than in the metal layer made from the conventional conductive ink, and the metal layer accordingly has excellent surface smoothness and excellent adhesiveness to the application target, so that the metal layer has lower resistance than the metal layer made from the conventional conductive ink. Moreover, the metal layer has excellent reflective efficiency.

As described above, the conductive ink composition of the present invention allows restraint of the metal grain growth, and accordingly allows formation of the film (metal film) having excellent surface smoothness, better adhesiveness to application target, and better reflective efficiency as compared with the conventional film. Therefore, the conductive ink composition of the present invention is suitably used for manufacture of various circuit substrates such as (i) a TFT array substrate for use in a liquid crystal display apparatus or the like, (ii) an electrode substrate for use in a PDP (plasma display panel), (iii) a print wire substrate, and (iv) a flexible wire substrate. Moreover, the conductive ink composition is particularly suitable for circuit substrate manufacture using the inkjet method. Further, such a circuit substrate is suitably used for an electronic apparatus such as (i) a display apparatus such as a liquid crystal display apparatus, a PDP, an organic EL panel, an inorganic EL panel; and (ii) an image input apparatus such as a two-dimensional image input apparatus. Examples of the two-dimensional image input apparatus include a fingerprint sensor, an X-ray image capturing apparatus, and the like.

The present invention is not limited to the embodiments above, but may be altered within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A conductive ink composition, comprising a solid material consisting of 60% to 95% by mass of metal fine particles and 5% to 40% by mass of protective colloids, wherein the metal fine particles are each coated with the protective colloids, wherein each of the protective colloids are made from a raw material containing (A) an alkylamine having 5 carbon atoms to 20 carbon atoms and (B) a carboxylic acid component which is a mixture of (I) at least one carboxylic acid selected from carboxylic acids having 4 carbon atoms to 9 carbon atoms, and (II) at least one carboxylic acid selected from carboxylic acids having 10 carbon atoms to 30 carbon atoms, wherein the average number of carbon atoms contained in said (B) carboxylic acid component ranges from 5 to 25, and wherein the metal fine particles consist of an alloy containing at least a noble metal.

2. The conductive ink composition as set forth in claim 1, wherein: each of the metal fine particles contains the noble metal and a metal having a standard oxidation-reduction potential of −0.45 V/NHE to +1.5 V/NHE.

3. The conductive ink composition as set forth in claim 1, wherein: each of the metal fine particles contains the noble metal and at least one metal selected from a group consisting of iron, cobalt, nickel, copper, cadmium, indium, tin, thallium, lead, molybdenum, and bismuth.

4. The conductive ink composition as set forth in 1, wherein: the metal fine particle alloys essentially consist of silver and indium.

5. A conductive ink composition, comprising a solid material made from metal fine particles each coated with protective colloids each made of at least two organic compounds, said metal fine particles consisting of an alloy containing at least a noble metal wherein: each of the protective colloids is made from octadecadienoic acid, hexanoic acid, and octylamine.

6. A conductive ink composition, comprising a solid material made from metal fine particles each coated with protective colloids each made of at least two organic compounds, said metal fine particles consisting of an alloy containing at least a noble metal wherein: each of the protective colloids is made from naphthenic acid, hexanoic acid, and octylamine.

7. The conductive ink composition as set forth in claim 1, wherein each of the protective colloids is a mixture which is made from a raw material containing: alkylamine; at least one carboxylic acid (I) selected from carboxylic acid having 4 carbon atoms to 9 carbon atoms; and at least one carboxylic acid (II) selected from carboxylic acids having 10 carbon atoms to 30 carbon atoms, the ratio of said alkylamine in the mixture being not less than 40 mol % but not more than 79 mol %, the ratio of said carboxylic acid (I) in the mixture being not less than 2 mol % but not more than 40 mol %, the ratio of said carboxylic acid (II) in the mixture being no less than 1 mol % but not more than 20 mol %, the total of the ratios of the alkylamines and carboxylic acids (I) and (II) in the mixture being 100 mol %.

* * * * *